United States Patent
Yoshida et al.

(10) Patent No.: US 11,402,282 B2
(45) Date of Patent: Aug. 2, 2022

(54) PIEZOELECTRIC SUBSTRATE, PIEZOELECTRIC TEXTILE, PIEZOELECTRIC FABRIC, PIEZOELECTRIC DEVICE, FORCE SENSOR, ACTUATOR, AND BIOLOGICAL INFORMATION ACQUISITION DEVICE

(71) Applicant: Mitsui Chemicals, Inc., Tokyo (JP)

(72) Inventors: Mitsunobu Yoshida, Nagoya (JP); Kazuhiro Tanimoto, Nagoya (JP); Katsuki Onishi, Nagoya (JP); Shigeo Nishikawa, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 1078 days.

(21) Appl. No.: 16/064,810

(22) PCT Filed: Dec. 22, 2016

(86) PCT No.: PCT/JP2016/088528
§ 371 (c)(1),
(2) Date: Jun. 21, 2018

(87) PCT Pub. No.: WO2017/111108
PCT Pub. Date: Jun. 29, 2017

(65) Prior Publication Data
US 2019/0003905 A1    Jan. 3, 2019

(30) Foreign Application Priority Data

Dec. 25, 2015  (JP) .................................. 2015-255062
May 27, 2016  (JP) ............................. JP2016-106171
Sep. 5, 2016   (JP) .................................. 2016-173004

(51) Int. Cl.
*H01L 41/08*    (2006.01)
*G01L 1/16*     (2006.01)
(Continued)

(52) U.S. Cl.
CPC .............. *G01L 1/16* (2013.01); *H01L 41/087* (2013.01); *H01L 41/09* (2013.01); *H01L 41/113* (2013.01); *H01L 41/193* (2013.01); *H02N 2/00* (2013.01)

(58) Field of Classification Search
CPC ..... H01L 41/087; H01L 41/09; H01L 41/113; H01L 41/193
See application file for complete search history.

(56) References Cited

U.S. PATENT DOCUMENTS

| 4,984,222 A | 1/1991 | Beauducel et al. |
| 5,907,213 A | 5/1999 | Oshima et al. |

(Continued)

FOREIGN PATENT DOCUMENTS

| CN | 105189106 A | 12/2015 |
| JP | S-51-132986 A | 11/1976 |

(Continued)

OTHER PUBLICATIONS

Notices of Request for Submission of Opinions issued by the Korean Patent Office in corresponding Korean Patent Application No. 10-2018-7015961 dated Aug. 26, 2019 (16 pages including partial English translation).

(Continued)

*Primary Examiner* — Derek J Rosenau
(74) *Attorney, Agent, or Firm* — Buchanan, Ingersoll & Rooney PC

(57) ABSTRACT

Provided is a piezoelectric substrate including: an elongate conductor; and an elongate first piezoelectric material helically wound in one direction around the conductor, in which the first piezoelectric material includes an optically active helical chiral polymer (A), the lengthwise direction of the first piezoelectric material and the principal orientation direction of the helical chiral polymer (A) included in the (Continued)

first piezoelectric material are substantially parallel to each other, and the first piezoelectric material has an orientation degree of F. in a range of from 0.5 to less than 1.0, determined from X-ray diffraction measurement by the following Formula (a):

$$\text{orientation degree F.} = (180° - \alpha)/180° \quad (a)$$

(in Formula (a), α represents a half width of a peak derived from orientation).

33 Claims, 27 Drawing Sheets

(51) Int. Cl.
*H01L 41/087* (2006.01)
*H01L 41/09* (2006.01)
*H01L 41/113* (2006.01)
*H01L 41/193* (2006.01)
*H02N 2/00* (2006.01)

(56) References Cited

U.S. PATENT DOCUMENTS

| | | | |
|---|---|---|---|
| 2012/0025674 A1* | 2/2012 | Yoshida | H01L 41/193 310/365 |
| 2014/0339724 A1 | 11/2014 | Yoshida et al. | |
| 2015/0280102 A1 | 10/2015 | Tajitsu et al. | |
| 2016/0099403 A1 | 4/2016 | Tanimoto et al. | |
| 2018/0108826 A1* | 4/2018 | Tajitsu | H01L 41/082 |

FOREIGN PATENT DOCUMENTS

| | | |
|---|---|---|
| JP | H-10-132669 A | 5/1998 |
| JP | 4934235 B2 | 5/2012 |
| KR | 10-2011-0137361 A | 12/2011 |
| KR | 10-2014-0009750 A | 1/2014 |
| KR | 10-2015-0062648 A | 6/2015 |
| KR | 10-2015-0134956 A | 12/2015 |
| WO | WO 2010/104196 A1 | 9/2010 |
| WO | WO 2014/058077 A1 | 4/2014 |
| WO | 2016/175321 A1 | 11/2016 |

OTHER PUBLICATIONS

Notice of Examination Report dated Jul. 9, 2020, by the Ministry of Economic Affairs (Taiwan), Intellectual Property Office (Patent) in corresponding Taiwanese Patent Application No. 105142656, and a Partial English translation of the Notice. (18 pages).

International Search Report (PCT/ISA/210) dated Mar. 21, 2017, by the Japan Patent Office as the International Searching Authority for International Application No. PCT/JP2016/088528.

Written Opinion (PCT/ISA/237) dated Mar. 21, 2017, by the Japan Patent Office as the International Searching Authority for International Application No. PCT/JP2016/088528.

F. Carpi (et al), Electroactive Polymer-Based Devices for e-Textiles in Biomedicine, IEEE Transactions on Information Technology in Biomedicine, vol. 9, No. 3, pp. 295-318, Sep. 2005.

Extended Search Report issued by the European Patent Office in corresponding European Patent Application No. 16878994.9-1212 dated Jun. 13, 2019 (7 pages).

* cited by examiner

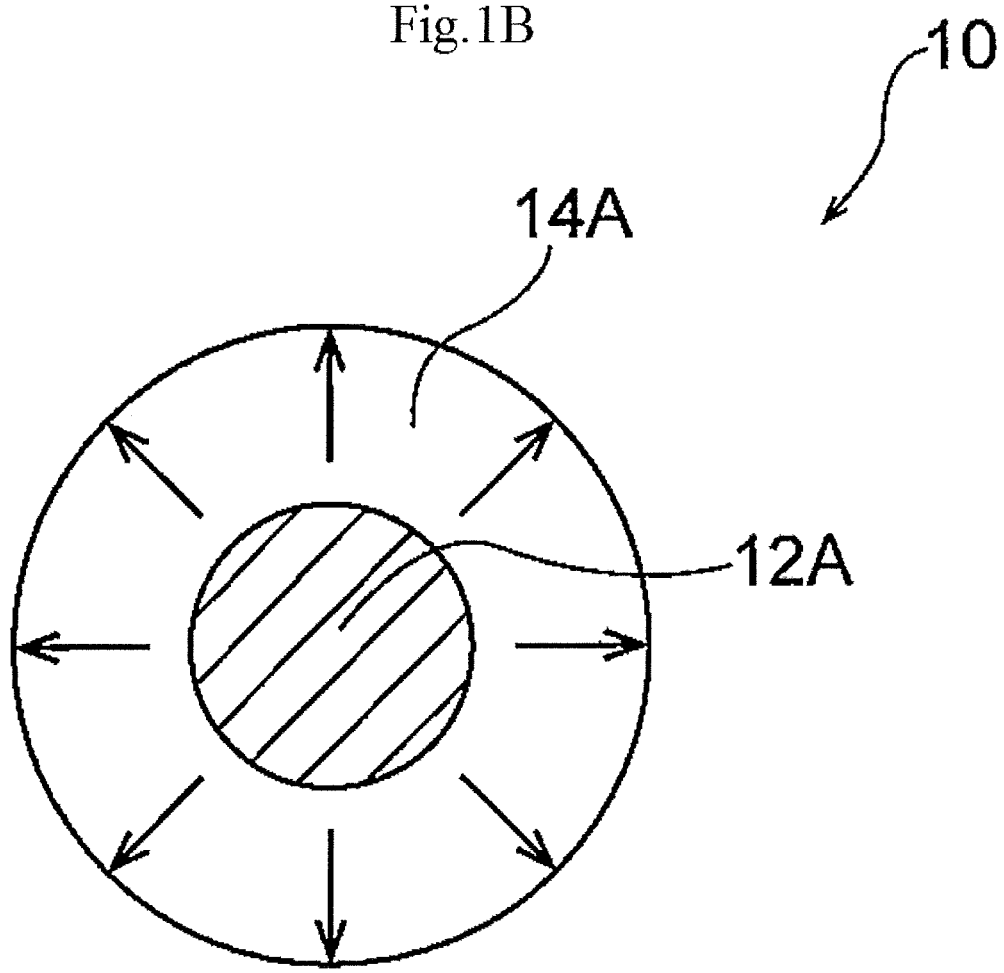

TIME [SEC]

TIME [SEC]

TIME [SEC]

PIEZOELECTRIC SUBSTRATES:
WHISKER SENSORS

PIEZOELECTRIC SUBSTRATE, PIEZOELECTRIC TEXTILE, PIEZOELECTRIC FABRIC, PIEZOELECTRIC DEVICE, FORCE SENSOR, ACTUATOR, AND BIOLOGICAL INFORMATION ACQUISITION DEVICE

TECHNICAL FIELD

The present invention relates to a piezoelectric substrate, a piezoelectric textile, a piezoelectric fabric, a piezoelectric device, a force sensor, an actuator, and a biological information acquisition device.

BACKGROUND ART

Recently, application of piezoelectric materials including helical chiral polymers to piezoelectric devices such as sensors or actuators is studied. Piezoelectric materials having film shapes are used as such piezoelectric devices.

Attention is focused on use of optically active polymers such as polypeptides or polylactic acid polymers as the helical chiral polymers in the piezoelectric materials. Especially, only mechanical stretching operations are known to allow such polylactic acid polymers to exhibit piezoelectricity. It is known that piezoelectric materials using polylactic acid polymers need not be subjected to poling treatment and have piezoelectricity that is not deteriorated for several years.

For example, a piezoelectric material having a great piezoelectric constant $d_{14}$ and excellent transparency is reported as the piezoelectric material including the polylactic acid polymer (see, for example, Patent Literature 1 and 2).

Recently, use of conductors coated with materials having piezoelectricity is attempted.

For example, a piezo cable including a central conductor, a piezoelectric material layer, an outer conductor, and a sheath that are in turn coaxially arranged from the center to the outside is known (see, for example, Patent Literature 3).

A piezoelectric unit including a conductive fiber coated with a fiber including a piezoelectric polymer is known (see, for example, Patent Literature 4).

[Patent Literature 1] Japanese Patent No. 4934235
[Patent Literature 2] International Publication No. WO 2010/104196
[Patent Literature 3] Japanese Patent Application Laid-Open (JP-A) No. H10-132669
[Patent Literature 4] International Publication No. WO 2014/058077

SUMMARY OF INVENTION

Technical Problem

Use of a piezoelectric material having a film shape (for example, a piezoelectric material in Examples of Patent Literature 1 or 2) in a greatly uneven spot or a spot with a great deformation amount (for example, use of the piezoelectric material as part or the entirety of a wearable product) may cause the interior of the piezoelectric material to be broken due to deformation, may result in damage such as a wrinkle, and may consequently result in the deterioration of piezoelectric sensitivity (for example, sensor sensitivity in the case of using the piezoelectric material as a sensor or operation sensitivity in the case of using the piezoelectric material as an actuator (the same applies hereafter)).

Patent Literature 3 describes a piezo cable including a central conductor, a piezoelectric material layer, an outer conductor, and a sheath that are in turn coaxially arranged from the center to the outside as described above. In Patent Literature 3, polyvinylidene fluoride (PVDF) is described as a piezoelectric material. In PVDF, however, a piezoelectric constant varies with time and may decrease with time. PVDF is a ferroelectric substance and therefore has pyroelectricity. Therefore, a piezoelectric signal output may fluctuate due to a surrounding temperature change. Therefore, the piezo cable described in Patent Literature 3 may result in the insufficient stability of piezoelectric sensitivity and in the insufficient stability of a piezoelectric output (stability with respect to time or temperature change).

Patent Literature 4 describes, for example, a piezoelectric unit obtained by winding a braided tube or a braided round cord, generated with a piezoelectric fiber, around a conductive fiber, as a piezoelectric unit coated with a fiber including a piezoelectric polymer (hereinafter referred to as "piezoelectric fiber"). In the piezoelectric unit described in Patent Literature 4, however, the direction of winding the piezoelectric fiber around the conductive fiber is not particularly limited. Therefore, even in a case in which charges are generated in the piezoelectric polymer due to a shear stress generated in the wound piezoelectric polymer as a result of applying a tension to the entirety of the braided tube or the braided round cord, the polarities of the charges generated in the piezoelectric polymer may be canceled out each other. Accordingly, the piezoelectric fiber described in Patent Literature 4 may result in insufficient piezoelectric sensitivity.

In other words, an object of one aspect of the invention is to provide a piezoelectric substrate, a piezoelectric textile, a piezoelectric fabric, a piezoelectric device, a force sensor, an actuator, and a biological information acquisition device of which each has excellent piezoelectric sensitivity and also has the excellent stability of a piezoelectric output.

Solution to Problem

Specific means to solve the problem are as follows.

<1> A piezoelectric substrate, comprising:
an elongate conductor; and
an elongate first piezoelectric material helically wound in one direction around the conductor, wherein:
the first piezoelectric material comprises an optically active helical chiral polymer (A);
a lengthwise direction of the first piezoelectric material and a principal orientation direction of the helical chiral polymer (A) included in the first piezoelectric material are substantially parallel to each other; and
the first piezoelectric material has an orientation degree F. in a range of from 0.5 to less than 1.0, determined from X-ray diffraction measurement by the following Formula (a):

$$\text{orientation degree } F.=(180°-\alpha)/180° \qquad (a)$$

(wherein, in Formula (a), α represents a half width of a peak derived from orientation).

<2> The piezoelectric substrate according to <1>, wherein:
the conductor is an inner conductor, and
the first piezoelectric material is helically wound in the one direction along an outer peripheral surface of the inner conductor.

<3> The piezoelectric substrate according to <2>, further comprising an elongate second piezoelectric material helically wound in a direction different from the one direction, wherein:

the second piezoelectric material comprises an optically active helical chiral polymer (A);

a lengthwise direction of the second piezoelectric material and a principal orientation direction of the helical chiral polymer (A) included in the second piezoelectric material are substantially parallel to each other;

an orientation degree F. of the second piezoelectric material, determined from X-ray diffraction measurement by Formula (a), is in a range of from 0.5 to less than 1.0; and a chirality of the helical chiral polymer (A) included in the first piezoelectric material and a chirality of the helical chiral polymer (A) included in the second piezoelectric material differ from each other.

<4> The piezoelectric substrate according to <2>, further comprising a first insulator helically wound along an outer peripheral surface of the inner conductor, wherein the first insulator is arranged at an opposite side from the inner conductor as viewed from the first piezoelectric material.

<5> The piezoelectric substrate according to <2>, further comprising a first insulator helically wound along an outer peripheral surface of the inner conductor, wherein the first insulator is arranged between the inner conductor and the first piezoelectric material.

<6> The piezoelectric substrate according to <2>, the piezoelectric substrate further comprising an elongate second piezoelectric material wound in a direction different from the one direction, wherein:

the second piezoelectric material comprises an optically active helical chiral polymer (A);

a lengthwise direction of the second piezoelectric material and a principal orientation direction of the helical chiral polymer (A) included in the second piezoelectric material are substantially parallel to each other;

an orientation degree F. of the second piezoelectric material, determined from X-ray diffraction measurement by Formula (a), is in a range of from 0.5 to less than 1.0;

the first piezoelectric material and the second piezoelectric material alternately intersect each other to form a braided structure; and a chirality of the helical chiral polymer (A) included in the first piezoelectric material and a chirality of the helical chiral polymer (A) included in the second piezoelectric material differ from each other.

<7> The piezoelectric substrate according to <2>, further comprising a first insulator wound along an outer peripheral surface of the inner conductor, wherein the first piezoelectric material and the first insulator alternately intersect each other to form a braided structure.

<8> The piezoelectric substrate according to any one of <2> to <7>, wherein the first piezoelectric material is wound while maintaining an angle of from 15° to 750 with respect to an axial direction of the inner conductor.

<9> The piezoelectric substrate according to any one of <2> to <8>, wherein:

the first piezoelectric material has a fiber-like configuration comprising one or more bundles, and a major axis diameter of a cross section of the first piezoelectric material is from 0.0001 mm to 10 mm.

<10> The piezoelectric substrate according to any one of <1> to <8>, wherein the first piezoelectric material has an elongate flat plate shape;

the first piezoelectric material has a thickness of from 0.001 mm to 0.2 mm;

the first piezoelectric material has a width of from 0.1 mm to 30 mm; and a ratio of the width of the first piezoelectric material to the thickness of the first piezoelectric material is 2 or more.

<11> The piezoelectric substrate according to any one of <1> to <10>, wherein the first piezoelectric material comprises from 0.01 parts by mass to 10 parts by mass of a stabilizer (B) which has one or more kinds of functional group selected from the group consisting of a carbodiimide group, an epoxy group, and an isocyanate group, and has a weight average molecular weight of from 200 to 60,000 with respect to 100 parts by mass of the helical chiral polymer (A).

<12> The piezoelectric substrate according to <11>, further comprising a functional layer arranged on at least one principal plane of the first piezoelectric material.

<13> The piezoelectric substrate according to <12>, wherein the functional layer comprises at least one of an easily adhesive layer, a hard coat layer, an antistatic layer, an antiblock layer, a protective layer, or an electrode layer.

<14> The piezoelectric substrate according to <12> or <13>, wherein the functional layer comprises an electrode layer.

<15> The piezoelectric substrate according to <14>, wherein at least one of the surface layers of a layered body comprising the first piezoelectric material and the functional layer is the electrode layer.

<16> The piezoelectric substrate according to <1>, wherein the conductor and the first piezoelectric material are twisted together.

<17> The piezoelectric substrate according to <16>, wherein the first piezoelectric material has a fiber-like configuration comprising one or more bundles, and a major axis diameter of a cross section of the first piezoelectric material is from 0.0001 mm to 2 mm.

<18> The piezoelectric substrate according to any one of <1> to <17>, wherein the conductor is a tinsel wire.

<19> The piezoelectric substrate according to any one of <1> to <18>, further comprising an adhesive layer between the conductor and the first piezoelectric material.

<20> The piezoelectric substrate according to any one of <1> to <19>, wherein the helical chiral polymer (A) included in the first piezoelectric material is a polylactic acid polymer having a main chain comprising a repeating unit represented by the following Formula (1).

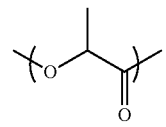

(1)

<21> The piezoelectric substrate according to any one of <1> to <20>, wherein the helical chiral polymer (A) included in the first piezoelectric material preferably has an optical purity of 95.00% ee or more.

<22> The piezoelectric substrate according to any one of <1> to <21>, wherein the helical chiral polymer (A) included in the first piezoelectric material includes D-form or L-form.

<23> The piezoelectric substrate according to any one of <1> to <22>, wherein the content of the helical chiral polymer (A) included in the first piezoelectric material is 80% by mass or more with respect to the total amount of the first piezoelectric material.

<24> The piezoelectric substrate according to any one of <1> to <23>, further comprising a first outer conductor at an outer periphery.

<25> The piezoelectric substrate according to <21>, further comprising a second insulator at an outer periphery of the first outer conductor.

<26> A piezoelectric textile, comprising a textile structure comprising warp and weft, wherein at least one of the warp or the weft comprises the piezoelectric substrate according to any one of <1> to <25>.

<27> A piezoelectric textile, comprising a textile structure comprising warp and weft, wherein:
both the warp and the weft comprise the piezoelectric substrate according to any one of <1> to <25>,
a direction of winding of the first piezoelectric material included in the warp and a direction of winding of the first piezoelectric material included in the weft differ from each other, and
a chirality of the helical chiral polymer (A) included in the warp and a chirality of the helical chiral polymer (A) included in the weft are identical to each other.

<28> A piezoelectric textile, comprising a textile structure comprising warp and weft, wherein
both the warp and the weft comprise the piezoelectric substrate according to any one of <1> to <25>,
a direction of winding of the first piezoelectric material included in the warp and a direction of winding of the first piezoelectric material included in the weft are identical to each other, and
a chirality of the helical chiral polymer (A) included in the warp and a chirality of the helical chiral polymer (A) included in the weft differ from each other.

<29> A piezoelectric fabric, comprising a fabric structure comprising the piezoelectric substrate according to any one of <1> to <25>.

<30> A piezoelectric device, comprising:
the piezoelectric textile according to any one of <26> to <28> or the piezoelectric fabric according to <29>; and
a second outer conductor arranged at a position opposed to a principal plane of the textile structure or the fabric structure.

<31> The piezoelectric device according to <30>, further comprising a third insulator between the second outer conductor and the textile structure or the fabric structure.

<32> A force sensor, comprising the piezoelectric substrate according to any one of <1> to <25>.

<33> An actuator, comprising the piezoelectric substrate according to any one of <1> to <25>.

<34> A biological information acquisition device, comprising the piezoelectric substrate according to any one of <1> to <25>, the piezoelectric textile according to any one of <26> to <28>, or the piezoelectric fabric according to <29>.

Advantageous Effects of Invention

According to one aspect of the invention, a piezoelectric substrate, a piezoelectric textile, a piezoelectric fabric, a piezoelectric device, a force sensor, an actuator, and a biological information acquisition device of which each has excellent piezoelectric sensitivity and also has the excellent stability of a piezoelectric output are provided.

BRIEF DESCRIPTION OF DRAWINGS

FIG. 1B is a cross sectional view taken along the line X-X' of FIG. 1A.

DESCRIPTION OF EMBODIMENTS

Figure 1A:
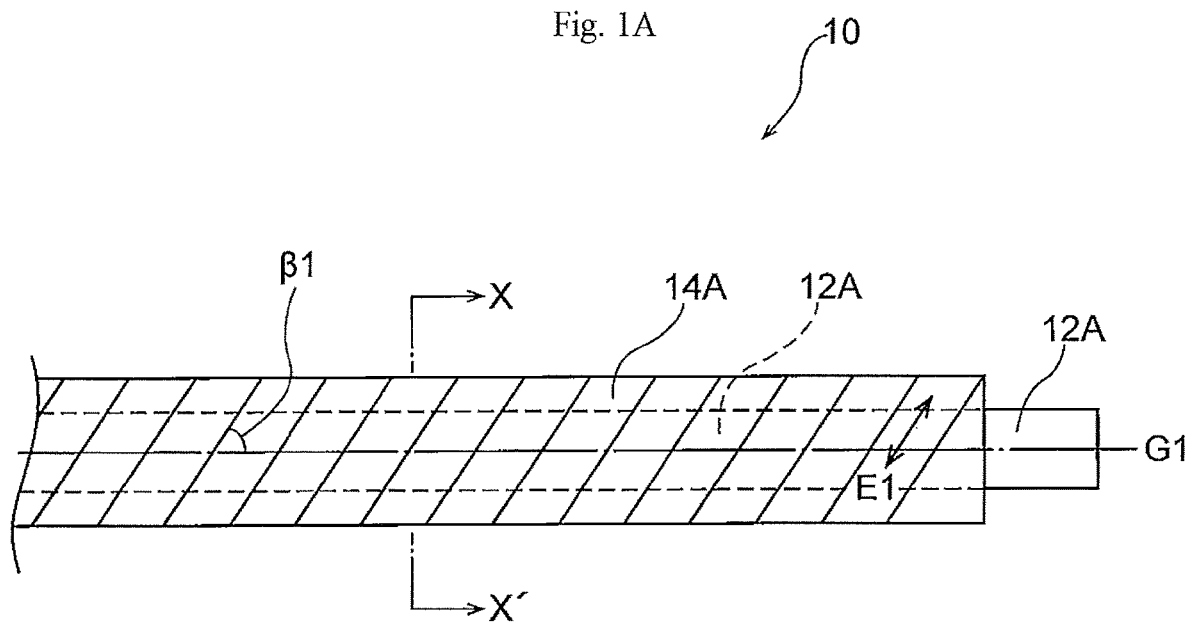
FIG. 1A is a side view illustrating a specific aspect A of a piezoelectric substrate according to a first embodiment.

Embodiments of the invention will be described below. The invention is not limited to the following embodiments.

Herein, a numerical range represented by "from A to B" means a range including numerical values A and B as a lower limit value and an upper limit value, respectively.

Herein, "principal plane" of each of elongate-flat-plate-shaped piezoelectric materials (first piezoelectric material and second piezoelectric material) means a plane perpendicular to the thickness direction of the elongate-flat-plate-shaped piezoelectric material (i.e., a plane including a lengthwise direction and a width direction). The same applies to "principal plane" of a textile and "principal plane" of a fabric.

Herein, "plane" of a member means "principal plane" of the member unless otherwise specified.

Herein, a thickness, a width, and a length satisfy a relationship of thickness<width<length, as usually defined.

Herein, an angle between two line segments is expressed in a range of from 0° to 90°.

Herein, "film" is a concept including so-called "sheet" as well as so-called "film."

Herein, "MD direction" refers to a direction (machine direction) in which a film flows, i.e., a stretching direction, while "TD direction" refers to a direction (transverse direction) that is perpendicular to the MD direction and parallel to a principal plane of the film.

[Piezoelectric Substrate]

A piezoelectric substrate of a present embodiment includes: an elongate conductor; and an elongate first piezoelectric material helically wound in one direction around the conductor, wherein:

the first piezoelectric material includes an optically active helical chiral polymer (A) (hereinafter also simply referred to as "helical chiral polymer (A)");

the lengthwise direction of the first piezoelectric material and the principal orientation direction of the helical chiral polymer (A) included in the first piezoelectric material are substantially parallel to each other; and the first piezoelectric material has an orientation degree of F in a range of from 0.5 to less than 1.0, determined from X-ray diffraction measurement by the following Formula (a):

$$\text{orientation degree } F.=(180°-\alpha)/180° \quad \text{(a)}$$

In Formula (a), α represents a half width of a peak derived from orientation. The unit of α is "°."

In description of the piezoelectric substrate of the present embodiment, "elongate conductor" may be simply referred to and described as "conductor", and "elongate first piezoelectric material" may be simply referred to as and described as "first piezoelectric material."

Here, the orientation degree F. of the first piezoelectric material is an index indicating the degree of the orientation of the helical chiral polymer (A) included in the first piezoelectric material, such as a c-axis orientation degree measured by a wide-angle X-ray diffractometer (RINT 2550 manufactured by Rigaku Corporation, attachment device: rotational sample table, X-ray source: CuKα, output: 40 k, 370 mA, detector: scintillation counter).

Examples of a method of measuring the orientation degree F. of the first piezoelectric material are as described in examples described later.

"One direction" refers to the direction of winding around the first piezoelectric material from the front to back sides of the conductor in a case in which the piezoelectric substrate of the present embodiment is viewed from one end of the conductor in an axial direction. Specifically, "one direction" refers to a right direction (right-handed, i.e., clockwise) or a left direction (left-handed, i.e., counterclockwise).

The piezoelectric substrate of the present embodiment includes such a configuration, thereby being excellent in piezoelectric sensitivity and also excellent in the stability of a piezoelectric output.

More specifically, in the piezoelectric substrate of the present embodiment, the first piezoelectric material includes the helical chiral polymer (A), the lengthwise direction of the first piezoelectric material and the principal orientation direction of the helical chiral polymer (A) are substantially parallel to each other, and the orientation degree F. of the first piezoelectric material is from 0.5 to less than 1.0, whereby piezoelectricity is exhibited.

Moreover, the piezoelectric substrate of the present embodiment has a configuration in which the first piezoelectric material is helically wound in one direction around the conductor.

In the piezoelectric substrate of the present embodiment, the first piezoelectric material is arranged in such a manner as described above, whereby, in a case in which a tension (stress) is applied in the lengthwise direction of the piezoelectric substrate, a shear force is applied to the helical chiral polymer (A), and the polarization of the helical chiral polymer (A) occurs in the radial direction of the piezoelectric substrate. In the case of regarding the helically wound first piezoelectric material as the aggregate of such a micro region as can be considered to be planar with respect to the lengthwise direction of the first piezoelectric material, application of a shear force caused by a tension (stress) to the plane of the included micro region to the helical chiral polymer allows the direction of the polarization to substantially coincide with the direction of an electric field generated due to a piezoelectric constant $d_{14}$.

Specifically, for example, in the case of a homopolymer (PLLA) of L-lactic acid having a molecular structure including a left-handed helical structure, in a polylactic acid, application of a tension (stress) to a structure formed by helically winding, in a left-handed manner, a first piezoelectric material in which the principal orientation and lengthwise directions of PLLA are substantially parallel to each other around a conductor results in generation of an electric field (polarization) from the center of the circle of a circular cross section perpendicular to the tension toward an outside in parallel to a radial direction. Conversely, application of a tension (stress) to a structure formed by helically winding, in a right-handed manner, a first piezoelectric material in which the principal orientation and lengthwise directions of PLLA are substantially parallel to each other around a conductor results in generation of an electric field (polarization) from the outside of the circle of a circular cross section perpendicular to the tension toward a center in parallel to a radial direction.

For example, in the case of a homopolymer (PDLA) of D-lactic acid having a molecular structure including a right-handed helical structure, application of a tension (stress) to a structure formed by helically winding, in a left-handed manner, a first piezoelectric material in which the principal orientation and lengthwise directions of PDLA are substantially parallel to each other around a conductor results in generation of an electric field (polarization) from the outside of the circle of a circular cross section perpendicular to the tension toward a center in parallel to a radial direction. Conversely, application of a tension (stress) to a structure formed by helically winding, in a right-handed manner, a first piezoelectric material in which the principal orientation and lengthwise directions of PDLA are substantially parallel to each other around a conductor results in generation of an electric field (polarization) from the center of the circle of a circular cross section perpendicular to the tension toward an outside in parallel to a radial direction.

As a result, a voltage signal proportional to a tension is considered to be effectively detected because a potential difference proportional to the tension in the state of a uniform phase occurs in each site of a helically arranged first piezoelectric material in the case of applying the tension in the lengthwise direction of a piezoelectric substrate.

Therefore, a piezoelectric substrate that is excellent in piezoelectric sensitivity and also excellent in the stability of a piezoelectric output can be obtained according to the piezoelectric substrate of the present embodiment.

For example, the piezoelectric substrate of the present embodiment may include a structure formed by helically winding, in a right-handed manner, one part of a piezoelectric material and helically winding, in a left-handed manner, the other part of the piezoelectric material around the conductor. In the case of helically winding the other part of the piezoelectric material in the left-handed, the rate of winding in the left-handed manner is preferably less than 50% with respect to the total winding (total of winding in the right-handed and left-handed manners) in view of suppressing the deterioration of piezoelectric sensitivity and obtaining a piezoelectric substrate having the stable voltage polarity of a piezoelectric output.

The piezoelectric substrate of the present embodiment may include a structure formed by helically winding, in a left-handed manner, one part of a piezoelectric material and helically winding, in a right-handed manner, the other part of the piezoelectric material around the conductor. In the case of helically winding the other part of the piezoelectric material in the right-handed, the rate of winding in the right-handed manner is preferably less than 50% with respect to the total winding (total of winding in the right-handed and left-handed manners) in view of suppressing the deterioration of piezoelectric sensitivity and obtaining a piezoelectric substrate having the stable voltage polarity of a piezoelectric output.

In particular, the stability of piezoelectric sensitivity and the stability of a piezoelectric output (stability with respect to time or change in temperature) in a piezoelectric substrate using a non-pyroelectric polylactic acid polymer as the helical chiral polymer (A) are further improved in comparison with those in a piezoelectric substrate using pyroelectric PVDF.

In the piezoelectric unit including a piezoelectric fiber described Patent Literature 4, the direction of winding a piezoelectric fiber around a conductive fiber is not limited, and both of the origin and direction of a force included in a shear force are different from those in the piezoelectric substrate of the present embodiment. Therefore, piezoelectric sensitivity is considered to be insufficient because polarization does not occur in the radial direction of the piezoelectric unit, i.e., polarization does not occur in the direction of an electric field generated due to a piezoelectric constant $d_{14}$, even in the case of applying a tension to the piezoelectric unit described in Patent Literature 4.

Here, the case in which the lengthwise direction of the first piezoelectric material and the principal orientation direction of the helical chiral polymer (A) are substantially parallel to each other offers an advantage in that the first piezoelectric material is resistant to a tension in the lengthwise direction (i.e., has excellent tensile strength in the lengthwise direction). Accordingly, the first piezoelectric material is inhibited from being broken in the case of being helically wound in one direction around the conductor.

In addition, the case in which the lengthwise direction of the first piezoelectric material and the principal orientation direction of the helical chiral polymer (A) are substantially parallel to each other is also advantageous in productivity in the case of, for example, slitting a stretched piezoelectric film to obtain the first piezoelectric material (for example, a slit ribbon).

Herein, "substantially parallel" means that an angle between two line segments is from 0° to less than 30° (preferably from 0° to 22.5°, more preferably from 0° to 10°, still more preferably from 0° to 5°, and particularly preferably from 0° to 3°).

Herein, the principal orientation direction of the helical chiral polymer (A) means the main orientation direction of the helical chiral polymer (A). The principal orientation direction of the helical chiral polymer (A) can be confirmed by measuring the orientation degree F. of the first piezoelectric material.

In a case in which the melt spinning of a raw material is performed, followed by stretching the raw material and producing a first piezoelectric material, the principal orientation direction of a helical chiral polymer (A) in the first piezoelectric material means a principal stretching direction. The principal stretching direction refers to a stretching direction.

Likewise, in the case of stretching a film and forming a slit of a stretched film to produce a first piezoelectric material, the principal orientation direction of a helical chiral polymer (A) in the produced first piezoelectric material means a principal stretching direction. Here, the principal stretching direction refers to a stretching direction in the case of monoaxial stretching or to a stretching direction with a higher stretching rate in the case of biaxial stretching.

A first embodiment of the piezoelectric substrate according to the invention will be described in detail below.

Piezoelectric Substrate of First Embodiment

In the piezoelectric substrate of the first embodiment, the elongate conductor is preferably an inner conductor, and the elongate first piezoelectric material is preferably helically wound in one direction along the outer peripheral surface of the inner conductor.

The use of the inner conductor as the conductor facilitates the helical arrangement of the first piezoelectric material in one direction while maintaining the first piezoelectric material at a helix angle β with respect to the axial direction of the inner conductor.

Here, "helix angle β" means an angle between the axial direction of the conductor and the direction of arranging the first piezoelectric material with respect to the axial direction of the conductor (the lengthwise direction of the first piezoelectric material).

As a result, the polarization of the helical chiral polymer (A) easily occurs in the radial direction of the piezoelectric substrate in the case of, for example, applying a tension in the lengthwise direction of the piezoelectric substrate. As a result, a voltage signal (charge signal) proportional to the tension is effectively detected.

In addition, a piezoelectric substrate having such a configuration as described above has the same structure as an inner structure (an inner conductor and a dielectric body) included in a coaxial cable, and can therefore have a structure that has high electromagnetic shield properties and is resistant to noise in the case of, for example, applying the piezoelectric substrate to a coaxial cable.

The piezoelectric substrate of the first embodiment preferably further includes an elongate second piezoelectric material helically wound in a direction different from the one direction.

In addition, it is preferable that: the second piezoelectric material includes an optically active helical chiral polymer (A);

the lengthwise direction of the second piezoelectric material and the principal orientation direction of the helical chiral polymer (A) included in the second piezoelectric material are substantially parallel to each other;

the orientation degree F. of the second piezoelectric material, determined from X-ray diffraction measurement by Formula (a), is in a range of from 0.5 to less than 1.0; and the chirality of the helical chiral polymer (A) included in the first piezoelectric material and the chirality of the helical chiral polymer (A) included in the second piezoelectric material differ from each other.

As a result, the polarization of both of the helical chiral polymer (A) included in the first piezoelectric material and the helical chiral polymer (A) included in the second piezoelectric material occurs in the case of, for example, applying a tension in the lengthwise direction of the piezoelectric substrate. Each polarization direction is the radial direction of the piezoelectric substrate.

As a result, a voltage signal (charge signal) proportional to the tension is more effectively detected. Accordingly, piezoelectric sensitivity and the stability of a piezoelectric output are further improved.

Particularly in a case in which the piezoelectric substrate of the first embodiment includes a first outer conductor and the piezoelectric material has a two-layer structure including a first piezoelectric material and a second piezoelectric material, the first piezoelectric material and the second piezoelectric material can be brought into intimate contact with the inner conductor and the first outer conductor so as to form fewer voids, thereby facilitating efficient transmission of an electric field generated by a tension to an electrode. Accordingly, the piezoelectric substrate has a form preferred for achieving a more highly sensitive sensor.

From the viewpoint of improving piezoelectric sensitivity and the stability of a piezoelectric output, the piezoelectric substrate of the first embodiment further includes a first insulator helically wound along the outer peripheral surface of the inner conductor, wherein the first insulator is preferably arranged in the opposite side of the inner conductor as viewed from the first piezoelectric material.

For example, in a case in which the piezoelectric substrate of the first embodiment includes a first outer conductor, the repeated bending of the piezoelectric substrate or the bending of the piezoelectric substrate at a small curvature radius is prone to result in a gap in the wound first piezoelectric material, whereby the inner conductor and the first outer conductor may be electrically short-circuited. In such a case, the inner conductor and the first outer conductor can be more reliably, electrically shielded from each other by arranging the first insulator. High reliability can also be achieved in applications in which the bent piezoelectric substrate is used.

From the viewpoint of improving piezoelectric sensitivity and the stability of a piezoelectric output, the piezoelectric substrate of the first embodiment further includes a first insulator helically wound along the outer peripheral surface of the inner conductor, wherein the first insulator is preferably arranged between the inner conductor and the first piezoelectric material.

For example, in a case in which the piezoelectric substrate of the first embodiment includes a first outer conductor, the repeated bending of the piezoelectric substrate or the bending of the piezoelectric substrate at a small curvature radius is prone to result in a gap in the wound first piezoelectric material, whereby the inner conductor and the first outer conductor may be electrically short-circuited. In such a case, the inner conductor and the first outer conductor can be more reliably, electrically shielded from each other by arranging the first insulator. High reliability can also be achieved in applications in which the bent piezoelectric substrate is used.

It is preferable that the piezoelectric substrate of the first embodiment further includes an elongate second piezoelectric material wound in a direction different from the one direction, wherein the second piezoelectric material includes an optically active helical chiral polymer (A);

the lengthwise direction of the second piezoelectric material and the principal orientation direction of the helical chiral polymer (A) included in the second piezoelectric material are substantially parallel to each other;

the orientation degree F. of the second piezoelectric material, determined from X-ray diffraction measurement by Formula (a), is in a range of from 0.5 to less than 1.0;

the first piezoelectric material and the second piezoelectric material alternately intersect each other to form a braided structure; and the chirality of the helical chiral polymer (A) included in the first piezoelectric material and the chirality of the helical chiral polymer (A) included in the second piezoelectric material differ from each other.

As a result, the polarization of both of the helical chiral polymer (A) included in the first piezoelectric material and the helical chiral polymer (A) included in the second piezoelectric material occurs in the case of, for example, applying a tension in the lengthwise direction of the piezoelectric substrate. Each polarization direction is the radial direction of the piezoelectric substrate.

As a result, a voltage signal proportional to the tension is more effectively detected. As a result, piezoelectric sensitivity and the stability of a piezoelectric output are further improved.

Particularly in a case in which the piezoelectric substrate of the first embodiment includes a first outer conductor and a piezoelectric material forms a braided structure including a first piezoelectric material and a second piezoelectric material, an adequate void is present between the first piezoelectric material and the second piezoelectric material. Therefore, even in the case of applying a force that bends and deforms the piezoelectric substrate, the void absorbs such deformation, thereby facilitating flexible bending and deformation of the piezoelectric substrate. Therefore, the piezoelectric substrate of the first embodiment can be preferably used as, for example, a configuration member of a wearable product (such as a piezoelectric textile, a piezoelectric fabric, a piezoelectric device, a force sensor, or a biological information acquisition device described later), as used to be along a three-dimensional plane.

From the viewpoint of improving piezoelectric sensitivity and the stability of a piezoelectric output, it is preferable that the piezoelectric substrate of the first embodiment further includes a first insulator wound along the outer peripheral surface of the inner conductor, wherein the first piezoelectric material and the first insulator alternately intersect each other to form a braided structure.

As a result, it is easy to maintain a state in which the first piezoelectric material is wound around the inner conductor in one direction in the case of bending and deforming the piezoelectric substrate. It is preferable that there is not any gap between the first piezoelectric material and the first insulator in the braided structure of such an aspect from the viewpoint of easily applying a tension to the first piezoelectric material.

From the viewpoint of improving piezoelectric sensitivity and the stability of a piezoelectric output, in the piezoelectric substrate of the first embodiment, the first piezoelectric material is preferably wound at an angle of from 15° to 75° (45° 30°), more preferably at an angle of from 35° to 55° (45° 10°), maintained with respect to the axial direction of the inner conductor.

From the viewpoint of improving piezoelectric sensitivity and the stability of a piezoelectric output, in the piezoelectric substrate of the first embodiment, the first piezoelectric material has a fiber-like configuration including one or more bundles, and the major axis diameter of a cross section of the first piezoelectric material is preferably from 0.0001 mm to 10 mm, more preferably from 0.001 mm to 5 mm, and still more preferably from 0.002 mm to 1 mm.

Here, "major axis diameter of cross section" corresponds to "diameter" in a case in which a cross section of the first piezoelectric material (preferably a fibrous piezoelectric material) has a circular form.

In a case in which a cross section of the first piezoelectric material has a varying shape, "major axis diameter of cross section" is set to the longest width of the widths of such cross sections.

In a case in which the first piezoelectric material is a piezoelectric material including plural bundles, "major axis diameter of cross section" is set to the major axis diameter of a cross section of the piezoelectric material including plural bundles.

From the viewpoint improving piezoelectric sensitivity and the stability of a piezoelectric output, in the piezoelectric substrate of the present embodiment (for example, the piezoelectric substrate of the first embodiment), the first piezoelectric material preferably has an elongate flat plate shape. The first piezoelectric material has a thickness of from 0.001 mm to 0.2 mm, the first piezoelectric material has a width of from 0.1 mm to 30 mm, and the ratio of the width of the first piezoelectric material to the thickness of the first piezoelectric material is 2 or more.

The dimensions (thickness, width, and ratios (width/thickness, and length/width)) of the first piezoelectric material having an elongate flat plate shape (hereinafter also referred to as "elongate-flat-plate-shaped piezoelectric material") will be described in more detail below.

The first piezoelectric material preferably has a thickness of from 0.001 mm to 0.2 mm.

A thickness of 0.001 mm or more allows the strength of the elongate-flat-plate-shaped piezoelectric material to be secured, and also results in the excellent production suitability of the elongate-flat-plate-shaped piezoelectric material.

A thickness of 0.2 mm or less results in improvement in the degree of freedom (flexibleness) of deformation of the elongate-flat-plate-shaped piezoelectric material in a thickness direction.

In addition, the first piezoelectric material preferably has a width of from 0.1 mm to 30 mm.

A width of 0.1 mm or more allows the strength of the first piezoelectric material (elongate-flat-plate-shaped piezoelectric material) to be secured, and also results in the excellent production suitability (for example, production suitability in a slit step described later) of the elongate-flat-plate-shaped piezoelectric material.

A width of 30 mm or less results in improvement in the degree of freedom (flexibleness) of deformation of the elongate-flat-plate-shaped piezoelectric material.

In addition, the ratio of the width of the first piezoelectric material to the thickness of the first piezoelectric material (hereinafter also referred to as "ratio [width/thickness]") is preferably 2 or more.

A ratio [width/thickness] of 2 or more results in a definite principal plane, thereby facilitating formation of an electrode layer (for example, an outer conductor) with a uniform orientation over the lengthwise direction of the first piezoelectric material (elongate-flat-plate-shaped piezoelectric material). For example, an outer conductor is easily formed on at least one principal plane. In a case in which the elongate-flat-plate-shaped piezoelectric material is made into a piezoelectric textile or a piezoelectric fabric described later, it is easy to uniformly arrange an electrode layer on a principal plane of the piezoelectric textile or the piezoelectric fabric. Therefore, piezoelectric sensitivity is excellent, and the stability of the piezoelectric sensitivity is also excellent.

The first piezoelectric material more preferably has a width of from 0.5 mm to 15 mm.

A width of 0.5 mm or more results in more improvement in the strength of the first piezoelectric material (elongate-flat-plate-shaped piezoelectric material). In addition, the elongate-flat-plate-shaped piezoelectric material can be further inhibited from twisting, and therefore, piezoelectric sensitivity and the stability thereof are further improved.

A width of 15 mm or less results in more improvement in the degree of freedom (flexibleness) of deformation of the elongate-flat-plate-shaped piezoelectric material.

The ratio of the length to the width (hereinafter also referred to as "ratio [length/width]") of the first piezoelectric material is preferably 10 or more.

A ratio [length/width] of 10 or more results in more improvement in the degree of freedom (flexibleness) of deformation of the first piezoelectric material (elongate-flat-plate-shaped piezoelectric material). In addition, piezoelectricity can be more extensively applied to a piezoelectric device (such as a piezoelectric textile or a piezoelectric fabric) to which the elongate-flat-plate-shaped piezoelectric material is applied.

In the piezoelectric substrate of the present embodiment (for example, the piezoelectric substrate of the first embodiment), a functional layer is preferably arranged on at least one principal plane of the first piezoelectric material from the viewpoint of improving piezoelectric sensitivity and the stability of a piezoelectric output in a case in which the first piezoelectric material has an elongate flat plate shape.

The functional layer preferably includes at least one of an easily adhesive layer, a hard coat layer, an antistatic layer, an antiblock layer, a protective layer, or an electrode layer.

As a result, application to, for example, a piezoelectric device (such as a piezoelectric textile or a piezoelectric fabric), a force sensor, an actuator, or a biological information acquisition device is further facilitated.

The functional layer preferably includes an electrode layer.

As a result, connection between the first outer conductor and the conductor (preferably, an inner conductor) can be more easily performed in a case in which the piezoelectric substrate is used as one of the components of, for example, a piezoelectric device (such as a piezoelectric textile or a piezoelectric fabric), a force sensor, an actuator, or a biological information acquisition device. Therefore, a voltage signal corresponding to a tension is easily detected in the case of applying a tension to the piezoelectric substrate of the present embodiment.

In the piezoelectric substrate of the present embodiment (for example, the piezoelectric substrate of the first embodiment), at least one of surface layers of a layered body including the first piezoelectric material and the functional layer is preferably the electrode layer.

As a result, connection between the first outer conductor or the conductor (preferably, an inner conductor) and the layered body can be more easily performed in a case in which the piezoelectric substrate is used as one of the components of, for example, a piezoelectric device (such as a piezoelectric textile or a piezoelectric fabric), a force sensor, an actuator, or a biological information acquisition device. Therefore, a voltage signal corresponding to a tension is easily detected in the case of applying a tension to the piezoelectric substrate of the present embodiment.

In the piezoelectric substrate of the present embodiment, the conductor is preferably a tinsel wire.

The form of the tinsel wire has a structure in which a rolled copper foil is helically wound around a fiber formed by twisting short fibers such as cotton yarn, a long fiber such as polyester yarn or nylon yarn, or the like, and uses copper having high electric conductivity, thereby enabling output impedance to be decreased. Accordingly, a voltage signal corresponding to a tension is easily detected in the case of applying the tension to the piezoelectric substrate of the present embodiment. As a result, piezoelectric sensitivity and the stability of a piezoelectric output are further improved.

The piezoelectric substrate of the present embodiment preferably includes an adhesive layer between the conductor and the first piezoelectric material.

As a result, the relative positions of the conductor and the first piezoelectric material are inhibited from deviating from each other. Therefore, application of a tension to the first piezoelectric material is facilitated, thereby facilitating application of a shear stress to the helical chiral polymer (A) included in the first piezoelectric material. Accordingly, a voltage output proportional to the tension can be effectively detected from the conductor (preferably, a signal line conductor). The inclusion of the adhesive layer results in a further increase in the absolute value of the amount of generated charge per unit tensile force.

In the piezoelectric substrate of the present embodiment, the helical chiral polymer (A) included in the first piezoelectric material is preferably a polylactic acid polymer having a main chain including a repeating unit represented by the following Formula (1), from the viewpoint of further improving piezoelectricity.

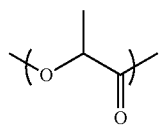

(1)

In the piezoelectric substrate of the present embodiment, the helical chiral polymer (A) included in the first piezoelectric material preferably has an optical purity of 95.00% ee or more, from the viewpoint of further improving piezoelectricity.

In the piezoelectric substrate of the present embodiment, the helical chiral polymer (A) included in the first piezoelectric material preferably includes D-form or L-form, from the viewpoint of further improving piezoelectricity.

In the piezoelectric substrate of the present embodiment, the content of the helical chiral polymer (A) included in the first piezoelectric material is preferably 80% by mass or more with respect to the total amount of the first piezoelectric material, from the viewpoint of further improving piezoelectricity.

The piezoelectric substrate of the present embodiment preferably further includes a first outer conductor at an outer periphery.

Here, "outer periphery" means the outer peripheral portion of the piezoelectric substrate.

As a result, electrostatic shielding is enabled, and a change in the voltage of the conductor (preferably, an inner conductor), influenced by external static electricity, is suppressed.

The piezoelectric substrate of the present embodiment preferably further includes a second insulator at the outer periphery of the first outer conductor.

The piezoelectric substrate of the present embodiment includes the second insulator, whereby external entrance of a liquid such as water or sweat, dust, or the like can be suppressed. Therefore, the generation of leakage current between the conductor (preferably, an inner conductor) and the outer conductor, caused by water, sweat, dust, or the like, can be suppressed. As a result, an output that is robust against various environmental changes, is inhibited from changing sensitivity, and is stable can be achieved in a case in which the piezoelectric substrate is used as one of the components of, for example, a piezoelectric device (such as a piezoelectric textile or a piezoelectric fabric), a force sensor, an actuator, or a biological information acquisition device.

A specific aspect A of the piezoelectric substrate according to the first embodiment will be described below with reference to the drawings.

Specific Aspect A

FIG. 1A is a side view illustrating the specific aspect A of the piezoelectric substrate according to the first embodiment. FIG. 1B is a cross sectional view taken along the line X-X' of FIG. 1A.

A piezoelectric substrate 10 of the specific aspect A includes: an elongate inner conductor 12A as the conductor; an elongate first piezoelectric material 14A; and an adhesive layer (not illustrated) arranged between the inner conductor 12A and the first piezoelectric material 14A.

As illustrated in FIG. 1, the first piezoelectric material 14A is helically wound in one direction from one end to the other end at a helix angle β1 along the outer peripheral surface of the inner conductor 12A so that there is not any gap.

"Helix angle β1" means an angle between the axial direction G1 of the inner conductor 12A and the arrangement direction of the first piezoelectric material 14A with respect to the axial direction of the inner conductor 12A.

In the specific aspect A, the first piezoelectric material 14A is wound in a left-handed manner around the inner conductor 12A. Specifically, the first piezoelectric material 14A is wound in a left-handed manner from the front to back sides of the inner conductor 12A in a case in which the piezoelectric substrate 10 is viewed from one end of the inner conductor 12A in an axial direction (right end side in the case of FIG. 1).

In FIG. 1, the principal orientation direction of the helical chiral polymer (A) included in the first piezoelectric material 14A is indicated by both arrows E1. In other words, the principal orientation direction of the helical chiral polymer (A) and the arrangement direction of the first piezoelectric material 14A (the lengthwise direction of the first piezoelectric material 14A) are substantially parallel to each other.

The adhesive layer (not illustrated) is arranged between the inner conductor 12A and the first piezoelectric material 14A. As a result, the piezoelectric substrate 10 of the specific aspect A is configured so that the relative positions of the first piezoelectric material 14A and the inner conductor 12A are prevented from deviating from each other even in the case of applying a tension in the lengthwise direction of the piezoelectric substrate 10.

The action of the piezoelectric substrate 10 of the specific aspect A will be described below.

For example, in the case of applying a tension in the lengthwise direction of the piezoelectric substrate 10, a shear force is applied to the helical chiral polymer (A) included in the first piezoelectric material 14A, thereby polarizing the helical chiral polymer (A). It is considered that the polarization of the helical chiral polymer (A) occurs in the radial direction of the piezoelectric substrate 10 as indicated by the arrows in FIG. 1B, and the polarization direction occurs with a uniform phase. As a result, a voltage signal proportional to the tension is effectively detected.

In the piezoelectric substrate 10 of the specific aspect A, the adhesive layer is arranged between the inner conductor 12A and the first piezoelectric material 14A, and therefore, the tension is more easily applied to the first piezoelectric material 14A.

In view of the above, the piezoelectric substrate 10 of the specific aspect A results in excellent piezoelectric sensitivity and in the excellent stability of a piezoelectric output.

A specific aspect B of the piezoelectric substrate according to the first embodiment will now be described with reference to the drawings. In the following description, the same components as those in the specific aspect A are denoted by the same reference characters, and the overlapping description thereof is omitted.

Specific Aspect B

Figure 2:
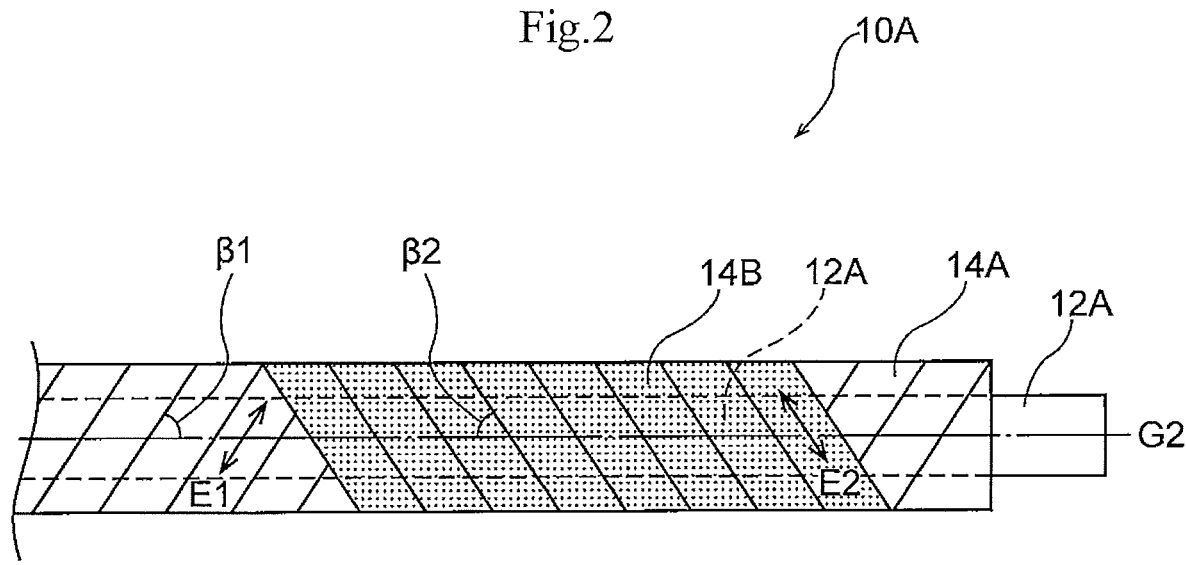
FIG. 2 is a side view illustrating a specific aspect B of the piezoelectric substrate according to the first embodiment.

FIG. 2 is a side view illustrating the specific aspect B of the piezoelectric substrate according to the first embodiment.

A piezoelectric substrate 10A of the specific aspect B differs from the piezoelectric substrate 10 of the first aspect in including an elongate second piezoelectric material 14B.

The chirality of the helical chiral polymer (A) included in the first piezoelectric material 14A and the chirality of a helical chiral polymer (A) included in the second piezoelectric material 14B differ from each other.

Like the specific aspect A, the first piezoelectric material 14A is helically wound in one direction from one end to the other end at a helix angle β1 along the outer peripheral surface of the inner conductor 12A so that there is not any gap.

In contrast, the second piezoelectric material 14B is helically wound in the reverse direction of the direction of winding the first piezoelectric material 14A at a helix angle β2 which is a substantially same angle as the helix angle β1 along the outer peripheral surface of the first piezoelectric material 14A, as illustrated in FIG. 2.

"Helix angle β2" is synonymous with the helix angle β1 described above.

Here, "reverse direction of direction of winding first piezoelectric material 14A" in the specific aspect B refers to a right-handed direction. In other words, the second piezoelectric material 14B is wound in a right-handed manner from the front to back sides of the inner conductor 12A in a case in which the piezoelectric substrate 10A is viewed from a one-end side of the inner conductor 12A in an axial direction G2 (a right-end side in the case of FIG. 2).

In FIG. 2, the principal orientation direction of the helical chiral polymer (A) included in the second piezoelectric material 14B is indicated by both arrows E2. In other words, the principal orientation direction of the helical chiral polymer (A) included in the second piezoelectric material 14B and the arrangement direction of the second piezoelectric material 14B (the lengthwise direction of the second piezoelectric material 14B) are substantially parallel to each other.

The action of the piezoelectric substrate 10A of the specific aspect B will be described below.

For example, in the case of applying a tension in the lengthwise direction of the piezoelectric substrate 10A, a shear stress is applied to both of the helical chiral polymer (A) included in the first piezoelectric material 14A and the helical chiral polymer (A) included in second piezoelectric material 14B, whereby polarization occurs. Each polarization direction is the radial direction of the piezoelectric substrate 10A. As a result, a voltage signal proportional to the tension is effectively detected.

In view of the above, the piezoelectric substrate 10A of the specific aspect B results in more improvement in piezoelectric sensitivity and the stability of a piezoelectric output.

Particularly in a case in which the piezoelectric substrate 10A of the specific aspect B includes an outer conductor, the piezoelectric material includes the first piezoelectric material and the second piezoelectric material and forms a two-layer structure, the first piezoelectric material and the second piezoelectric material can be brought into intimate contact with the inner conductor and the outer conductor so as to form fewer voids, thereby facilitating efficient transmission of an electric field generated by a tension to an electrode. Accordingly, the piezoelectric substrate has a form preferred for achieving a more highly sensitive sensor.

A specific aspect C of the piezoelectric substrate according to the first embodiment will now be described with reference to the drawings. In the following description, the same components as those in the specific aspect A and the specific aspect B are denoted by the same reference characters, and the overlapping description thereof is omitted.

Specific Aspect C

Figure 3:
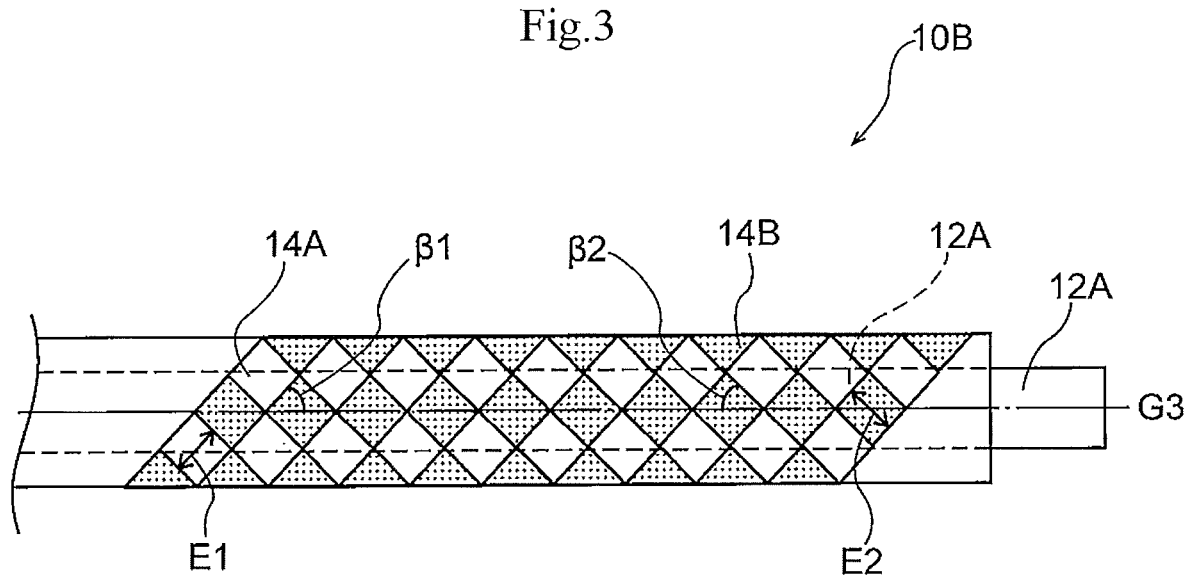
FIG. 3 is a side view illustrating a specific aspect C of the piezoelectric substrate according to the first embodiment.

FIG. 3 is a side view illustrating a specific aspect C of the piezoelectric substrate according to the first embodiment.

A piezoelectric substrate 10B of the specific aspect C differs from the piezoelectric substrate 10A of the specific aspect B in that a first piezoelectric material 14A and a second piezoelectric material 14B alternately intersect each other to form a braided structure.

The chirality of a helical chiral polymer (A) included in the first piezoelectric material 14A and the chirality of a helical chiral polymer (A) included in the second piezoelectric material 14B differ from each other.

As illustrated in FIG. 3, in the piezoelectric substrate 10B of the specific aspect C, the first piezoelectric material 14A is helically wound in a left-handed manner at a helix angle β1 and the second piezoelectric material 14B is helically wound in a right-handed manner at a helix angle β2 with respect to the axial direction G3 of an inner conductor 12A, and the first piezoelectric material 14A and the second piezoelectric material alternately intersect each other.

In the braided structure illustrated in FIG. 3, the principal orientation direction (both arrows E1) of the helical chiral polymer (A) included in first piezoelectric material 14A and the arrangement direction of the first piezoelectric material 14A are substantially parallel to each other. Similarly, the principal orientation direction (both arrows E2) of the helical chiral polymer (A) included in the second piezoelectric material 14B and the arrangement direction of the second piezoelectric material 14B are substantially parallel to each other.

The action of the piezoelectric substrate 10B of the specific aspect C will be described below.

Like the specific aspect B, for example, in the case of applying a tension in the lengthwise direction of the piezoelectric substrate 10B, polarization occurs in both of the helical chiral polymer (A) included in the first piezoelectric material 14A and the helical chiral polymer (A) included in second piezoelectric material 14B. Each polarization direction is the radial direction of the piezoelectric substrate 10B. As a result, a voltage signal proportional to the tension is effectively detected.

In view of the above, the piezoelectric substrate 10B of the specific aspect C results in more improvement in piezoelectric sensitivity and the stability of a piezoelectric output.

Particularly in a case in which the piezoelectric substrate 10B of the specific aspect C includes an outer conductor, application of a tension in the lengthwise direction of the piezoelectric substrate 10B results in application of a shear stress to the left-handed first piezoelectric material and the right-handed second piezoelectric material which form a braided structure, the polarization direction thereof is uniform, a volume fraction contributing to the piezoelectric performance of the insulators (i.e., the first piezoelectric material and the second piezoelectric material) between the inner conductor and the outer conductor is increased, and therefore, the piezoelectric performance is further improved. Therefore, the piezoelectric substrate 10B of the specific aspect C can be preferably used as one configuration member of, for example, such a wearable product (such as a piezoelectric textile, a piezoelectric fabric, a piezoelectric device, a force sensor, or a biological information acquisition device described later) as used along a three-dimensional plane.

A second embodiment of the piezoelectric substrate according to the invention will be described in detail below.

Piezoelectric Substrate of Second Embodiment

In a piezoelectric substrate of the second embodiment, an elongate conductor and an elongate first piezoelectric material are preferably twisted together.

An aspect of such twisting is not particularly limited, and such twisting about the same pivot and at the same winding number is more preferred.

The winding number of each of the conductor and the first piezoelectric material per meter varies according to each of the outer diameter (thickness) of the conductor and the outer diameter (thickness) of the first piezoelectric material. For example, in a case in which the outer diameter of the conductor and the outer diameter of the first piezoelectric material are similar to each other, the winding number is defined by the following Formula. "Outer diameter" is synonymous with "major axis diameter of cross section" described above.

$$\text{Winding number (times)} = 1000 \text{ (mm)} \times \tan β3/(πD)$$

In Formula, D represents the outer diameter (mm) of the conductor or the first piezoelectric material. πD represents the circumferential length of the conductor or the first piezoelectric material. β3 represents an angle (°) between the pivot and the lengthwise direction of the first piezoelectric material.

For example, in a case in which the outer diameter of the conductor and the outer diameter of the first piezoelectric material are similar to each other, the winding number of each of the conductor and the first piezoelectric material per meter is preferably represented by 1000 (mm)×tan β3/(πD) (times) (β3=45°±30°) in Formula, more preferably represented by 1000 (mm)×tan β3/(πD) (times) (β3=45°±25°), still more preferably represented by 1000 (mm)×tan β3/(πD) (times) (β3=45°±20°), and particularly preferably represented by 1000 (mm)×tan β3/(πD) (times) (β3=45°±15°), from the viewpoint of improving piezoelectric sensitivity and the stability of a piezoelectric output.

As a result, the conductor and the first piezoelectric material are strongly brought into intimate contact with each other, and resist cutting in the case of being twisted together. Therefore, both piezoelectricity and mechanical strength can be achieved.

Specifically, in a case in which the outer diameter of the conductor and the outer diameter of the first piezoelectric material are similar to each other, the winding number of each of the conductor and the first piezoelectric material per meter is not particularly limited as long as satisfying Formula. For example, the winding number is preferably from 200 to 2000 times, more preferably from 200 to 1500 times, still more preferably from 200 to 1000 times, and particularly preferably from 200 to 500 times.

The first piezoelectric material in the piezoelectric substrate of the second embodiment preferably has a fiber-like configuration including one or more bundles.

The major axis diameter of a cross section of the first piezoelectric material in the piezoelectric substrate of the second embodiment is preferably from 0.0001 mm to 2 mm, more preferably from 0.001 mm to 1 mm, and still more preferably from 0.002 mm to 0.5 mm, from the viewpoint of improving piezoelectric sensitivity and the stability of a piezoelectric output.

"Major axis diameter of cross section" is synonymous with "major axis diameter of cross section" described above.

A specific aspect D of the piezoelectric substrate according to the second embodiment will now be described with reference to the drawings.

Specific Aspect D

Figure 4:
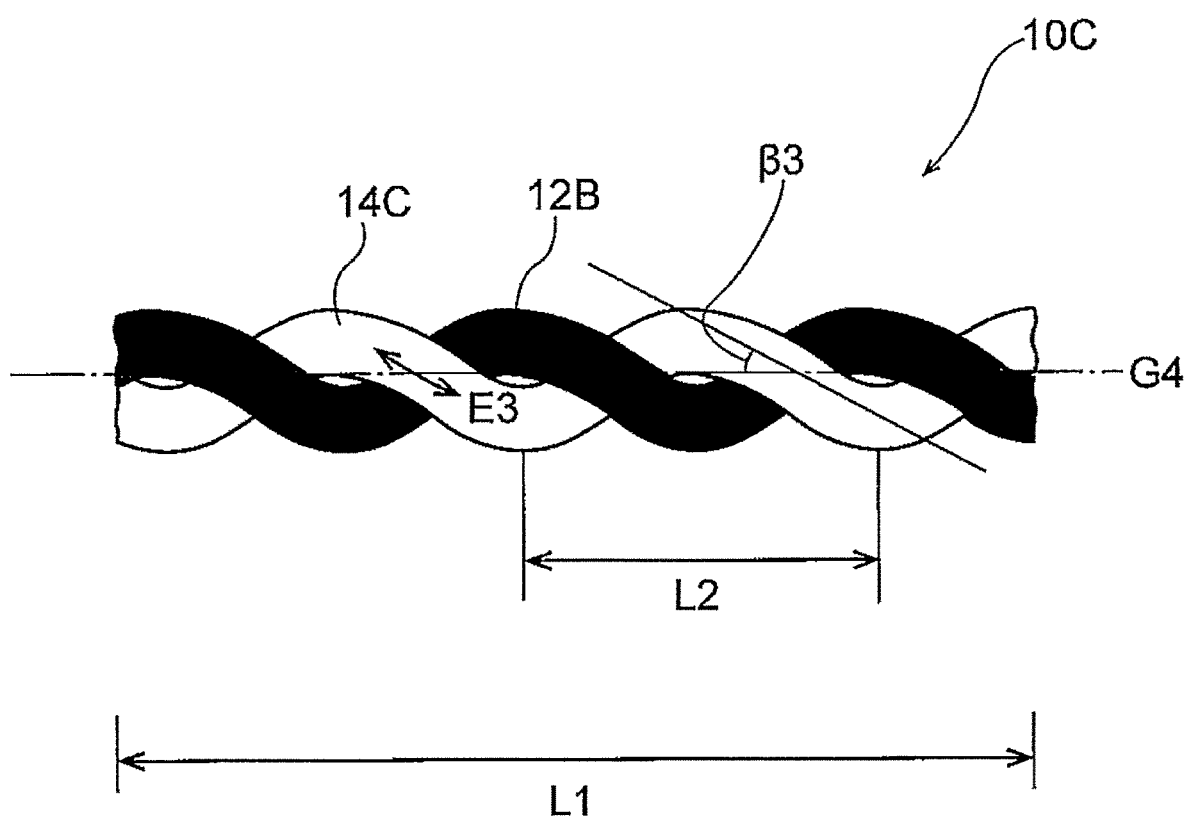
FIG. 4 is a side view illustrating a specific aspect D of a piezoelectric substrate according to a second embodiment.

FIG. 4 is a side view illustrating a specific aspect D of the piezoelectric substrate according to the second embodiment.

In a piezoelectric substrate 10C of the second embodiment, an elongate conductor 12B and an elongate first piezoelectric material 14C are twisted together at the same pivot G4 and the same winding number, as illustrated in FIG. 4. More specifically, the first piezoelectric material 14C is helically wound in a right-handed manner with respect to the pivot G4 in the piezoelectric substrate 10C of the specific aspect D.

Here, "right-handed" means that the first piezoelectric material 14C is wound in a right-handed manner from the front to back sides of the pivot G4 in a case in which the piezoelectric substrate 10C is viewed from a one-end side of the direction of the pivot G4 (a right-end side in the case of FIG. 4).

In FIG. 4, the conductor 12B and the first piezoelectric material 14C are twisted at a winding number of "3". In this case, in FIG. 4, a winding number per the length L1 of the piezoelectric substrate 10C is "3", and the distance between the first piezoelectric materials 14C per winding number (also synonymous with the distance between the conductors 12B) is L2. In FIG. 4, an angle between the pivot G4 and the lengthwise direction of the first piezoelectric material 14C is β3.

In FIG. 4, the principal orientation direction of a helical chiral polymer (A) included in the first piezoelectric material 14C is indicated by both arrows E3. In other words, the principal orientation direction of the helical chiral polymer (A) and the arrangement direction of the first piezoelectric material 14C are substantially parallel to each other.

The action of the piezoelectric substrate 10C according to the second embodiment will be described below.

For example, in the case of applying a tension in the lengthwise direction of the piezoelectric substrate 10C, a shear force is applied to the helical chiral polymer (A) included in the first piezoelectric material 14C, thereby polarizing the helical chiral polymer (A) included in the first piezoelectric material 14C. It is considered that the polarization of the helical chiral polymer (A) occurs in the radial direction of the piezoelectric substrate 10C, and the polarization direction occurs with a uniform phase. As a result, a voltage signal proportional to the tension is effectively detected.

Particularly in the specific aspect D of the second embodiment, the cross-sectional areas of the conductor 12B and the first piezoelectric material 14C can be reduced, whereby the piezoelectric substrate 10C can be thinned. Therefore, it becomes easy to impart high flexibility and suppleness, and suitability for processing a piezoelectric textile, a piezoelectric fabric, or the like, described later, is particularly achieved.

In view of the above, the piezoelectric substrate 10C according to the second embodiment results in excellent piezoelectric sensitivity and in the excellent stability of a piezoelectric output.

Third and fourth embodiments of the piezoelectric substrate according to the invention will be described below.

Piezoelectric Substrate of Third Embodiment and Fourth Embodiment

The configuration of the piezoelectric substrate according to the invention is not limited to a configuration in which a charge (electric field) generated in the case of applying a tension is extracted as a voltage signal, and may be, for example, a configuration in which a charge (electric field) generated in the case of applying a torsional force is extracted as a voltage signal.

As illustrated in FIGS. 17 to 20, the piezoelectric substrate 10E of the third embodiment and the piezoelectric substrate 10F of the fourth embodiment include an elongate inner conductor 12A as a conductor, an elongate first piezoelectric material 14A, and an adhesive layer (not illustrated) arranged between the inner conductor 12A and the first piezoelectric material 14A, and include an outer conductor 13 on the outer surface of the first piezoelectric material 14A. In the piezoelectric substrates 10E and 10F, the first piezoelectric material 14A is helically wound in a principal orientation direction (both arrows E1) around the inner conductor 12A, and the principal orientation direction (both arrows E1) of a helical chiral polymer (A) included in the first piezoelectric material 14A and the arrangement direction of the first piezoelectric material 14A are substantially parallel to each other.

The helical chiral polymer (A) included in the first piezoelectric material 14A in the piezoelectric substrate 10E of the third embodiment is a homopolymer (PLLA) of L-lactic acid, while the helical chiral polymer (A) included in the first piezoelectric material 14A in the piezoelectric substrate 10F of the fourth embodiment is a homopolymer (PDLA) of D-lactic acid. A relationship between a twisting direction and the direction of occurring polarization in the piezoelectric substrate 10E of the third embodiment is illustrated in FIGS. 17 and 18, while a relationship between a twisting direction and the direction of generated polarization in the piezoelectric substrate 10F of the fourth embodiment is illustrated in FIGS. 19 and 20.

Figure 17:
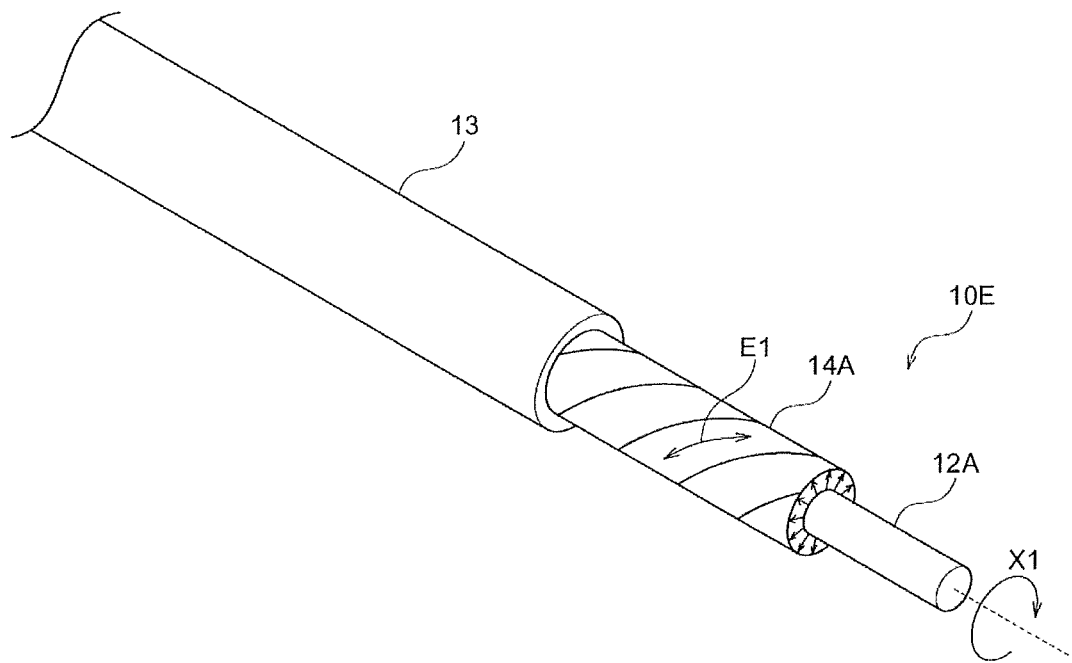
FIG. 17 is a perspective view illustrating a specific aspect E of a piezoelectric substrate according to a third embodiment and illustrating the polarization direction of PLLA in the case of applying a torsional force in the direction of an arrow X1.
Figure 18:
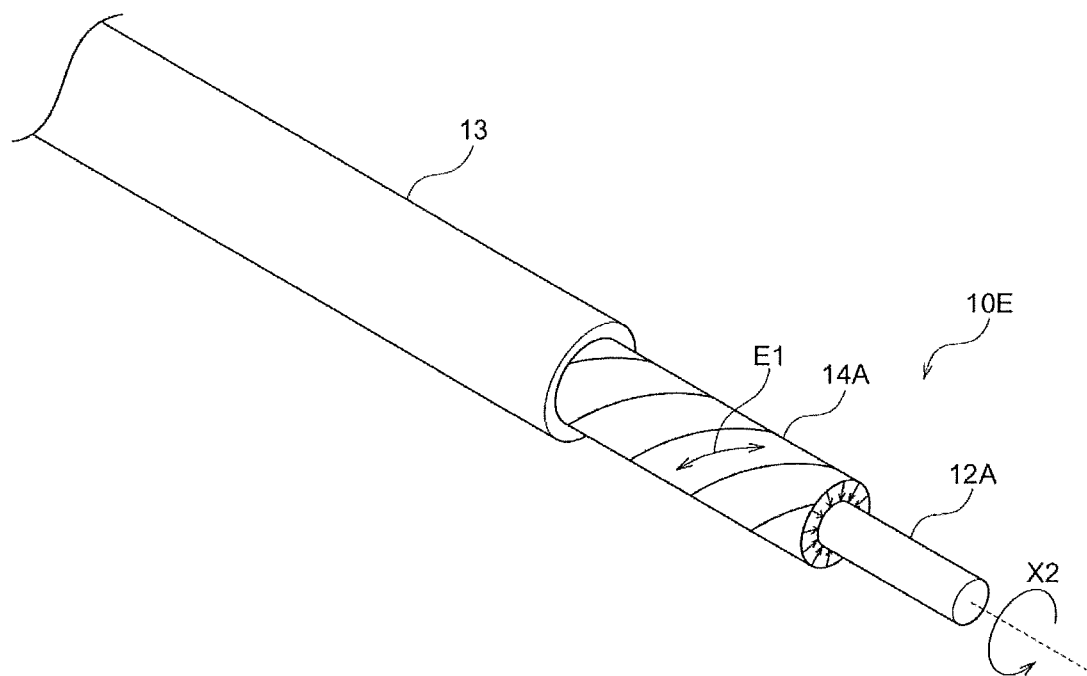
FIG. 18 is a perspective view illustrating the specific aspect E of the piezoelectric substrate according to the third embodiment and illustrating the polarization direction of PLLA in the case of applying a torsional force in the direction of an arrow X2.

In FIG. 17, in the case of applying a torsional force to the piezoelectric substrate 10E in the direction of an arrow X1 around a screw axis as a central axis, a shear stress is applied to the helically wound first piezoelectric material 14A, whereby polarization of PLLA occurs in a direction from the center of a circular cross section toward an outside. In FIG. 18, in the case of applying a torsional force to the piezoelectric substrate 10E in the direction of an arrow X2 opposite to the direction of the arrow X1 around a screw axis as a central axis, a shear stress is applied to the helically wound first piezoelectric material 14A, whereby polarization of PLLA occurs in a direction from the outside of a circular cross section toward a center. Accordingly, a charge (electric field) proportional to the torsional force is generated in the piezoelectric substrate 10E, and the generated charge is detected as a voltage signal (charge signal).

Figure 19:
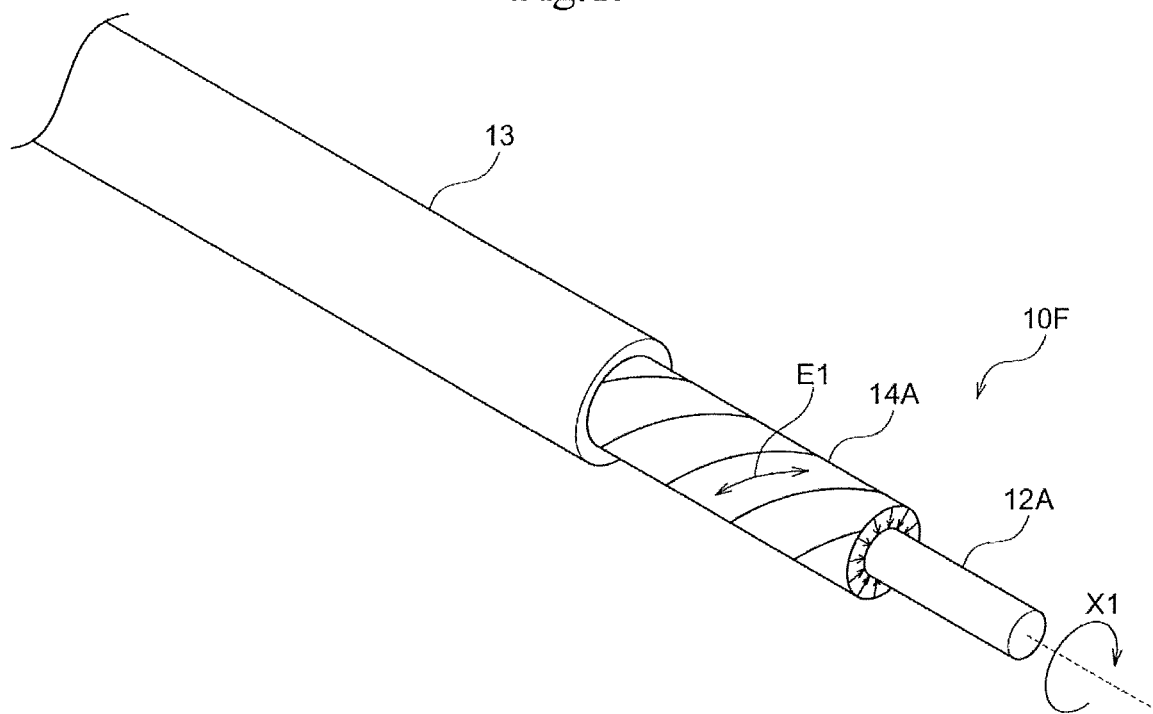
FIG. 19 is a perspective view illustrating a specific aspect F of a piezoelectric substrate according to a fourth embodiment and illustrating the polarization direction of PDLA in the case of applying a torsional force in the direction of an arrow X1.
Figure 20:
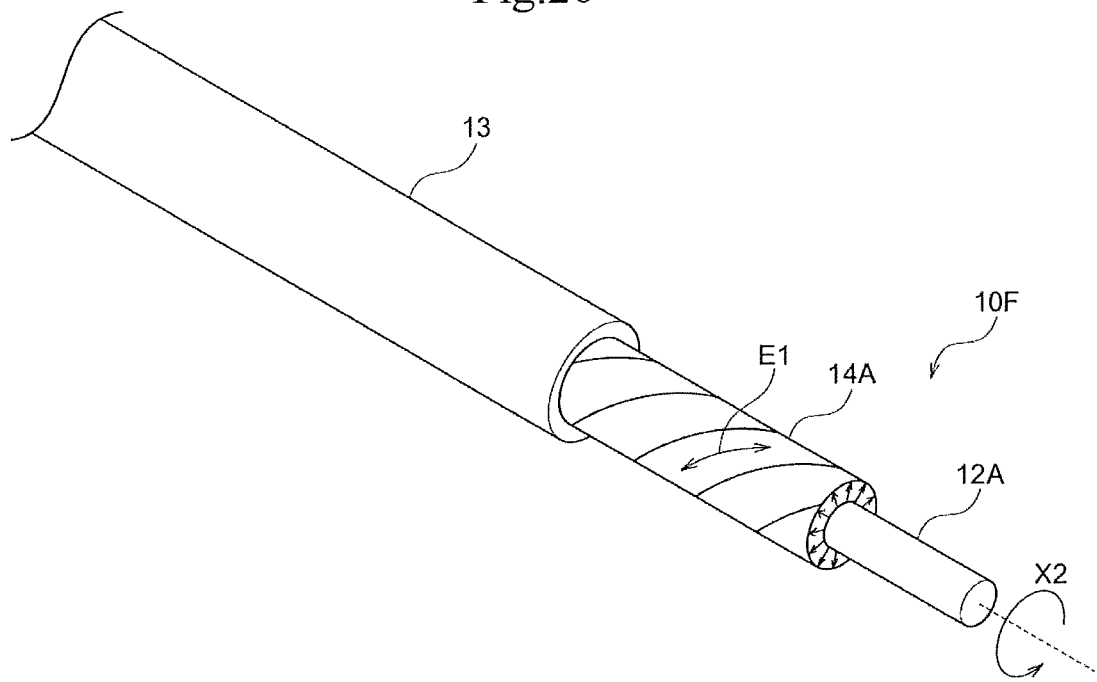
FIG. 20 is a perspective view illustrating the specific aspect F of the piezoelectric substrate according to the fourth embodiment and illustrating the polarization direction of PDLA in the case of applying a torsional force in the direction of an arrow X2.

In FIG. 19, in the case of applying a torsional force to the piezoelectric substrate 10F in the direction of an arrow X1 around a screw axis as a central axis, a shear stress is applied to the helically wound first piezoelectric material 14A, whereby polarization of PDLA occurs in a direction from the outside of a circular cross section toward a center. In FIG. 20, in the case of applying a torsional force to the piezoelectric substrate 10F in the direction of an arrow X2 opposite to the direction of the arrow X1 around a screw axis as a central axis, a shear stress is applied to the helically wound first piezoelectric material 14A, whereby polarization of PDLA occurs in a direction from the center of a circular cross section toward an outside. Accordingly, a charge (electric field) proportional to the torsional force is generated in the piezoelectric substrate 10F, and the generated charge is detected as a voltage signal (charge signal).

The conductor, the first piezoelectric material, and the like included in the piezoelectric substrate of the present embodiment will be described below.

<Conductor>

The piezoelectric substrate of the present embodiment includes an elongate conductor.

The conductor (for example, an inner conductor) in the present embodiment is preferably a signal line conductor.

The signal line conductor refers to a conductor for efficiently detecting an electrical signal from the first piezoelectric material. Specifically, the signal line conductor is a conductor for detecting a voltage signal (charge signal) corresponding to an applied tension in the case of applying the tension to the piezoelectric substrate of the present embodiment.

The conductor is preferably an electrically good conductor. For example, a copper wire, an aluminum wire, an SUS wire, a metal wire coated with an insulating coating, a carbon fiber, a resin fiber integrated with a carbon fiber, a tinsel wire, an organic conductive material, or the like can be used as the conductor. The tinsel wire refers to a wire formed by spirally winding a copper foil around a fiber. Among such conductors, a tinsel wire and a carbon fiber are preferred from the viewpoint of improving piezoelectric sensitivity and the stability of a piezoelectric output and imparting high flexibility.

In particular, a tinsel wire is preferably used in an application having low electrical resistivity and requiring flexibility and pliability (for example, an application such as such a wearable sensor as mounted on the inside of clothing).

A cross section of the copper foil of the tinsel wire preferably has a rectangular wire shape. The copper foil with a cross section having a rectangular wire shape can be produced by, for example, rolling a copper wire or slitting a copper foil to have a small width. Making into such a rectangular wire shape results in reduction in voids from an externally helically wound piezoelectric material, enables an electrode to come in intimate contact with a piezoelectric material, facilitates the detection of a variation in charge generated from the piezoelectric material, and is advantageous in improving sensitivity for a tension.

In the cross section having a rectangular wire shape (preferably, a rectangular cross section), the ratio of a width to a thickness is preferably 2 or more.

In a case in which the copper foil is helically wound around a fiber, the copper foil falls within the deformation of an elastic deformation region in flexural deformation and is resistant to plastic deformation, and therefore, metal fatigue breakage is inhibited, whereby repeated bending resistance can be significantly improved.

The fiber around which the copper foil is wound is located in the center of the tinsel wire. Therefore, the fiber has a function as a structural material that supports a tension, and a tension and a strain amount can be designed to have desired values by selecting the material, cross-sectional area, and the like of the fiber, if appropriate. The use of the copper foil with a cross section having a rectangular wire shape results in inhibition of plastic deformation in flexural deformation in bending and in improvement in repeated bending resistance in comparison with the use of a copper wire with a circular cross section.

A carbon fiber is preferably used in a processing application such as a textile or a fabric demanding very high flexibility and suppleness (for example, a piezoelectric textile, a piezoelectric fabric, or a piezoelectric sensor (a textile-like piezoelectric sensor or a fabric-like piezoelectric sensor)).

In a case in which the piezoelectric substrate of the present embodiment is used as a fiber and processed into a piezoelectric textile or a piezoelectric fabric, suppleness and high flexibility are demanded. A yarn-shaped or fibrous signal line conductor is preferred in such an application. A piezoelectric substrate including the yarn-shaped or fibrous signal line conductor has high flexibility, and is therefore preferably subjected to processing with a weaving machine or a knitting machine.

<First Piezoelectric Material>

The piezoelectric substrate of the present embodiment includes the elongate first piezoelectric material.

The first piezoelectric material is a piezoelectric material including an optically active helical chiral polymer (A).

(Helical Chiral Polymer (A))

The first piezoelectric material in the present embodiment includes an optically active helical chiral polymer (A).

Here, "optically active helical chiral polymer" refers to a polymer of which the molecular structure is a helical structure, and which has a molecular optical activity.

Examples of the helical chiral polymer (A) include polypeptides, cellulose derivatives, polylactic acid polymers, polypropylene oxide, and poly(β-hydroxybutyric acid).

Examples of the polypeptides include poly(glutaric acid γ-benzyl) and poly(glutaric acid γ-methyl).

Examples of the cellulose derivatives include cellulose acetate and cyanoethyl cellulose.

The helical chiral polymer (A) preferably has an optical purity of 95.00% ee or more, more preferably 96.00% ee or more, still more preferably 99.00% ee or more, and even more preferably 99.99% ee or more, from the viewpoint of improving the piezoelectricity of the first piezoelectric material. The helical chiral polymer (A) desirably has an optical purity of 100.00% ee. Setting of the optical purity of the helical chiral polymer (A) in the above range is considered to result in improvement in a packing property of a polymer crystal exhibiting piezoelectricity and to consequently result in improvement in piezoelectricity.

Here, the optical purity of the helical chiral polymer (A) is a value calculated by the following Formula.

$$\text{Optical purity } (\% \ ee) = 100 \times |L\text{-form amount} - D\text{-form amount}| / (L\text{-form amount} + D\text{-form amount})$$

In other words, the optical purity of the helical chiral polymer (A) is a value obtained by multiplying (multiplying) "a numerical value obtained by dividing (dividing) 'the amount of difference (absolute value) between the amount [% by mass] of helical chiral polymer (A) in L-form and the amount [% by mass] of helical chiral polymer (A) in D-form' by 'the total amount of the amount [% by mass] of helical chiral polymer (A) in L-form and the amount [% by mass] of helical chiral polymer (A) in D-form'" by "100."

For the amount [% by mass] of helical chiral polymer (A) in L-form and the amount [% by mass] of helical chiral polymer (A) in D-form, values obtained by a method using a high performance liquid chromatography (HPLC) are used. The details of specific measurement will be described later.

A polymer having a main chain including a repeating unit represented by the following Formula (1) is preferred as the helical chiral polymer (A) from the viewpoint of increasing the optical purity and improving the piezoelectricity.

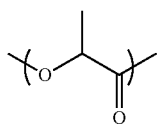

(1)

Examples of the polymer having a main chain including a repeating unit represented by the above Formula (1) include a polylactic acid polymer.

Here, the polylactic acid polymer refers to "polylactic acid (a polymer consisting of a repeating unit derived from a monomer selected from L-lactic acid or D-lactic acid)", "a copolymer of L-lactic acid or D-lactic acid and a compound copolymerizable with the L-lactic acid or D-lactic acid", or a mixture thereof.

Among such polylactic acid polymers, polylactic acid is preferred, and a homopolymer (PLLA, also simply referred to as "L-form") of L-lactic acid or a homopolymer (PDLA, also simply referred to as "D-form") of D-lactic acid is most preferred.

Polylactic acid is a long polymer which is obtained by polymerizing lactic acid by ester bond to be connected with each other.

Polylactic acid is known to be produced by: a lactide method involving lactide; a direct polymerization method in which lactic acid is heated in a solvent under a reduced pressure to be polymerized while removing water; or the like.

Examples of the polylactic acid include a homopolymer of L-lactic acid, a homopolymer of D-lactic acid, a block copolymer including a polymer of at least one of L-lactic acid or D-lactic acid, or a graft copolymer including a polymer of at least one of L-lactic acid or D-lactic acid.

Examples of the "compound copolymerizable with L-lactic acid or D-lactic acid" include: a hydroxycarboxylic acid such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethyl caproic acid, or mandelic acid; a cyclic ester such as glycolide, β-methyl-δ-valerolactone, γ-valerolactone, or ε-caprolactone; a polycarboxylic acid such as oxalic acid, malonic acid, succinic acid, glutaric acid, adipic acid, pimelic acid, azelaic acid, sebacic acid, undecanedioic acid, dodecanedioic acid, or terephthalic acid, or an anhydride thereof; a polyalcohol such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentyl glycol, tetramethylene glycol, or 1,4-hexanedimethanol; a polysaccharide such as cellulose; or an aminocarboxylic acid such as α-amino acid.

Examples of the "copolymer of L-lactic acid or D-lactic acid and a compound copolymerizable with the L-lactic acid or the D-lactic acid" include a block copolymer or a graft copolymer having a polylactic acid sequence which can form a helical crystal.

The concentration of a structure derived from a copolymer component in the helical chiral polymer (A) is preferably 20 mol % or less.

For example, in a case in which the helical chiral polymer (A) is a polylactic acid polymer, with respect to the total number of moles of a structure derived from lactic acid and a structure derived from a compound copolymerizable with lactic acid (copolymer component) in the polylactic acid polymer, the concentration of the structure derived from the copolymer component is preferably 20 mol % or less.

The polylactic acid polymer can be produced, for example, by a method of obtaining the polymer by direct dehydration condensation of lactic acid, described in JP-A No. S59-096123 and JP-A No. H7-033861; a method of obtaining the polymer by ring-opening polymerization of lactide which is a cyclic dimer of lactic acid, described in U.S. Pat. Nos. 2,668,182 and 4,057,357; or the like.

In order to allow the polylactic acid polymer obtained by any of the above production methods to have an optical purity of 95.00% ee or more, lactide of which the optical purity is improved to an optical purity of 95.00% ee or more by a crystallization operation is preferably polymerized, for example, in a case in which a polylactic acid is produced by a lactide method.

—Weight Average Molecular Weight—

The weight average molecular weight (Mw) of the helical chiral polymer (A) is preferably from 50,000 to 1,000,000.

In a case in which the Mw of the helical chiral polymer (A) is 50,000 or more, the mechanical strength of the first piezoelectric material is improved. The above Mw is preferably 100,000 or more, and still more preferably 200,000 or more.

In a case in which the Mw of the helical chiral polymer (A) is 1,000,000 or less, moldability is improved in the case of obtaining the first piezoelectric material by molding (for example, extrusion molding or melt spinning). The Mw is preferably 800,000 or less, and still more preferably 300,000 or less.

From the viewpoint of improving the strength of the first piezoelectric material, the molecular weight distribution (Mw/Mn) of the helical chiral polymer (A) is preferably from 1.1 to 5, more preferably from 1.2 to 4, and still more preferably from 1.4 to 3.

The weight average molecular weight (Mw) and the molecular weight distribution (Mw/Mn) of the helical chiral polymer (A) refer to values measured using a gel permeation chromatograph (GPC). Here, Mn is the number-average molecular weight of the helical chiral polymer (A).

An example of a method of measuring Mw and Mw/Mn of the helical chiral polymer (A) by GPC will be described below.

—GPC Measurement Apparatus—

GPC-100, manufactured by Waters Corp.

—Column—

SHODEX LF-804, manufactured by Showa Denko K.K.

—Preparation of Sample—

The first piezoelectric material is dissolved in a solvent (for example, chloroform) at 40° C. to prepare a sample solution having a concentration of 1 mg/mL.

—Measurement Conditions—

Into a column, 0.1 mL of the sample solution is introduced at a temperature of 40° C. and a flow rate of 1 mL/min by using chloroform as a solvent.

The concentration of the sample in the sample solution separated by the column is measured by a differential refractometer.

A universal calibration curve is created based on a polystyrene standard sample. The weight average molecular weight (Mw) and the molecular weight distribution (Mw/Mn) of the helical chiral polymer (A) are calculated.

A commercially available polylactic acid may be used as the polylactic acid polymer which is an example of the helical chiral polymer (A).

Examples of the commercially available product include PURASORB (PD, PL) manufactured by PURAC Inc., LACEA (H-100, H-400) manufactured by Mitsui Chemical Inc., and INGEO™ BIOPOLYMER manufactured by NatureWorks LLC.

In a case in which a polylactic acid polymer is used as the helical chiral polymer (A), it is preferable to produce the polylactic acid polymer by a lactide method or a direct polymerization method in order to set the weight average molecular weight (Mw) of the polylactic acid polymer at 50,000 or more.

The first piezoelectric material in the present embodiment may contain only one kind of such a helical chiral polymer (A) as described above, or may contain two or more kinds thereof.

The content (total content in the case of two or more kinds) of the helical chiral polymer (A) in the first piezoelectric material in the present embodiment is preferably 80% by mass or more with respect to the total amount of the first piezoelectric material.

<Stabilizer>

The first piezoelectric material preferably further includes a stabilizer (B) which has one or more kinds of functional group selected from the group consisting of a carbodiimide group, an epoxy group, and an isocyanate group in one molecule and has a weight average molecular weight of from 200 to 60,000. As a result, moist heat resistance can be further improved.

As the stabilizer (B), "stabilizer (B)" described in the paragraphs 0039 to 0055 of WO 2013/054918 can be used.

Examples of the compound including a carbodiimide group in one molecule (carbodiimide compound), which can be used as the stabilizer (B), include a monocarbodiimide compound, a polycarbodiimide compound, or a cyclic carbodiimide compound.

Preferred examples of the monocarbodiimide compound include dicyclohexylcarbodiimide and bis-2,6-diisopropylphenylcarbodiimide.

Polycarbodiimide compounds produced by various methods can be used as such polycarbodiimide compounds. Polycarbodiimide compounds produced by conventional methods of producing a polycarbodiimide (for example, U.S. Pat. No. 2,941,956, Japanese Patent Publication (JP-B) No. 47-33279, J. Org. Chem. 28, 2069-2075 (1963), Chemical Review 1981, Vol. 81 No. 4, p 619-621) can be used. Specifically, a carbodiimide compound described in Japanese Patent No. 4084953 can also be used.

Examples of the polycarbodiimide compound include poly(4,4'-dicyclohexylmethanecarbodiimide), poly(N,N'-di-2,6-diisopropylphenylcarbodiimide), and poly(1,3,5-triisopropylphenylene-2,4-carbodiimide).

The cyclic carbodiimide compound can be synthesized based on, for example, a method described in JP-A No. 2011-256337.

As the carbodiimide compound, a commercially available product may be used. Examples thereof include B2756 (trade name) manufactured by Tokyo Chemical Industry Co., Ltd., CARBODILITE LA-1 (trade name) manufactured by Nisshinbo Chemical Inc., and STABAXOL P, STABAXOL P400, and STABAXOL I (of which each is a trade name) manufactured by Rhein Chemie Rheinau.

Examples of a compound (isocyanate compound) which can be used as the stabilizer (B) and includes an isocyanate group in one molecule include 3-(triethoxysilyl)propyl isocyanate, 2,4-tolylene diisocyanate, 2,6-tolylene diisocyanate, m-phenylene diisocyanate, p-phenylene diisocyanate, 4,4'-diphenylmethane diisocyanate, 2,4'-diphenylmethane diisocyanate, 2,2'-diphenylmethane diisocyanate, xylylene diisocyanate, hydrogenated xylylene diisocyanate, and isophorone diisocyanate.

Examples of a compound (epoxy compounds) which can be used as the stabilizer (B) and includes an epoxy group in one molecule include phenylglycidyl ether, diethylene glycol diglycidyl ether, bisphenol-A-diglycidyl ether, hydrogenated bisphenol-A-diglycidyl ether, phenol novolac type epoxy resin, cresol novolac type epoxy resin, and epoxidized polybutadiene.

The weight average molecular weight of the stabilizer (B) is from 200 to 60,000 as described above, more preferably from 200 to 30,000, and still more preferably from 300 to 18,000.

In a case in which the molecular weight is within the above range, the stabilizer (B) more easily moves, and a moist heat resistance improvement effect is more effectively exhibited.

The weight average molecular weight of the stabilizer (B) is particularly preferably from 200 to 900. A weight average molecular weight of from 200 to 900 is approximately equivalent to a number-average molecular weight of from 200 to 900. In the case of a weight average molecular weight of from 200 to 900, a molecular weight distribution may be 1.0. In this case, "weight average molecular weight of from 200 to 900" may also be simply referred to as "molecular weight of from 200 to 900."

In a case in which the first piezoelectric material contains the stabilizer (B), the first piezoelectric material may contain only one kind of a stabilizer, or may contain two or more kinds thereof.

In a case in which the first piezoelectric material includes the stabilizer (B), the content of the stabilizer (B) is preferably from 0.01 part by mass to 10 parts by mass, more preferably from 0.01 part by mass to 5 parts by mass, still more preferably from 0.1 part by mass to 3 parts by mass, and particularly preferably from 0.5 part by mass to 2 parts by mass, with respect to 100 parts by mass of the helical chiral polymer (A).

In a case in which the above content is 0.01 part by mass or more, moist heat resistance is further improved.

In a case in which the above content is 10 parts by mass or less, the deterioration of transparency is further suppressed.

Examples of a preferred aspect of the stabilizer (B) include an aspect in which a stabilizer (B1) that has one or more kinds of functional group selected from the group consisting of a carbodiimide group, an epoxy group, and an isocyanate group and has a number-average molecular weight of from 200 to 900, and a stabilizer (B2) that has, in one molecule, two or more functional groups, which are one or more kinds of functional group selected from the group consisting of a carbodiimide group, an epoxy group, and an isocyanate group, and has a weight average molecular weight of from 1000 to 60,000 are combined. The weight average molecular weight of the stabilizer (B1) having a number-average molecular weight of from 200 to 900 is approximately from 200 to 900. The number-average molecular weight and the weight average molecular weight of the stabilizer (B1) are values which are almost the same as each other.

In a case in which the stabilizer (B1) and the stabilizer (B2) are combined as the stabilizer, it is preferable to include a larger amount of stabilizer (B1) from the viewpoint of improving transparency.

Specifically, with respect to 100 parts by mass of the stabilizer (B1), the amount of stabilizer (B2) is preferably in a range of from 10 parts by mass to 150 parts by mass from the viewpoint of achieving both transparency and moist heat resistance, and more preferably in a range of from 50 parts by mass to 100 parts by mass.

Specific examples (stabilizers B-1 to B-3) of the stabilizer (B) are described below.

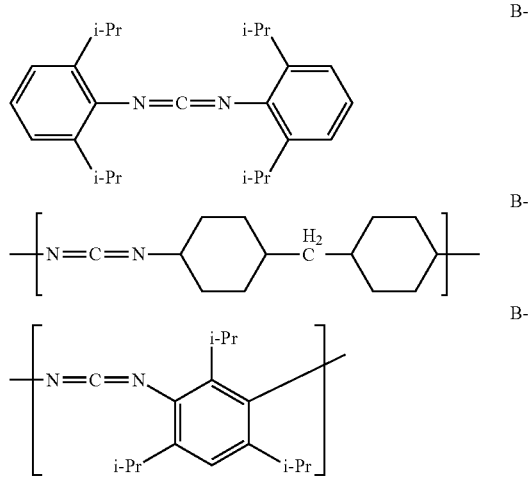

The compound names, commercially available products, and the like of the stabilizers B-1 to B-3 will be described below.

Stabilizer B-1: The compound names thereof is bis-2,6-diisopropylphenylcarbodiimide. The weight average molecular weight thereof (which is equal to mere "molecular weight" in this example) is 363. Examples of the commercially available products thereof include "STABAXOL I" manufactured by Rhein Chemie Rheinau, and "B2756" manufactured by Tokyo Chemical Industry Co., Ltd.

Stabilizer B-2: The compound name thereof is poly(4,4'-dicyclohexylmethanecarbodiimide). Examples of the commercially available products thereof include "CARBODIL-ITE LA-1" manufactured by Nisshinbo Chemical Inc., as a product having a weight average molecular weight of about 2,000.

Stabilizer B-3: The compound name thereof is poly(1,3,5-triisopropylphenylene-2,4-carbodiimide). Examples of the commercially available products thereof include "STABAXOL P" manufactured by Rhein Chemie Rheinau, as a product having a weight average molecular weight of about 3,000, and "STABAXOL P400" manufactured by Rhein Chemie Rheinau, as a product having a weight average molecular weight of 20,000.

<Other Components>

The first piezoelectric material may include another component, if necessary.

Examples of such other components include: known resins such as polyvinylidene fluoride, a polyethylene resin, and a polystyrene resin; known inorganic fillers such as silica, hydroxyapatite, and montmorillonite; known crystal nucleating agents such as phthalocyanine; and stabilizers other than the stabilizer (B).

Examples of the inorganic fillers and the crystal nucleating agents include components described in the paragraphs 0057 to 0058 of WO 2013/054918.

(Orientation Degree F.)

The orientation degree F. of the first piezoelectric material in the present embodiment is from 0.5 to less than 1.0 as described above, preferably from 0.7 to less than 1.0, and more preferably from 0.8 to less than 1.0.

In a case in which the orientation degree F. of the first piezoelectric material is 0.5 or more, the number of the molecular chains of the helical chiral polymer (A) arranged in a stretching direction (for example, the molecular chains of polylactic acid) is large, whereby the rate of generation of oriented crystals becomes high, and higher piezoelectricity can be exhibited.

In a case in which the orientation degree F. of the first piezoelectric material is less than 1.0, longitudinal cleavage strength is further improved.

(Degree of Crystallinity)

The degree of the crystallinity of the first piezoelectric material in the present embodiment is a value measured by the X-ray diffraction measurement (wide-angle x-ray diffraction measurement) described above.

The degree of crystallinity of the first piezoelectric material in the present embodiment is preferably from 20% to 80%, more preferably from 25% to 70%, and still more preferably from 30% to 60%.

In a case in which the degree of crystallinity is 20% or more, piezoelectricity is highly maintained. In a case in which the degree of crystallinity is 80% or less, the transparency of the first piezoelectric material is highly maintained.

In a case in which the degree of crystallinity is 80% or less, the first piezoelectric material can be easily produced because whitening or breaking is less likely to occur, for example, in a case in which a piezoelectric film which is the raw material of the first piezoelectric material is produced by stretching. In a case in which the degree of crystallinity is 80% or less, a fiber with high flexibility and suppleness is made, for example, in the case of producing the raw material (for example, polylactic acid) of the first piezoelectric material by stretching after melt spinning, and the first piezoelectric material can be easily produced.

(Transparency (Internal Haze))

The first piezoelectric material in the present embodiment does not particularly require transparency, and, as a matter of course, may have transparency.

The transparency of the first piezoelectric material can be evaluated by measuring an internal haze. Here, the internal haze of the first piezoelectric material refers to a haze obtained by excluding a haze caused by the shape of the outer surface of the first piezoelectric material.

In the case of requiring transparency, the first piezoelectric material preferably has an internal haze for visible light of 5% or less, and more preferably 2.0% or less, and still more preferably 1.0% or less, from the viewpoint of further improving transparency and longitudinal cleavage strength. The lower limit value of the internal haze of the first piezoelectric material is not particularly limited. Examples of the lower limit value include 0.01%.

The internal haze of the first piezoelectric material is a value measured for a first piezoelectric material having a thickness of from 0.03 mm to 0.05 mm at 25° C. in accordance with JIS-K7105 by using a haze measuring machine [TC-HIII DPK, manufactured by Tokyo Denshoku Co., Ltd.].

An example of a method of measuring the internal haze of the first piezoelectric material will be described below.

First, a sample 1 in which only a silicone oil (SHIN-ETSU SILICONE (trademark), model number: KF96-100CS, manufactured by Shin-Etsu Chemical Co., Ltd.) is sandwiched between two glass sheets is prepared, and the haze (hereinafter referred to as "haze (H2)") of the sample 1 in a thickness direction is measured.

Then, a sample 2 in which plural first piezoelectric materials of which the surfaces are uniformly coated with silicone oil are arranged and sandwiched without any gap between the two glass sheets is prepared, and the haze (hereinafter referred to as "haze (H3)") of the sample 2 in a thickness direction is measured.

Then, the internal haze (H1) of the first piezoelectric material is obtained by performing a subtraction between the hazes in such a manner as described in the following Formula.

$$\text{Internal haze } (H1) = \text{haze } (H3) - \text{haze } (H2)$$

Here, each of the haze (H2) and the haze (H3) is measured using the following apparatus under the following measurement conditions.

Measurement apparatus: HAZE METER TC-HIIIDPK, manufactured by Tokyo Denshoku Co., Ltd.
 Sample size: 30 mm in width×30 mm in length
 Measurement conditions: based on JIS-K7105
 Measurement temperature: room temperature (25° C.)
 (Shape and Dimension of First Piezoelectric Material)

The piezoelectric substrate of the present embodiment includes the elongate first piezoelectric material.

The elongate first piezoelectric material is preferably a piezoelectric material having a fiber-like configuration (yarn shape) including one or more bundles or a piezoelectric material having an elongate flat plate shape.

The piezoelectric material having a fiber-like configuration (hereinafter also referred to as "fibrous piezoelectric material") and a piezoelectric material having an elongate flat plate shape (hereinafter also referred to as "elongate-flat-plate-shaped piezoelectric material") will be described step by step below.

—Fibrous Piezoelectric Material—

Examples of the fibrous piezoelectric material include monofilament yarn and multifilament yarn.

Monofilament Yarn

The monofilament yarn preferably has a single yarn fineness of from 3 dtex to 30 dtex, and more preferably from 5 dtex to 20 dtex.

In a case in which the single yarn fineness is less than 3 dtex, it is difficult to handle the yarn in a textile preparation step or a weaving step. In a case in which the single yarn fineness is more than 30 dtex, fusion between such yarns easily occurs.

It is preferable to obtain the monofilament yarn by direct spinning and stretching in consideration of a cost. The monofilament yarn may be obtained yarn.

Multifilament Yarn

The multifilament yarn preferably has a total fineness of from 30 dtex to 600 dtex, and more preferably from 100 dtex to 400 dtex.

For example, any of one-step yarn such as spin-draw yarn, or two-step yarn obtained by stretching UDY (undrawn yarn), POY (high orientation undrawn yarn), or the like can be adopted as the multifilament yarn. The multifilament yarn may be obtained yarn.

ECODEAR® PLA manufactured by Toray Industries, Inc., TERRAMAC® manufactured by Unitika Ltd., and PLASTARCH® manufactured by KURARAY CO., LTD. can be used as the commercially available products of polylactic acid monofilament yarn and polylactic acid multifilament yarn.

A method of producing the fibrous piezoelectric material is not particularly limited, and can be produced by a known method.

For example, filament yarn (monofilament yarn or multifilament yarn) as the first piezoelectric material can be obtained by melt-spinning a raw material (for example, polylactic acid) and stretching the material (melt-spinning stretching method). After the spinning, the ambient temperature of the vicinity of a line of yarn before cooling and solidification is preferably maintained in a certain temperature range.

The filament yarn as the first piezoelectric material may be obtained, for example, by further separating a fiber from the filament yarn obtained by the melt-spinning stretching method.

Cross-Sectional Shape

For the cross-sectional shape of the fibrous piezoelectric material, various cross-sectional shapes such as a circular shape, an oval shape, a rectangular shape, a cocoon shape, a ribbon shape, a four-leafed shape, a star shape, and an abnormal shape can be applied in a cross section in the direction vertical to the longitudinal direction of the fibrous piezoelectric material.

—Elongate-Flat-Plate-Shaped Piezoelectric Material—

Examples of the elongate-flat-plate-shaped piezoelectric material include an elongate-flat-plate-shaped piezoelectric material (for example, a slit ribbon) obtained by slitting a piezoelectric film produced by a known method or an obtained piezoelectric film.

Use of the elongate-flat-plate-shaped piezoelectric material as the first piezoelectric material enables intimate contact with the conductor on the basis of a plane, and therefore enables a charge generated by a piezoelectric effect to be efficiently detected as a voltage signal.

The elongate-flat-plate-shaped piezoelectric material (first piezoelectric material) in the present embodiment preferably includes a functional layer arranged on at least one principal plane of the first piezoelectric material.

The functional layer may have a single-layer structure or may be a structure including two or more layers.

For example, in a case in which functional layers are arranged on both principal planes of the elongate-flat-plate-shaped piezoelectric material, a functional layer arranged on one principal plane (hereinafter referred to as "front plane" for convenience) and a functional layer arranged on the other plane (hereinafter referred to as "back plane" for convenience) may independently have a single-layer structure or a structure including two or more layers.

Examples of the functional layer include various functional layers.

Examples of the functional layer include an easily adhesive layer, a hard coat layer, a refractive index adjusting layer, an antireflection layer, an antiglare layer, an easily slippable layer, an antiblock layer, a protective layer, an adhesive layer, an antistatic layer, a heat dissipation layer, an ultraviolet absorbing layer, an anti-Newton ring layer, a light scattering layer, a polarizing layer, a gas barrier layer, a hue adjusting layer, or an electrode layer.

The functional layer may be a layer including two or more layers of such layers.

The functional layer may be a layer having two or more of such functions.

In a case in which the functional layers are disposed on both principal planes of the elongate-flat-plate-shaped piezoelectric material, the functional layer arranged on the front plane and the functional layer arranged on the back plane may be the same functional layer or different functional layers.

Examples of the effects of the functional layer include the effect of covering a defect such as a die line or a dent on a surface of the elongate-flat-plate-shaped piezoelectric material to improve appearance. In such a case, with decreasing the difference between the refractive indices of the elongate-flat-plate-shaped piezoelectric material and the functional layer, a reflection on an interface between the elongate-flat-plate-shaped piezoelectric material and the functional layer is reduced, thereby further improving appearance.

The functional layer preferably includes at least one of an easily adhesive layer, a hard coat layer, an antistatic layer, an antiblock layer, a protective layer, or an electrode layer. As a result, for example, an application to a piezoelectric device (such as a piezoelectric textile or a piezoelectric fabric), a force sensor, an actuator, or a biological information acquisition device is further facilitated.

The functional layer more preferably includes an electrode layer.

The electrode layer may be disposed in contact with the elongate-flat-plate-shaped piezoelectric material, or may be disposed via a functional layer other than the electrode layer.

A particularly preferred aspect of the elongate-flat-plate-shaped piezoelectric material (first piezoelectric material) in the present embodiment is as aspect in which both principal planes of the elongate-flat-plate-shaped piezoelectric material are provided with functional layers, and both the functional layers on both planes include electrode layers.

In the elongate-flat-plate-shaped piezoelectric material (first piezoelectric material) in the present embodiment, at least one surface layer of a layered body including the first piezoelectric material and the functional layer is preferably an electrode layer. In other words, it is preferable that at least one of the surface layer of the front plane or the surface layer of the back plane is an electrode layer (i.e., the electrode layer is exposed) in the elongate-flat-plate-shaped piezoelectric material (first piezoelectric material) in the present embodiment.

As a result, in a case in which the elongate-flat-plate-shaped piezoelectric material is used as one of the components of, for example, a piezoelectric device (such as a piezoelectric textile or a piezoelectric fabric), a force sensor, an actuator, or a biological information acquisition device, connection between the conductor (preferably, an inner conductor) or the first outer conductor and the layered body can be more easily performed, and therefore, the productivity of the piezoelectric device (such as a piezoelectric textile or a piezoelectric fabric), the force sensor, the actuator, or the biological information acquisition device is improved.

Examples of the material of the functional layer include, but are not particularly limited to, an inorganic substance such as a metal or a metal oxide; an organic substance such as a resin; or a composite composition including a resin and fine particles. For example, a cured product obtained by curing by temperature or active energy rays can be used as the resin. In other words, a curable resin can be used as the resin.

Examples of the curable resin include at least one material (curable resin) selected from the group consisting of, for example, an acrylic compound, a methacrylic compound, a vinyl compound, an allyl compound, a urethane compound, an epoxy compound, an epoxide compound, a glycidyl compound, an oxetane compound, a melamine compound, a cellulose compound, an ester compound, a silane compound, a silicone compound, a siloxane compound, a silica-acryl hybrid compound, and a silica-epoxy hybrid compound.

Among these, an acrylic compound, an epoxy compound, and a silane compound are more preferred.

Examples of the metal include at least one selected from Al, Si, Ti, V, Cr, Fe, Co, Ni, Cu, Zn, In, Sn, W, Ag, Au, Pd, Pt, Sb, Ta, or Zr, or an alloy thereof.

Examples of the metal oxide include titanium oxide, zirconium oxide, zinc oxide, niobium oxide, antimony oxide, tin oxide, indium oxide, cerium oxide, aluminum oxide, silicon oxide, magnesium oxide, yttrium oxide, ytterbium oxide, or tantalum oxide, or at least one of composite oxides thereof.

Examples of the fine particles include: fine particles of such metal oxides as described above; resin fine particles of a fluorine resin, a silicone resin, a styrenic resin, an acrylic resin, or the like; or hollow fine particles having a vacancy in the fine particles.

The average primary particle diameter of the fine particles is preferably from 1 nm to 500 nm, more preferably from 5 nm to 300 nm, and still more preferably from 10 nm to 200 nm, from the viewpoint of transparency. An average primary particle diameter of 500 nm or less results in suppression of scattering of visible light, while an average primary particle diameter of 1 nm or more results in suppression of the secondary aggregation of the fine particles, which is desirable from the viewpoint of maintaining transparency.

The film thickness of the functional layer is not particularly limited, and is preferably in a range of from 0.01 μm to 10 μm.

The upper limit value of the above thickness is more preferably 6 μm or less, and still more preferably 3 μm or less. The lower limit value thereof is more preferably 0.01 μm or more, and still more preferably 0.02 μm or more.

In a case in which the functional layer is a multilayer film including plural functional layers, the above thickness represents the thickness of the entire multilayer film. Such functional layers may be on both planes of the elongate-flat-plate-shaped piezoelectric material. The refractive indices of the functional layers may be values different from each other.

A method of producing the elongate-flat-plate-shaped piezoelectric material is not particularly limited. The elongate-flat-plate-shaped piezoelectric material can be produced by a known method.

For example, in a method of producing a first piezoelectric material from a piezoelectric film, the first piezoelectric material can be obtained by molding a raw material (for example, polylactic acid) into a film shape to obtain an unstretched film, stretching and crystallizing the obtained unstretched film, and slitting the obtained piezoelectric film.

The first piezoelectric material may be produced using a known flat yarn production method. For example, the first piezoelectric material can be obtained by slitting a wide film obtained by inflation molding to make a narrow film, stretching the film by hot-plate stretching, roll stretching, or the like, and crystallizing the film.

The first piezoelectric material can also be obtained by stretching and crystallizing a flat monofilament produced by melt spinning using a die having a known abnormal cross section, preferably a flat monofilament of which the ratio of a width to a thickness in a cross-sectional shape is 2 or more.

Here, "slitting" means that the piezoelectric film is cut into an elongate shape.

Either the stretching or the crystallization may be performed first. A method in which the unstretched film is subjected in turn to preliminary crystallization, stretching, and crystallization (annealing) is also acceptable. The stretching may be monoaxial stretching or biaxial stretching. In the case of the biaxial stretching, the stretching rate of one (principal stretching direction) is preferably set to a higher level.

The method for producing the piezoelectric film may be performed with reference to known literature such as Japanese Patent No. 4934235, WO 2010/104196, WO 2013/054918, and WO 2013/089148, if appropriate.

<Second Piezoelectric Material>

The piezoelectric substrate of the first embodiment may include an elongate second piezoelectric material.

The second piezoelectric material preferably has characteristics similar to the characteristics of the first piezoelectric material.

In other words, it is preferable that: the second piezoelectric material includes an optically active helical chiral polymer (A);

the lengthwise direction of the second piezoelectric material and the principal orientation direction of the helical chiral polymer (A) included in the second piezoelectric material are substantially parallel to each other; and the orientation degree F. of the second piezoelectric material, determined from X-ray diffraction measurement by the above Formula (a), is in a range of from 0.5 to less than 1.0.

With regard to the other characteristics than the above, the second piezoelectric material preferably has characteristics similar to the characteristics of the first piezoelectric material.

However, the winding directions of the first piezoelectric material and the second piezoelectric material, and the chiralities of the helical chiral polymers (A) included in the first piezoelectric material and the second piezoelectric material may be selected according to the aspect of the piezoelectric substrate, if appropriate, from the viewpoint of further exhibiting the effects of the invention.

An example of the preferred combinations of the winding directions of the first piezoelectric material and the second piezoelectric material, and the chiralities of the helical chiral polymers (A) included in the first piezoelectric material and the second piezoelectric material has been described in the above specific aspects.

The second piezoelectric material may have characteristics different from the characteristics of the first piezoelectric material.

<First Insulator>

The piezoelectric substrate of the first embodiment may further include a first insulator.

The first insulator is preferably helically wound along the outer peripheral surface of the inner conductor.

In such a case, the first insulator may be arranged in the opposite side of the inner conductor as viewed from the first piezoelectric material, or may be arranged between the inner conductor and the first piezoelectric material.

The winding direction of the first insulator may be the same as or different from the winding direction of the first piezoelectric material.

There is an advantage in that particularly in a case in which the piezoelectric substrate of the first embodiment includes a first outer conductor, the piezoelectric substrate according to the first embodiment further includes the first insulator, whereby it is easy to suppress the occurrence of an electrical short circuit between the inner conductor and the outer conductor in the case of bending and deforming the piezoelectric substrate.

The first insulator is not particularly limited, and examples thereof include a vinyl chloride resin, a polyethylene resin, a polypropylene resin, an ethylene-tetrafluoroethylene copolymer (ETFE), a tetrafluoroethylene-hexafluoropropylene copolymer (FEP), a tetrafluoroethylene resin (PTFE), a tetrafluoroethylene-perfluoropropylvinylether copolymer (PFA), fluororubber, a polyester resin, a polyimide resin, a polyamide resin, a polyethylene terephthalate resin (PET), and a rubber (including an elastomer).

The shape of the first insulator is preferably an elongate shape from the viewpoint of winding around the conductor.

<Second Insulator>

The piezoelectric substrate of the present embodiment may further include a second insulator at the outer periphery of the first outer conductor in the case of a first outer conductor at an outer periphery.

As a result, electrostatic shielding is enabled, and a change in the voltage of the conductor (preferably, an inner conductor), influenced by external static electricity, is suppressed.

The second insulator is not particularly limited, and examples thereof include materials described as the examples of the first insulator.

The shape of the second insulator is not particularly limited, and may be a shape with which at least one of the first outer conductor can be coated.

(First Outer Conductor)

The piezoelectric substrate of the present embodiment preferably further includes a first outer conductor at an outer periphery.

The first outer conductor in the present embodiment is preferably a ground conductor.

The ground conductor refers to, for example, a conductor paired with the conductor (preferably, a signal line conductor) in a case in which a signal is detected.

The material of the ground conductor is not particularly limited, and examples thereof primarily include the following materials in accordance with a cross-sectional shape.

For example, a copper foil ribbon obtained by rolling a copper wire having a circular cross section to process the copper wire into a flat plate shape, an Al foil ribbon, or the like can be used as the material of the ground conductor having a rectangular cross section.

For example, a copper wire, an aluminum wire, an SUS wire, a metal wire coated with an insulating coating, a carbon fiber, a resin fiber integrated with a carbon fiber, or a tinsel wire obtained by spirally winding a copper foil around a fiber can be used as the material of a ground conductor having a circular cross section.

A material obtained by coating an organic conductive material with an insulating material may be used as the material of the ground conductor.

The ground conductor is preferably arranged to wrap the conductor (preferably a signal line conductor) and the first piezoelectric material so as to be prevented from being short-circuited with the signal line conductor.

A method of wrapping such a signal line conductor by helically winding a copper foil, a method of making a copper wire or the like into a cylindrical braid and wrapping such a signal line conductor in the braid, or the like can be selected as a method of wrapping such a signal line conductor.

The method of wrapping such a signal line conductor is not limited to the methods. By wrapping the signal line conductor, electrostatic shielding is enabled, and a change in the voltage of the signal line conductor, influenced by external static electricity, can be prevented.

The arrangement of the ground conductor to cylindrically include the minimum basic structure units (i.e., the conductor and the first piezoelectric material) of the piezoelectric substrate of the present embodiment is also one of the preferred forms of the arrangement of the ground conductor.

For example, in a case in which a piezoelectric fabric or a piezoelectric textile described later is processed into a sheet shape by using the piezoelectric substrate including the minimum basic structure units, the arrangement of a ground conductor having a plane shape or a sheet shape in the vicinity of one plane or both planes facing such a workpiece is also one of the preferred forms.

Various cross-sectional shapes such as a circular shape, an oval shape, a rectangular shape, and an abnormal shape can be applied to the cross-sectional shape of the ground conductor. In particular, a rectangular cross section enables intimate contact with the conductor (preferably, a signal line conductor), the first piezoelectric material, the first insulator, if necessary, the second piezoelectric material, or the like on the basis of a plane, and therefore enables a charge generated by a piezoelectric effect to be efficiently detected as a voltage signal.

<Adhesive Agent Forming Adhesive Layer>

The piezoelectric substrate of the present embodiment preferably includes an adhesive layer between the conductor and the first piezoelectric material.

"Adhesion" is a concept including "pressure sensitive adhesion." "Adhesive layer" is a concept including "pressure sensitive adhesive layer."

The adhesive agent forming the adhesive layer is used in order to mechanically achieve integration between the conductor and the first piezoelectric material or to maintain the distance between the electrodes (the conductor and the outer conductor) in a case in which the piezoelectric substrate includes an outer conductor.

The disposition of the adhesive layer between the conductor and the first piezoelectric material causes the relative positions of the conductor and the first piezoelectric material to be inhibited from deviating from each other in the case of applying a tension to the piezoelectric substrate of the present embodiment, and therefore facilitates application of a tension to the first piezoelectric material. Accordingly, a voltage output proportional to the tension can be effectively detected from the conductor (preferably, a signal line conductor). As a result, piezoelectric sensitivity and the stability of a piezoelectric output are further improved. The disposition of the adhesive layer results in a further increase in the absolute value of the amount of generated charge per unit tensile force.

Since suppleness is also maintained after processing a piezoelectric substrate that does not include any adhesive layer between a conductor and a first piezoelectric material into a piezoelectric fiber (for example, a piezoelectric fabric or a piezoelectric textile) described later, the feeling of wearing of a wearable sensor or the like into which the piezoelectric substrate is made is favorable.

The following materials can be used as the material of the adhesive agent forming the adhesive layer.

An epoxy adhesive agent, a urethane adhesive agent, a vinyl acetate resin emulsion type adhesive agent, an (EVA) emulsion type adhesive agent, an acryl resin emulsion type adhesive agent, a styrene-butadiene rubber latex type adhesive agent, a silicone resin adhesive agent, an α-olefin (isobutene-maleic anhydride resin) adhesive agent, a vinyl chloride resin solvent type adhesive agent, a rubber adhesive, an elastic adhesive agent, a chloroprene rubber solvent type adhesive agent, a nitrile rubber solvent type adhesive agent, or the like, a cyanoacrylate adhesive, or the like can be used.

—Elastic Modulus—

The elastic modulus of the adhesive agent in the present embodiment after bonding is preferably equivalent to or better than that of the first piezoelectric material. In a case in which a material of which the elastic modulus is lower than the elastic modulus of the first piezoelectric material is used, strain (piezoelectric strain) caused by a tension applied to the piezoelectric substrate of the present embodiment is decreased in an adhesive agent portion, the efficiency of transfer of the strain to the first piezoelectric material is decreased, and therefore, the sensitivity of a sensor is prone to decrease in the case of applying the piezoelectric substrate of the present embodiment to, for example, the sensor.

—Thickness—

The thickness of the bonding site of the adhesive agent in the present embodiment is preferably minimized as long as there is no void between targets to be bonded and bonding strength is not decreased. A decrease in the thickness of the bonding site is less likely result in a decrease in strain, caused by a tension applied to the piezoelectric substrate, in an adhesive agent portion, causes strain to the first piezoelectric material to efficiently decrease, and therefore results in improvement in the sensitivity of a sensor in the case of applying the piezoelectric substrate of the present embodiment to, for example, the sensor.

—Method of Applying Adhesive Agent—

A method of applying the adhesive agent is not particularly limited, and the following two methods can be primarily used.

Method of Arranging Adhesive Agent and Performing Bonding after Processing

Examples thereof include a method of arranging an adhesive agent on an interface between a conductor and a first piezoelectric material and performing adhesion with the adhesive agent by a method such as dip coating or impregnation after completing: the arrangement of the conductor (preferably, a signal line conductor) and the first piezoelectric material; and the processing and arrangement of the signal line conductor and a ground conductor.

The conductor and the first piezoelectric material may be bonded to each other by the above method, and each member included in the piezoelectric substrate of the present embodiment may be bonded, if necessary.

Method of Arranging Uncured Adhesive Agent Before Processing and Performing Bonding after Processing Examples thereof include a method of coating and drying a photo-curable adhesive agent, a thermosetting adhesive agent, a thermoplastic adhesive agent, or the like on a surface of a first piezoelectric material by a gravure coater, a dip coater, or the like in advance, completing the arrangement of a conductor and the first piezoelectric material, and then curing the adhesive agent by ultraviolet irradiation or heating, thereby bonding an interface between the conductor and the first piezoelectric material.

In a case in which the piezoelectric substrate of the present embodiment is processed into a piezoelectric fabric or a piezoelectric textile described later, the bonding or thermal fusion of, for example, an interface between a conductor and a first piezoelectric material, and an interface between the piezoelectric substrate and an outer conductor may also be performed by a similar method after the processing into the piezoelectric fabric or the piezoelectric textile. In such a case, the suppleness of the piezoelectric fabric or the piezoelectric textile is maintained before the integration of each member with the adhesive agent, and therefore, the processing of the fabric or the textile is facilitated.

The conductor and the first piezoelectric material may be bonded to each other by the above method, and each member included in the piezoelectric substrate of the present embodiment may be bonded, if necessary.

Use of the above method has a characteristic of enabling processing in a dry process to be performed after coating and drying of the adhesive agent, thereby facilitating processing or facilitating formation of a uniform film thickness, and therefore resulting in small variations in sensor sensitivity or the like.

<Method of Producing Piezoelectric Substrate>

A method of producing the piezoelectric substrate of the present embodiment is not particularly limited. For example, the piezoelectric substrate can be produced by preparing a first piezoelectric material and helically winding the first piezoelectric material around a separately prepared conductor (preferably, a signal line conductor) in one direction.

The first piezoelectric material may be produced by a known method or may be an obtained material.

In a case in which the piezoelectric substrate of the present embodiment includes a second piezoelectric material and a first insulator, if necessary, such a piezoelectric substrate can be produced in accordance with the method of helically winding the first piezoelectric material.

However, it is preferable to select the directions of winding the first piezoelectric material and the second piezoelectric material, and the chiralities of helical chiral polymers (A) included in the first piezoelectric material and the second piezoelectric material in accordance with an aspect of the piezoelectric substrate, if appropriate, as described above.

In a case in which the piezoelectric substrate of the present embodiment includes a first outer conductor (for example, a ground conductor), such a piezoelectric substrate can be produced by arranging the first outer conductor by the above method or a known method.

The conductor and the first piezoelectric material, and each member included in the piezoelectric substrate of the present embodiment, if necessary, may be affixed with an adhesive agent, for example, by the above method.

Figure 21A:
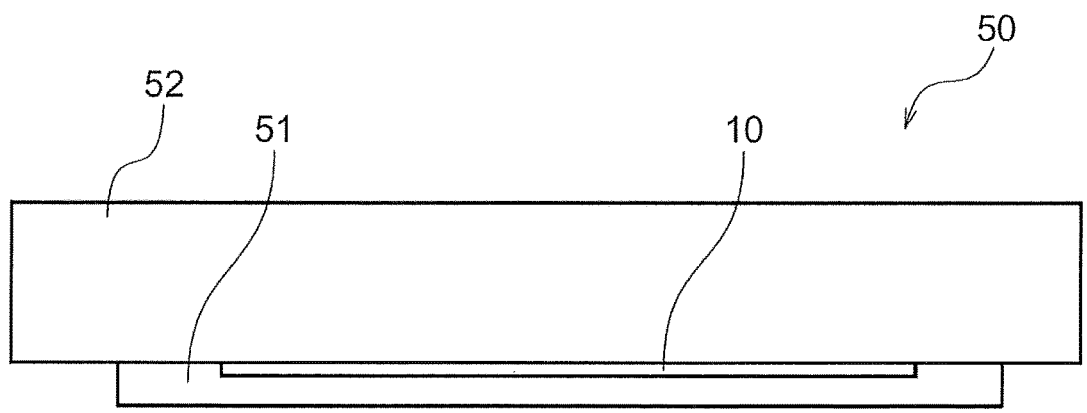
FIG. 21A is a schematic view illustrating the piezoelectric substrate according to the first embodiment, to which a flat plate is affixed with a pressure sensitive adhesive tape.
Figure 21B:
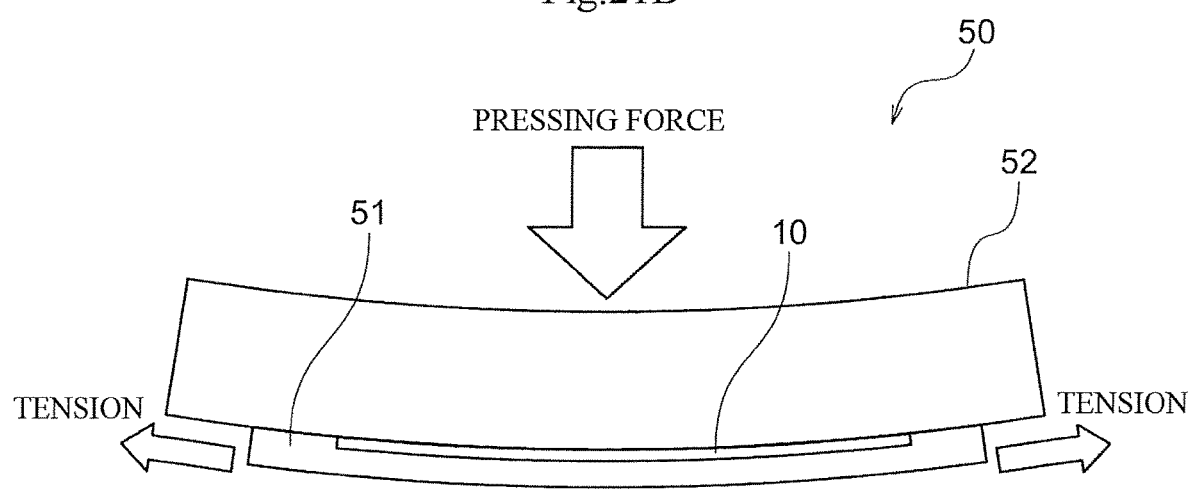
FIG. 21B is a schematic view illustrating the case of pressing the piezoelectric substrate according to the first embodiment, to which the flat plate is affixed with the pressure sensitive adhesive tape.

In the piezoelectric substrate of the present embodiment, shearing strain proportional to a tensile force is applied to a helical chiral (A) by applying the tensile force, and detected as a voltage signal (charge signal) from the conductor. Examples of a method of applying the tensile force to the piezoelectric substrate include various methods. A method of directly applying a tension to a piezoelectric substrate is acceptable. Alternatively, a voltage signal may be detected by affixing a piezoelectric substrate 10 to a flat plate 52 with a pressure sensitive adhesive tape 51 to make a piezoelectric substrate 50 with a flat plate, applying a pressing force to the flat plate 52, and applying a tension to the piezoelectric substrate 10 through bending deformation occurring in the flat plate 52, as illustrated in FIGS. 21A and 21B. FIG. 21A is a schematic view illustrating the piezoelectric substrate 10 to which the flat plate 52 is affixed with the pressure sensitive adhesive tape 51 (the piezoelectric substrate 50 with a flat plate), while FIG. 21B is a schematic view illustrating the case of pressing the piezoelectric substrate 10 to which the flat plate 52 is affixed with the pressure sensitive adhesive tape 51 (the piezoelectric substrate 50 with a flat plate).

Examples of a method of affixing the piezoelectric substrate 10 to the flat plate 52 to mechanically integrate the piezoelectric substrate 10 and the flat plate 52 include various methods. Examples thereof include a method of affixing part of the piezoelectric substrate 10 to the flat plate 52 with the pressure sensitive adhesive tape 51 such as a cellophane tape or a gummed tape as illustrated in FIG. 22, or a method of affixing part of the piezoelectric substrate 10 to the flat plate 52 with an adhesive agent 61 such as a thermosetting adhesive agent such as an epoxy resin, or a thermoplastic adhesive agent such as a hot melt adhesive agent as illustrated in FIG. 23.

Figure 22:
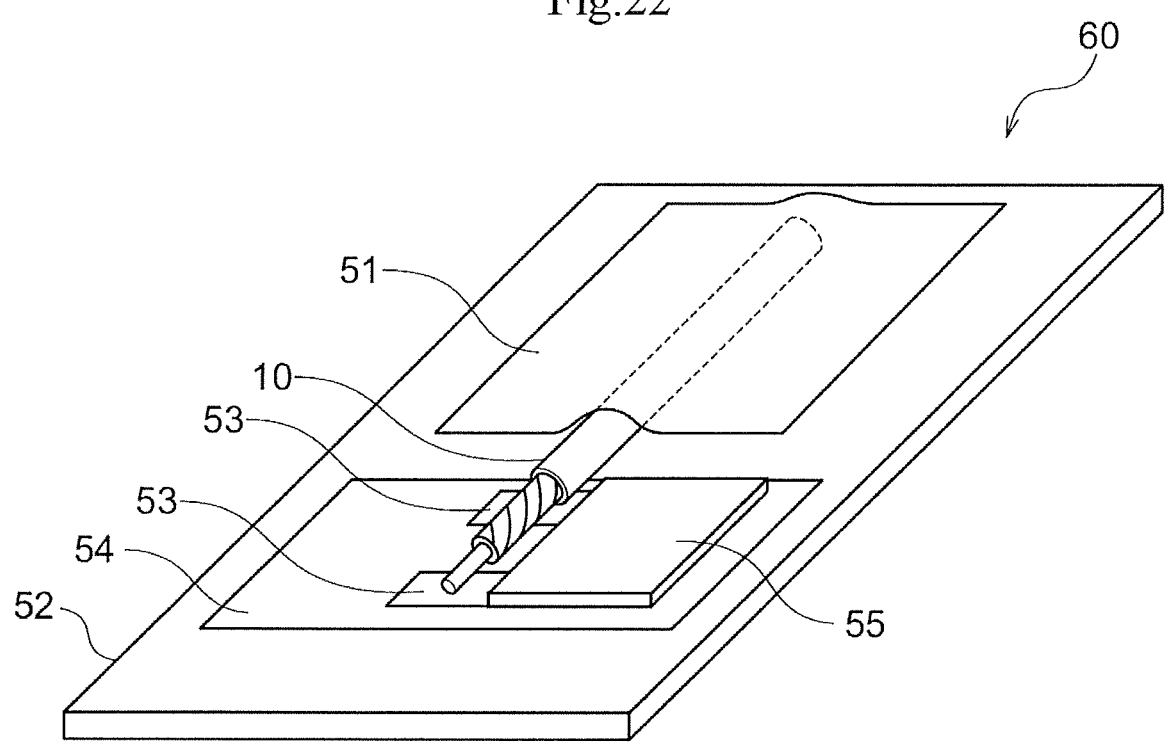
FIG. 22 illustrates an example of the piezoelectric substrate according to the first embodiment, to which a flat plate is affixed with a pressure sensitive adhesive tape.
Figure 23:
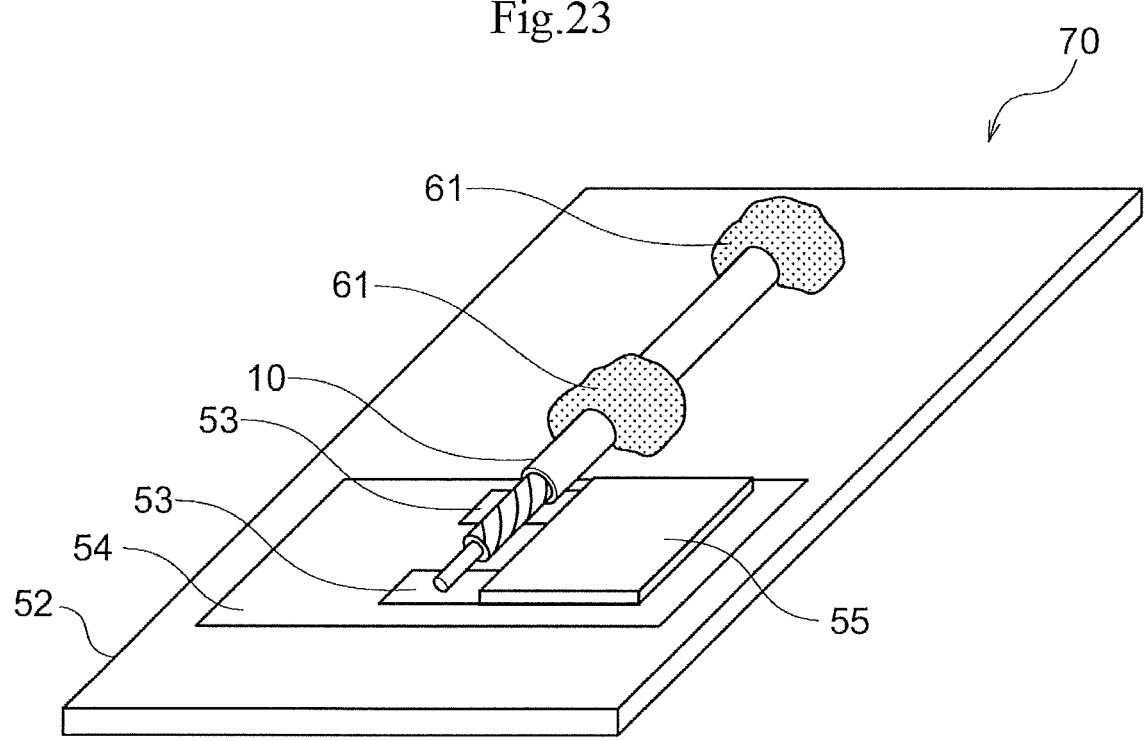
FIG. 23 illustrates an example of the piezoelectric substrate according to the first embodiment, to which a flat plate is affixed with a pressure sensitive adhesive tape.

In a piezoelectric substrate 60 with a flat plate in FIG. 22, part of the piezoelectric substrate 10 is affixed to the flat plate 52 with the pressure sensitive adhesive tape 51, an FPC (flexible printed circuit board) 54 is arranged on the flat plate 52, and a copper foil 53 conductive to the piezoelectric substrate 10 is arranged on the FPC 54. The piezoelectric substrate 60 with a flat plate includes a signal processing circuit unit 55 which detects and processes a piezoelectric signal detected by applying a tensile force to the piezoelectric substrate 10. A piezoelectric substrate 70 with a flat plate in FIG. 23 is similar to the piezoelectric substrate 60 with a flat plate except that part of the piezoelectric substrate 10 is affixed to the flat plate 52 with the adhesive agent 61 instead of the pressure sensitive adhesive tape 51.

The piezoelectric substrate may be affixed to not only the above flat plate but also the inside, outside, or the like of the housing of an electronic circuit including a curved surface, as a target to which the piezoelectric substrate is affixed.

Figure 24:
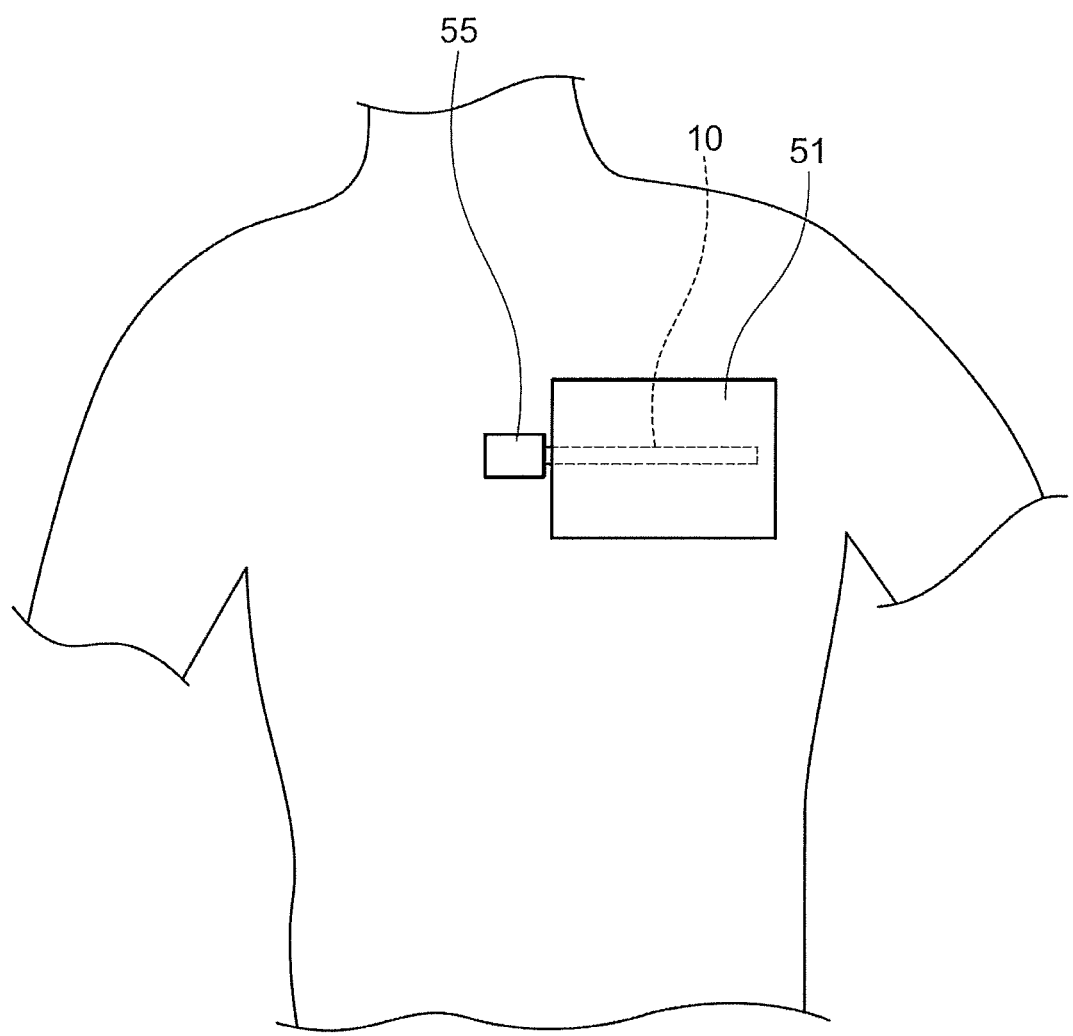
FIG. 24 is a schematic view illustrating the case of affixing the piezoelectric substrate according to the first embodiment to the human body with an adhesive tape.
Figure 25:
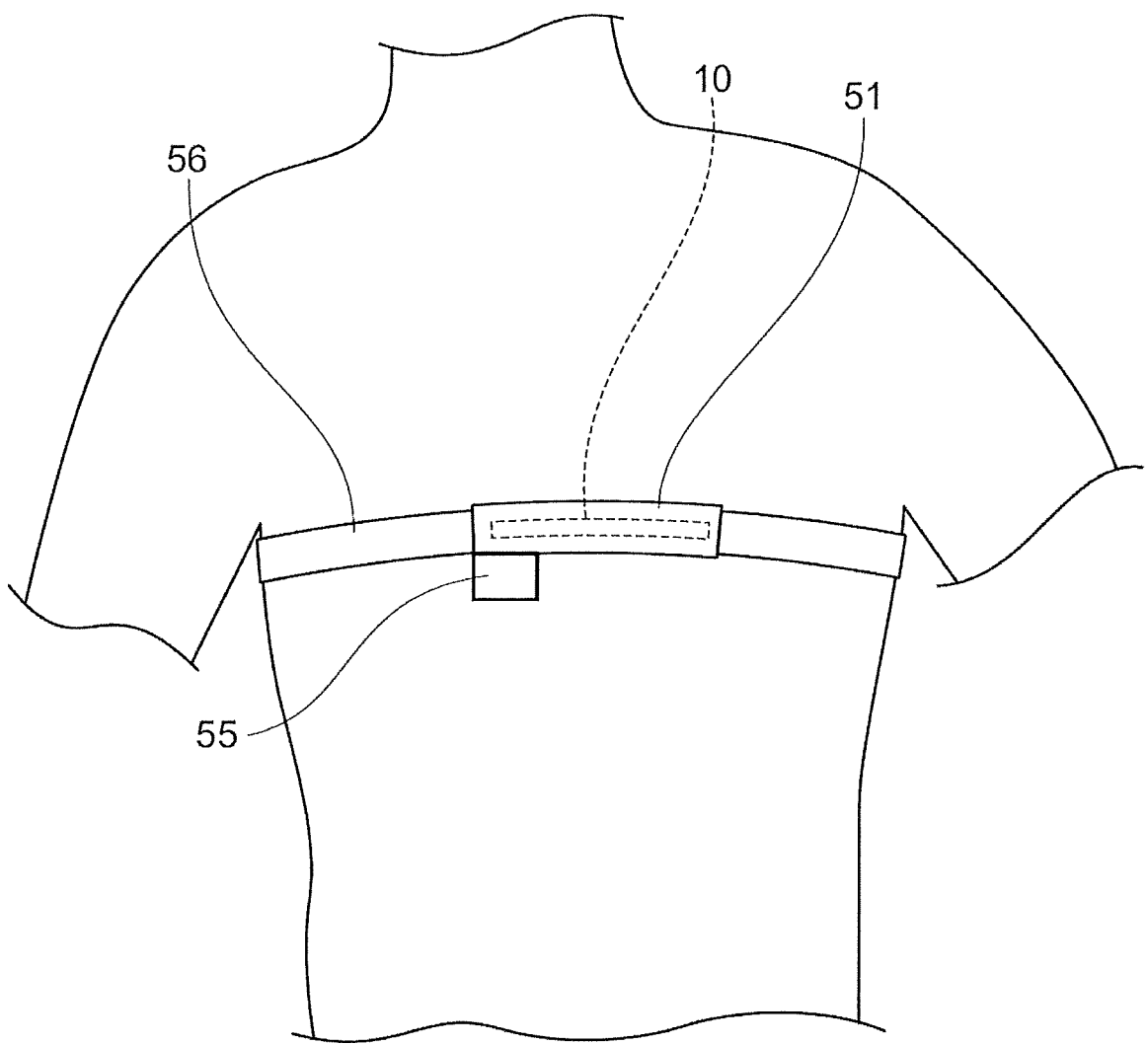
FIG. 25 is a schematic view illustrating the case of fixing the piezoelectric substrate according to the first embodiment to the human body with a belt.

As illustrated in FIG. 24, the piezoelectric substrate 10 may be affixed and fixed to the skin of the human body with the pressure sensitive adhesive tape 51, or the piezoelectric substrate 10 may be affixed and fixed to clothes, a supporter, or the like with the pressure sensitive adhesive tape 51. The piezoelectric substrate 10 may be fixed to the skin of the human body by arranging the piezoelectric substrate 10 on a belt 56 of which the length can be adjusted, and tightening the periphery of the human body with the belt, as illustrated in FIG. 25. In a case in which the piezoelectric substrate 10 is arranged on the belt 56, an object obtained by laminating the piezoelectric substrate 10 with a pressure sensitive adhesive tape may be arranged as part of the belt 56. In the configurations illustrated in FIGS. 24 and 25, the relaxation or contraction of the waist due to respiration, a heart rate, or the like is applied as a tension to the piezoelectric substrate, and a voltage signal is detected in signal processing circuit unit 55. The various exercises of the human body can be monitored by fixing the piezoelectric substrate to the human body in such a manner. By arranging the piezoelectric substrate on, for example, the periphery of the cylindrically-shaped site of the human body, such as the circumference of the arm, the circumference of the leg, or the circumference of the neck, a change in circumferential length due to the contraction or relaxation of the muscle in the cylindrically-shaped site can be monitored by detecting a voltage signal.

Figure 26:
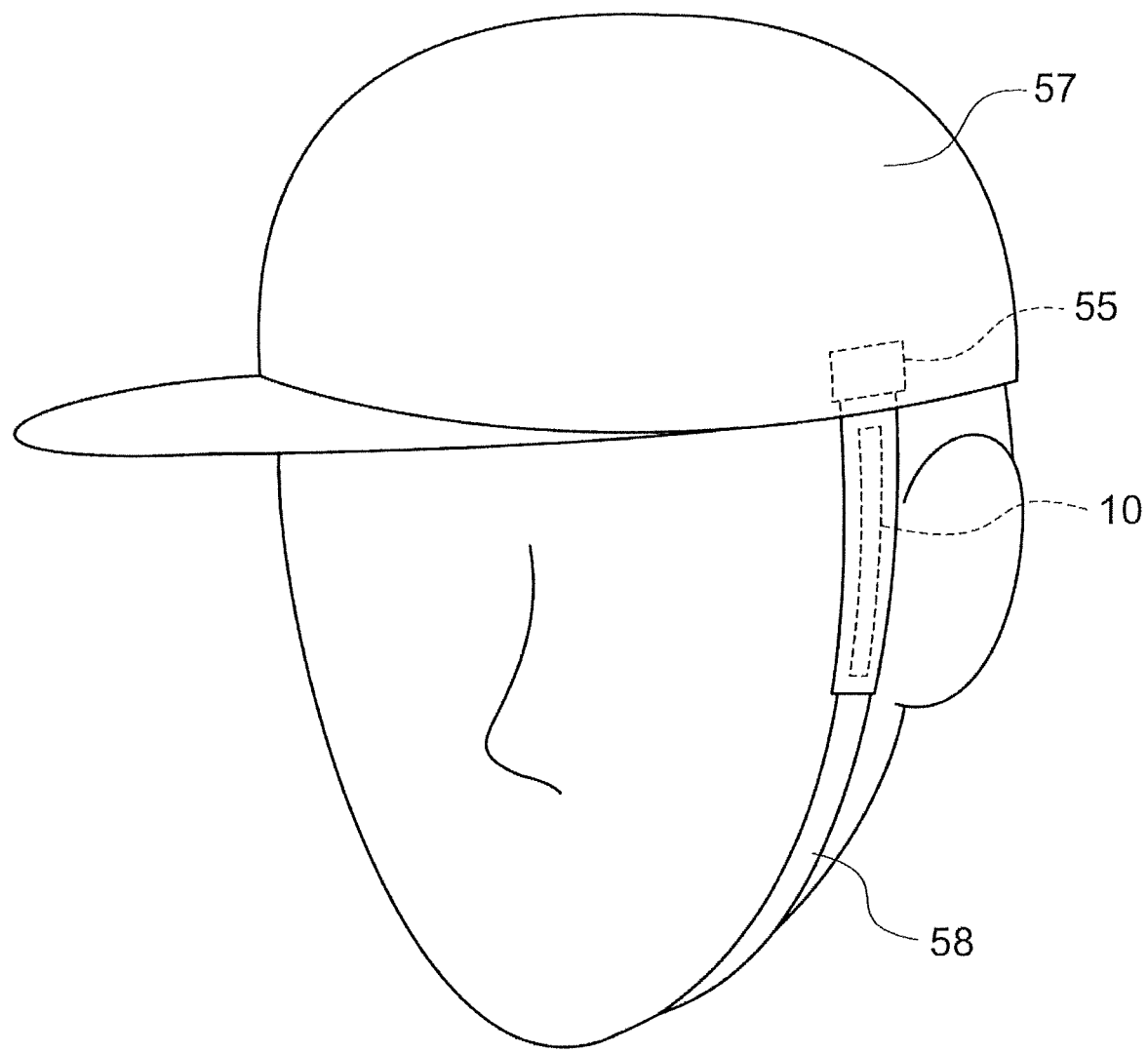
FIG. 26 is a schematic view illustrating an arrangement of the piezoelectric substrate according to the first embodiment on part of a chin strap.

As illustrated in FIG. 26, the piezoelectric substrate 10 may be arranged on part of the chin strap 58 of a helmet (or a hat) 57, and a change in the tension of the chin strap due to the exercise of the chin such as chewing may be detected as a voltage signal. As a result, chewing strength, the number of times of chewing, or the like can be detected and monitored as a voltage signal.

[Piezoelectric Textile]

The piezoelectric textile of the present embodiment includes a textile structure.

The textile structure includes warp and weft.

In the piezoelectric textile of the present embodiment, at least one of the warp or the weft includes the piezoelectric substrate of the present embodiment.

Accordingly, the piezoelectric textile of the present embodiment exhibits an effect similar to the effect of the piezoelectric substrate of the present embodiment.

Here, a textile refers generically to a textile finished in a film shape by interlacing yarn to form a textile structure. A piezoelectric textile refers to a textile in which a piezoelectric effect is exhibited by an external stimulus (for example, a physical force), among textiles.

In the piezoelectric textile of the present embodiment, both the warp and the weft may include a piezoelectric substrate.

Figure 27A:
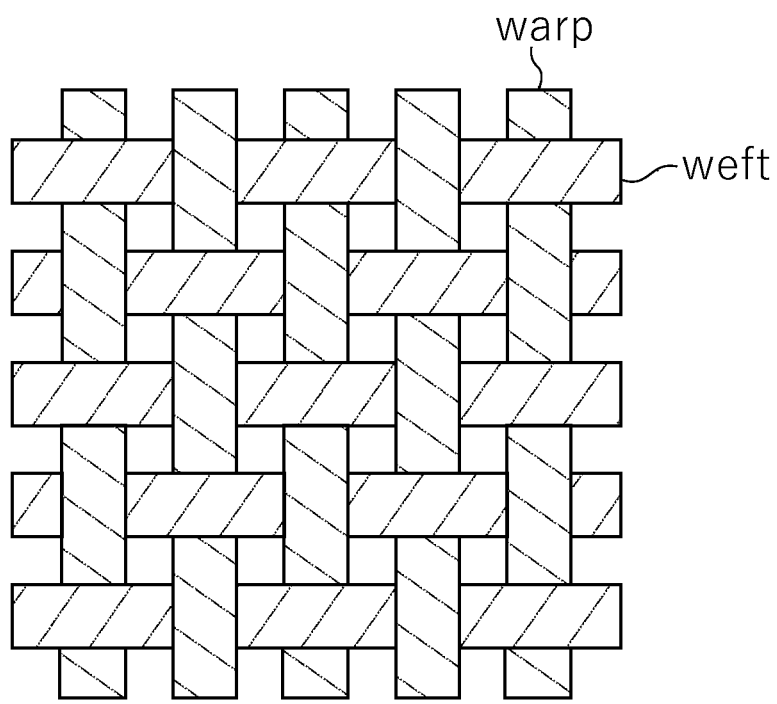
FIG. 27A is a schematic view illustrating an example of the textile structure according to an embodiment in which a direction of winding of the first piezoelectric material included in the warp and a direction of winding of the first piezoelectric material included in the weft are identical to each other.
Figure 27B:
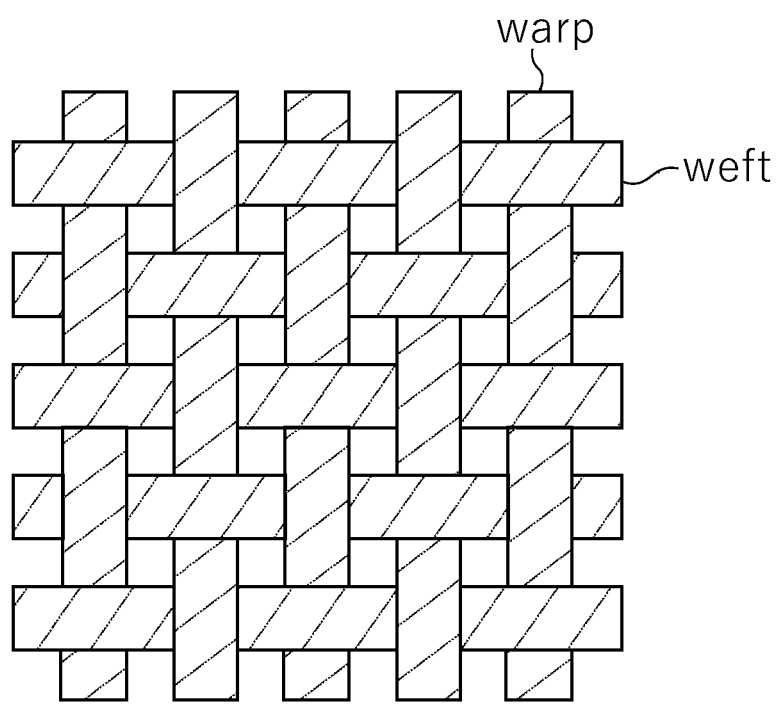
FIG. 27B is a schematic view illustrating an example of the textile structure according to an embodiment in which a direction of winding of the first piezoelectric material included in the warp and a direction of winding of the first piezoelectric material included in the weft differ from each other.

In the case of such an aspect, it is preferable that the direction of winding of the first piezoelectric material included in the warp and the direction of winding of the first piezoelectric material included in the weft differ from each other as illustrated in FIG. 27B, and the chirality of a helical chiral polymer (A) included in the warp and the chirality of a helical chiral polymer (A) included in the weft are identical to each other, from the viewpoint of improving piezoelectric sensitivity and the stability of a piezoelectric output.

Alternatively, it is preferable that the direction of winding the first piezoelectric material included in the warp and the direction of winding the first piezoelectric material included in the weft are identical to each other as illustrated in FIG. 27A, and the chirality of the helical chiral polymer (A) included in the warp and the chirality of the helical chiral polymer (A) included in the weft differ from each other.

Examples of the yarn include yarn including a polymer.

Examples of the polymer in the yarn including a polymer include a common polymer such as polyester or polyolefin, or a helical chiral polymer such as the helical chiral polymer (A) described above.

The concept of the yarn including a polymer also includes the piezoelectric substrate of the present embodiment.

The textile structure of the piezoelectric textile of the present embodiment is not particularly restricted.

Examples of the textile structure include a basic structure such as plain weave, twill weave, or satin weave.

The piezoelectric substrate of the present embodiment may be used as the warp or weft in the piezoelectric textile, may be used as part of the warp, or may be used as part of the weft.

The piezoelectric textile of the present embodiment may be a textile having a three-dimensional structure. The textile having a three-dimensional structure is a textile that is three-dimensionally finished by knitting yarn (warp, weft) in the thickness direction of the textile in addition to a two-dimensional structure.

An example of the textile having a three-dimensional structure is described, for example in Japanese National-Phase Publication (JP-A) No. 2001-513855.

In the piezoelectric textile of the present embodiment, at least part of the yarn included in the textile structure may include the piezoelectric substrate of the present embodiment.

[Piezoelectric Fabric]

The piezoelectric fabric of the present embodiment includes a fabric structure. The fabric structure includes the piezoelectric substrate of the present embodiment.

Accordingly, the piezoelectric fabric of the present embodiment exhibits an effect similar to the effect of the piezoelectric substrate of the present embodiment.

Here, a fabric refers generically to a fabric produced by knitting yarn while making a loop with the yarn. The piezoelectric fabric refers to a fabric in which a piezoelectric effect is exhibited by an external stimulus (for example, a physical force), among fabrics.

Examples of the yarn include yarn including a polymer.

Examples of the polymer in the yarn including a polymer include a common polymer such as polyester or polyolefin, or a helical chiral polymer such as the helical chiral polymer (A) described above.

The concept of the yarn including a polymer also includes the piezoelectric substrate of the present embodiment.

The fabric structure of the piezoelectric fabric of the present embodiment is not particularly restricted.

Examples of the fabric structure include a basic structure such as weft knitting (flat knitting) or warp knitting (single knitting). Examples of the weft knitting include plain knitting, rib knitting, double knitting, purl knitting, or circular knitting. Examples of the warp knitting include a basic structure such as tricot knitting, atlas knitting, diamond knitting, or milanese knitting.

The piezoelectric substrate of the present embodiment may be used as yarn in the piezoelectric fabric or may be used as part of the yarn.

The piezoelectric fabric of the present embodiment may be a fabric having a three-dimensional structure. The fabric having a three-dimensional structure is a fabric that is three-dimensionally finished by knitting yarn in the thickness direction of the fabric in addition to a two-dimensional structure.

In the piezoelectric fabric of the present embodiment, at least part of the yarn included in the fabric structure may include the piezoelectric substrate of the present embodiment.

<Application of Piezoelectric Textile or Piezoelectric Fabric>

The piezoelectric textile or the piezoelectric fabric of the present embodiment can be applied to any application of which at least part requires piezoelectricity.

Specific examples of the applications of the piezoelectric textile or the piezoelectric fabric of the present embodiment include various articles of clothing (shirts, suits, blazers, blouses, coats, jackets, blousons, jumpers, vests, one-piece dresses, trousers, skirts, pants, underwear (slips, petticoats, camisoles, and brassieres), socks, gloves, Japanese clothes, obi materials, gold brocades, cold-feeling clothing, neckties, handkerchiefs, mufflers, scarves, stoles, and eye masks), table cloths, footwear (sneakers, boots, sandals, pumps, mules, slippers, ballet shoes, and kung fu shoes), face cloths, bagged parts, bags (tote bags, shoulder bags, handbags, pochettes, shopping bags, eco-bags, rucksacks, daypacks, sports bags, Boston bags, bum-bags, belt bags, second bags, clutch bags, vanities, accessory pouches, mother bags, party bags, and bags in Japanese dress), pouch cases (makeup pouches, tissue cases, spectacle cases, pen cases, book jackets, game pouches, key cases, and pass cases), wallets, hats (hats, caps, caskets, hunting caps, ten-gallon hats, tulip hats, sun visors, and berets), helmets, hoods, belts, aprons, ribbons, corsages, brooches, curtains, wall clothes, seat covers, bed sheets, futons, quilt covers, blankets, pillows, pillow slips, sofas, beds, baskets, various wrapping materials, house furnishings, automobile supplies, artificial flowers, masks, bandages, ropes, various nets, fishing nets, cement reinforcing materials, meshes for screen printing, various filters (for automobiles, and for household electric appliances), various meshes, sheets (agricultural sheets and leisure sheets), textiles for civil engineering works, textiles for building works, and filtration fabrics.

The entire of each of the above specific examples may include the piezoelectric textile or the piezoelectric fabric of the present embodiment, or only the site requiring piezoelectricity may include the piezoelectric textile or the piezoelectric fabric of the present embodiment.

A wearable product which is worn on the body is particularly preferred for an application of the piezoelectric textile or the piezoelectric fabric of the present embodiment.

The details of the specific aspects of the piezoelectric fabric of the present embodiment will be described later together with the specific aspects of the piezoelectric device.

[Piezoelectric Device]

The piezoelectric device of the present embodiment includes: the piezoelectric textile of the above embodiment; and a second outer conductor arranged at a position opposed to the principal plane of the textile structure.

Alternatively, the piezoelectric device of the present embodiment includes: the piezoelectric fabric of the above embodiment; and a second outer conductor arranged at a position opposed to the principal plane of the fabric structure.

In other words, the piezoelectric device of the present embodiment includes the piezoelectric textile including the piezoelectric substrate of the present embodiment or the piezoelectric fabric including the piezoelectric substrate of the present embodiment.

Accordingly, the piezoelectric device of the present embodiment exhibits an effect similar to the effect of the piezoelectric substrate of the present embodiment.

(Second Outer Conductor)

The second outer conductor is preferably a ground conductor.

The material of the ground conductor is not particularly limited, and examples thereof include materials similar to those of the first outer conductor described above.

A commonly used electrode material may be used for the second outer conductor.

Examples of the electrode material include metals (such as Al) as well as Ag, Au, Cu, Ag—Pd alloys, Ag pastes, Cu pastes, carbon black, ITO (crystallized ITO and amorphous ITO), ZnO, IGZO, IZO (registered trademark), conductive polymers (polythiophene and PEDOT), Ag nanowires, carbon nanotubes, and graphene (including the materials common with the materials of the first outer conductor).

The shape of the second outer conductor in the present embodiment is not particularly restricted, and is preferably selected depending on a purpose, if appropriate.

The piezoelectric device of the present embodiment preferably further includes a third insulator between the second outer conductor and the textile structure or the fabric structure.

As a result, a structure in which it is easy to suppress the occurrence of an electrical short circuit between the conductor (preferably, an inner conductor) and the outer conductor is made.

(Third Insulator)

The third insulator is not particularly limited, and examples thereof include the materials described as the examples of the first insulator.

The shape of the third insulator in the present embodiment is not particularly restricted, and is preferably selected depending on a purpose, if appropriate.

<Application of Piezoelectric Substrate>

The piezoelectric substrate of the present embodiment can be utilized as, for example, sensor applications (force sensors such as sitting sensors; pressure sensors; displacement sensors; deformation sensors; vibration sensors; supersonic sensors; biological sensors; acceleration sensors, impact sensors, and the like for hitting with various sports tools for ball games such as rackets, golf clubs, and bats; touch/impact sensors for stuffed toys; bed watching sensors; security sensors for glass and window frames; and the like); actuator applications (devices for transporting sheets; and the like); energy harvesting applications (electricity generation wear, electricity generation shoes, and the like); health care-related applications (such as wearable sensors which are disposed on various articles of clothing such as T-shirts, sportswear, spats, and socks; supporters, plaster casts, diapers, sheets for baby buggies, sheets for wheelchairs, mats for medical incubators, shoes, inner soles for shoes, watches, and the like); and the like.

The piezoelectric substrate of the present embodiment is disposed on various articles such as various articles of clothing (shirts, suits, blazers, blouses, coats, jackets, blousons, jumpers, vests, one-piece dresses, trousers, pants, underwear (slips, petticoats, camisoles, and brassieres), socks, gloves, Japanese clothes, obi materials, gold brocades, cold-feeling clothing, neckties, handkerchiefs, mufflers, scarves, stoles, and eye masks), supporters (neck supporters, shoulder supporters, chest supporters, abdomen supporters, hip supporters, arm supporters, leg supporters, elbow supporters, knee supporters, wrist supporters, and ankle supporters), footwear (sneakers, boots, sandals, pumps, mules, slippers, ballet shoes, and kung fu shoes), insoles, face cloths, rucksacks, hats (hats, caps, caskets, hunting caps, ten-gallon hats, tulip hats, sun visors, and berets), chin straps for hats, helmets, chin straps for helmets, hoods, belts, seat covers, bed sheets, floor cushions, cushions, futons, quilt covers, blankets, pillows, pillow slips, sofas, chairs, desks, tables, sheets, seats, lavatory seats, massage chairs, beds, bed pats, carpets, baskets, masks, bandages, ropes, stuffed toys, various nets, bathtubs, wall materials, floor materials, window materials, window frames, doors, doorknobs, personal computers, mice, keyboards, printers, housings, robots, musical instruments, artificial arms, artificial legs, bicycles, skateboards, roller skates, rubber balls, shuttlecocks, handles, pedals, fishing rods, floats for fishing, reels for fishing, fishing rod holders, lures, switches, safes, fences, ATMs, grips, dials, bridges, buildings, structures, tunnels, chemical reaction containers and pipes thereof, pneumatic instruments and pipes thereof, hydraulic instruments and pipes thereof, vapor pressure instruments and pipes thereof, motors, electromagnetic solenoids, and gasoline engines. The piezoelectric substrate is used for sensors, actuators, and energy harvesting applications.

Examples of disposition methods include various methods such as stitching of the piezoelectric substrate into a target, sandwiching of the piezoelectric substrate between targets, and fixing of the piezoelectric substrate with a sticky adhesive.

For example, the piezoelectric textile, piezoelectric fabric, and piezoelectric device described above can be applied to such applications.

The piezoelectric substrate of the present embodiment is preferably used for a sensor application or an actuator application among the above applications.

Specifically, the piezoelectric substrate of the present embodiment is preferably mounted and utilized on a force sensor, or preferably mounted or utilized on an actuator.

The piezoelectric substrate, piezoelectric textile, piezoelectric fabric, and piezoelectric device described above can also be used for a switch that enables applies a voltage generated by a stress between the gate and source of a field effect transistor (FET), thereby switching the FET, and enables ON-OFF by the stress.

The piezoelectric substrate of the present embodiment can also be used for other applications than the applications described above.

Examples of the other applications include bedding for detecting tossing, a carpet for detecting movement, an insole for detecting movement, a chest band for detecting respiration, a mask for detecting respiration, an arm band for detecting straining, a leg band for detecting straining, a sitting seat for detecting sitting, and a stuffed toy and a stuffed toy type social robot which can determine a contact condition. The stuffed toy, the stuffed toy type social robot, or the like which can determine a contact condition can determine whether a human performs an action of "stroking", "hitting", or "pulling" the stuffed toy by detecting a change in pressure, for example, by a contact sensor arranged locally on the stuffed toy or the like.

The piezoelectric substrate of the present embodiment is particularly suitable for, for example, an in-vehicle application; an application for detecting gripping of an automobile steering wheel using vibration/sound sensing; an application for an in-vehicle instrument operation system with a resonance spectrum using vibration/sound sensing; an application for a touch sensor for an in-vehicle display; an application for a vibrating body; an application for a sensor for detection of being caught by an automobile door or an automobile window; or an application for a sensor for vibrations of a vehicle body.

A known extraction electrode can be bonded to the piezoelectric substrate of the present embodiment. Examples of the extraction electrode include an electrode component such as a connector, or a crimp terminal. Such an electrode component can be bonded to the piezoelectric substrate with brazing such as soldering, a conductive bonding agent, or the like.

Specific aspects of the piezoelectric device according to the present embodiment and specific aspects of the piezoelectric fabric according to the embodiment described above will be described below with reference to the drawings.

Figure 5:
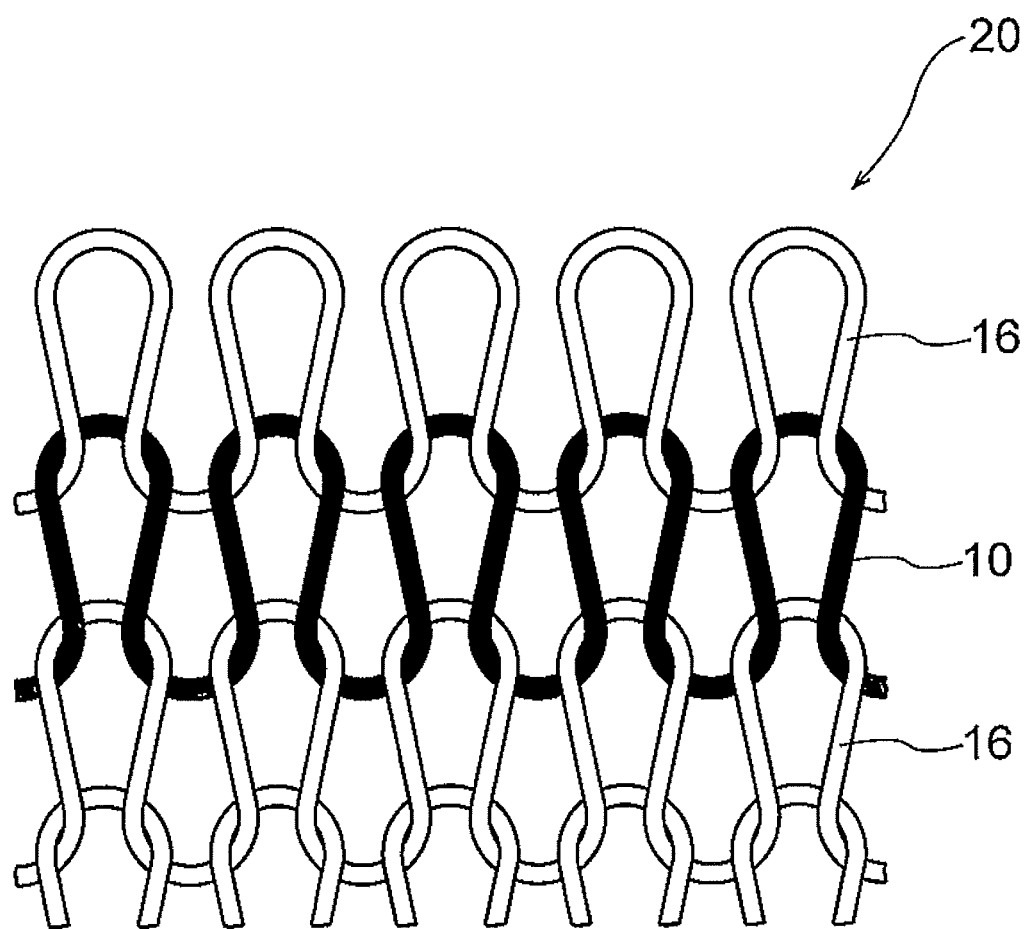
FIG. 5 is a schematic view illustrating an example of a piezoelectric fabric according to a present embodiment.

FIG. 5 is a schematic view illustrating an example of the piezoelectric textile according to the present embodiment.

Figure 6:
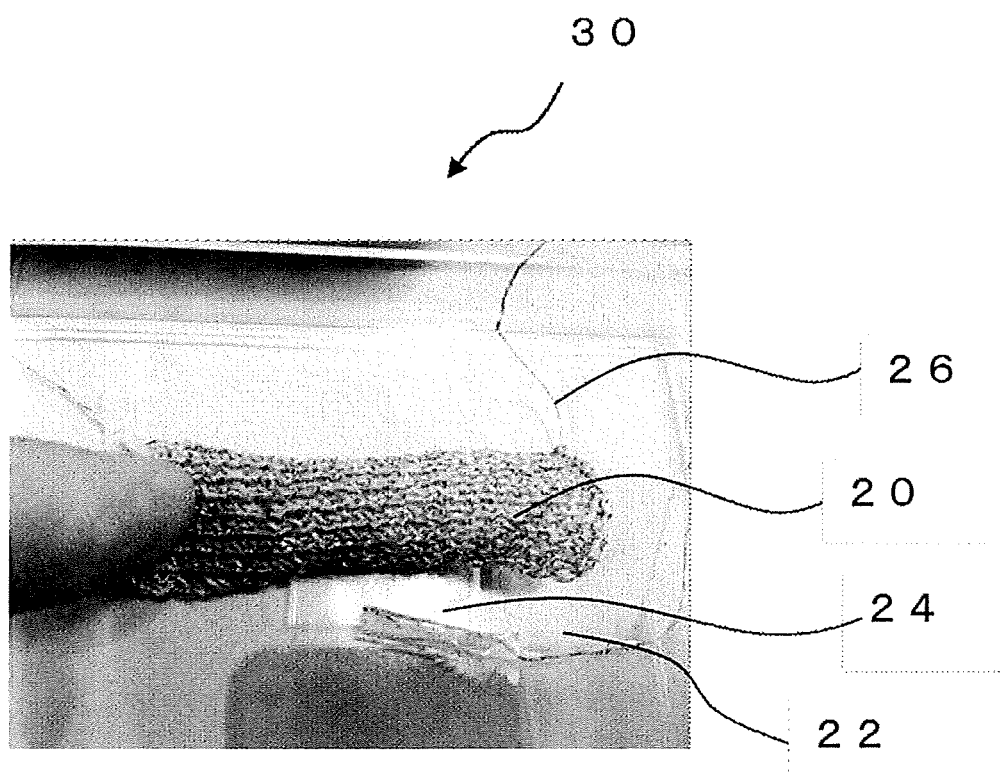
FIG. 6 is a photograph in a two-dimensional view of a piezoelectric device concerning the present embodiment.

FIG. 6 is a photograph in a two-dimensional view of the piezoelectric device according to the present embodiment.

A piezoelectric fabric 20 of the present embodiment is an aspect in which the piezoelectric substrate 10 of the specific aspect A illustrated in FIG. 1 is applied as part of yarn included in the piezoelectric fabric 20.

In the piezoelectric fabric 20 of the present embodiment, the piezoelectric substrate 10 and insulating yarn 16 are knitted by weft knitting, and the piezoelectric substrate 10 of the specific aspect A is used in part of a fabric structure, as illustrated in FIG. 5.

The piezoelectric fabric 20 illustrated in FIG. 5 can be applied, for example, as a piezoelectric fabric 20 included in a piezoelectric device 30 illustrated in FIG. 6.

As illustrated in FIG. 6, the piezoelectric device 30 of the present embodiment includes a ground electrode (ground conductor) 22 as a second outer conductor, an insulator film 24 as a third insulator, and the piezoelectric fabric 20 illustrated in FIG. 5 in the order mentioned above. In the piezoelectric device 30 illustrated in FIG. 6, a tinsel wire (inner conductor) 26, included in the piezoelectric substrate 10, and the ground conductor 22 are connected to an external circuit (not illustrated) through connection means.

In the piezoelectric device 30 of the present embodiment, application of a tension to the piezoelectric fabric 20 causes polarization to occur in a helical chiral polymer (A) included in the piezoelectric substrate 10. The direction of the polarization is the radial direction of the piezoelectric substrate. As a result, a charge (electric field) proportional to the tension is generated. The generated charge is extracted through the tinsel wire 26 and the ground conductor 22, and is detected as a voltage signal in the external circuit.

A specific aspect of the force sensor including the piezoelectric substrate according to the present embodiment will be described below with reference to the drawings.

Figure 7:
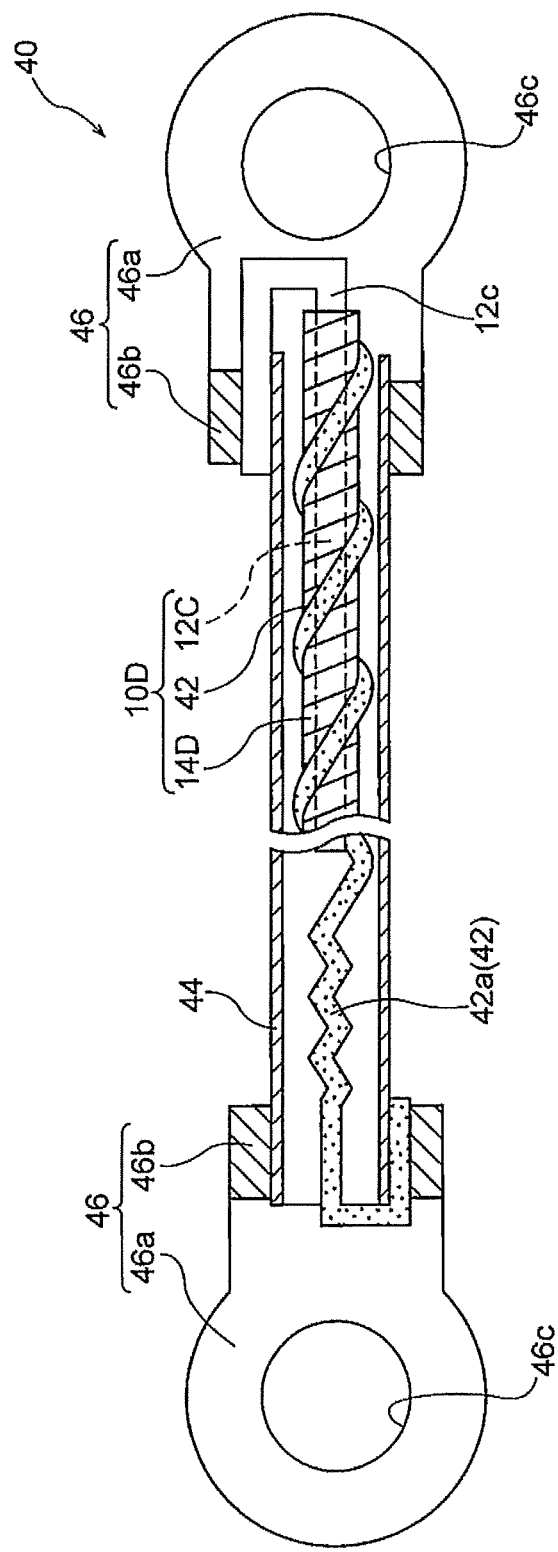
FIG. 7 is a conceptual diagram of a force sensor according to the present embodiment.

FIG. 7 is a conceptual diagram of the force sensor according to the present embodiment.

A force sensor 40 according to the present embodiment includes: a cylindrically-shaped rubber-based heat-shrinkable tube (hereinafter simply referred to as "shrinkable tube") 44 as a second insulator; a piezoelectric substrate 10D arranged in the shrinkable tube 44; a pair of crimp terminals (extraction electrodes) 46 arranged at both ends of the shrinkable tube 44. Each of the pair of crimp terminals 46 includes a body portion 46a and a crimp portion 46b, as well as a through-hole 46c in a central portion. The piezoelectric substrate 10D includes: an inner conductor 12C; a first piezoelectric material 14D helically wound in one direction around the inner conductor 12C; and a first outer conductor 42 (ground conductor) helically wound in one direction around the outer peripheral surface of the first piezoelectric material 14D.

One end (right end in FIG. 7) of the inner conductor 12C in the piezoelectric substrate 10D extends to the outside of the shrinkable tube 44, is crimped in the crimp portion 46b, and is connected electrically to the crimp terminal 46. The first outer conductor 42 is wound from one end of the inner conductor 12C to the other end thereof, and then extends across the other end (left end in FIG. 7) of the inner conductor 12C. Such an extension portion forms a stress relief portion 42a in the shrinkable tube 44.

The first outer conductor 42 passes through the stress relief portion 42a, then extends to the further outside (left end in FIG. 7) of the shrinkable tube 44, is crimped in the crimp portion 46b, and is connected electrically to the crimp terminal 46.

The stress relief portion 42a includes the first outer conductor 42 which is slack, as illustrated in FIG. 7. In the stress relief portion 42a, a slack portion extends, whereby an excessive force is inhibited from being loaded on the first piezoelectric material 14D, in the case of applying a tension (stress) to the force sensor 40.

The first piezoelectric material 14D includes a piezoelectric material having an elongate flat plate shape, and aluminum-deposited films (not illustrated) are deposited as functional layers on both planes thereof. The pair of crimp terminals 46 are connected to an external circuit (not illustrated) which processes an output signal of the force sensor 40.

In the embodiment illustrated in FIG. 7, the first outer conductor 42 which is slack is arranged as the stress relief portion 42*a*. However, the embodiment of the invention is not limited thereto. The function of relieving a stress by arranging a linear stress relief portion on at least one end or both ends of the piezoelectric substrate 10D by, for example, a method such as adhesive bonding or knotting so that a tension can be transmitted may be imparted to the force sensor 40.

In such a case, the linear stress relief portion does not have any electrical connection function. For the electrical connection function, however, a voltage signal of a stress or a strain can be detected by connecting the inner conductor and the outer conductor from an end of the piezoelectric substrate to a coaxial cable or the like, independently of the stress relief portion.

In such a case, the material and form of the stress relief portion are not particularly limited, and examples thereof include: yarn, a string, or a tube including stretchable elastic material such as natural rubber, silicone rubber, or urethane rubber; or a spring including a metallic material such as phosphor bronze, a linear polymer, or the like. The restriction of the strain amount of a stress relief portion, caused by the maximum stretch amount of the electrical connection, is eliminated, thereby enabling a maximum strain amount for a tension sensor to be increased, by arranging the stress relief portion and an electrical connection on sites independently separate from each other.

The chin strap 58 functions as the stress relief portion in the example in which the piezoelectric substrate 10 is arranged on part of the chin strap 58 of the helmet (or the hat) 57, illustrated in FIG. 26 as described above.

The action of the force sensor 40 of the present embodiment will be described below.

In a case in which a tension (stress) is applied to the force sensor 40, the tension is applied to the piezoelectric substrate 10D, a shear force is applied to the helical chiral polymer (A) included in the first piezoelectric material 14D of the piezoelectric substrate 10D, and the shear force causes the polarization of the helical chiral polymer (A) to occur in the radial direction of the piezoelectric substrate 10D. The direction of the polarization is the radial direction of the piezoelectric substrate 10D. As a result, a charge (electric field) proportional to the tension is generated, and the generated charge is detected as a voltage signal (charge signal). The voltage signal is detected in, for example, an external circuit (not illustrated) connected to the crimp terminal 46.

The force sensor 40 of the present embodiment includes the piezoelectric substrate 10D forming the same structure as an inner structure possessed by a coaxial cable, and can therefore have a structure that has a high electromagnetic shield property and is resistant to noise. In addition, the structure of the force sensor is simple, and the force sensor can be therefore mounted and used, for example, as a wearable sensor, on part of the body.

The force sensor of the present embodiment is not limited to a configuration in which a charge (electric field) generated in the case of applying a tension to the piezoelectric substrate is extracted as a voltage signal, and may have a configuration in which a charge (electric field) generated, for example, in the case of applying a torsional force to the piezoelectric substrate is extracted as a voltage signal.

A biological information acquisition device is also preferred as an application of the piezoelectric substrate of the present embodiment, the piezoelectric textile of the present embodiment, and the piezoelectric fabric of the present embodiment.

In other words, the biological information acquisition device of the present embodiment includes the piezoelectric substrate of the present embodiment, the piezoelectric textile of the present embodiment, or the piezoelectric fabric of the present embodiment.

The biological information acquisition device of the present embodiment is a device for detecting a biological signal of a test subject or a test animal (hereinafter also collectively referred to as "subject") by the above piezoelectric substrate, the above piezoelectric textile, or the above piezoelectric fabric, thereby acquiring the biological information of the subject.

Examples of such biological signals include a pulse wave signal (heart-rate signal), a respiratory signal, a body movement signal, a ballistocardiogram signal, or a biological tremor.

The biological tremor refers to a rhythmical, involuntary movement of the body site (such as the finger, the hand, the front arm, or the upper extremity).

Examples of the detection of the above ballistocardiogram signal include the detection of the effect of force due to the cardiac function of the body.

In other words, in a case in which the heart pumps blood through the aorta and the pulmonary artery, the body receives reaction force in a direction opposite to the bloodstream. The magnitude and direction of the reaction force vary with the functional stage of the heart. The reaction force is detected by sensing a ballistocardiogram signal on the outside of the body.

The biological information acquisition device is disposed and used on various articles such as various articles of clothing (shirts, suits, blazers, blouses, coats, jackets, blousons, jumpers, vests, one-piece dresses, trousers, pants, underwear (slips, petticoats, camisoles, and brassieres), socks, gloves, Japanese clothes, obi materials, gold brocades, cold-feeling clothing, neckties, handkerchiefs, mufflers, scarves, stoles, and eye masks), supporters (neck supporters, shoulder supporters, chest supporters, abdomen supporters, hip supporters, arm supporters, leg supporters, elbow supporters, knee supporters, wrist supporters, and ankle supporters), footwear (sneakers, boots, sandals, pumps, mules, slippers, ballet shoes, and kung fu shoes), insoles, face cloths, rucksacks, hats (hats, caps, caskets, hunting caps, ten-gallon hats, tulip hats, sun visors, and berets), helmets, chin straps for helmets, hoods, belts, seat covers, bed sheets, floor cushions, cushions, futons, quilt covers, blankets, pillows, pillow slips, sofas, chairs, desks, tables, sheets, seats, lavatory seats, massage chairs, beds, bed pats, carpets, baskets, masks, bandages, ropes, various nets, bathtubs, floor materials, wall materials, personal computers, and mice.

An article on which the weight of a subject is put, such as footwear, an insole, a bed sheet, a floor cushion, a cushion, a futon, a quilt cover, a pillow, a pillow slip, a sofa, a chair, a sheet, a seat, a lavatory seat, a bed, a carpet, a bathtub, or a floor material, is preferred as an article on which the biological information acquisition device is disposed. More specifically, a sheet for a baby buggy, a seat, a wheel, a stopper for preventing a baby from falling, or the like; a sheet for a wheelchair, a seat, or the like; a mat for a medical incubator; or the like is preferred.

An example of the operation of the biological information acquisition device will be described below.

The biological information acquisition device is disposed, for example, on a bed or on the seating face of a chair. A subject lies, is seated, or stands up on the biological information acquisition device. In a case in which a tension is applied to the piezoelectric substrate, piezoelectric textile, or piezoelectric fabric of the biological information acquisition device by a biological signal (such as body movement, a periodic vibration (such as a pulse or respiration), or a heart rate changed due to an emotion such as "affection" or "fear" of a human) produced from the subject in such a state, polarization occurs in a helical chiral polymer (A) included in the piezoelectric substrate, the piezoelectric textile, or the piezoelectric fabric, and a potential proportional to the tension is generated. The potential varies with time according to the biological signal produced from the subject. For example, in a case in which the biological signal produced from the subject is a periodic vibration such as a pulse or respiration, the potential generated in the piezoelectric substrate, the piezoelectric textile, or the piezoelectric fabric also periodically varies.

A time-dependent variation in potential generated by applying a tensile to the piezoelectric substrate, the piezoelectric textile, or the piezoelectric fabric is acquired as a voltage signal by a measurement module. The acquired time-dependent variation in potential (piezoelectric signal) is the synthetic wave of plural biological signals (a pulse wave signal (heart-rate signal), a respiratory signal, and a body movement signal). The synthetic wave is isolated according to each frequency by Fourier transformation, thereby generating isolation signals. Each biological signal corresponding to each of the isolation signals is obtained by inverse Fourier transformation of each of the generated isolation signals.

For example, in a case in which a biological signal produced from a subject is the synthetic wave of a heart-rate signal and a respiratory signal, as described in Example 12 later, a potential generated by applying a tension to the piezoelectric substrate, piezoelectric textile, or piezoelectric fabric of the biological information acquisition device periodically varies with time.

Commonly, a human pulse rate is from 50 to 90 beats per minute, and a human pulse frequency is from 0.6 to 3 Hz. Commonly, a human respiration rate is from 16 to 18 breaths per minute, and a human respiration frequency is from 0.1 to 1 Hz. Commonly, a human body movement frequency is 10 Hz or more.

The synthetic wave of plural biological signals can be isolated into each biological signal on the basis of such indices. For example, in the case of Example 12 described later, the synthetic wave can be isolated into a respiratory signal (FIG. 10) and a heart-rate signal (FIG. 11). A speed pulse wave signal (FIG. 12) can also be obtained from a heart-rate signal.

The synthetic wave of plural biological signals is isolated into each biological signal by the Fourier transformation and the inverse Fourier transformation, for example, using a biological signal notification program.

The synthetic wave of plural biological signals can be isolated into each of the plural biological signals in such a manner as described above.

Biological signal data may be generated based on at least one of the biological signals into which the isolation is performed in such a manner as described above.

The biological signal data is not particularly limited as long as being calculated based on a biological signal.

Examples of the biological signal data include the number of biological signals per unit time, and the average value of the numbers of past biological signals.

EXAMPLES

The invention will be more specifically described below by way of Examples. The invention is not limited to the following Examples unless departing from the gist of the invention.

<Production of Ribbon-Shaped Piezoelectric Material (Slit Ribbon)>

To 100 parts by mass of a polylactic acid (trade name: INGEO™ BIOPOLYMER, brand name: 4032D) manufactured by NatureWorks LLC as a helical chiral polymer (A), 1.0 part by mass of a stabilizer [a mixture of STABAXOL P400 (10 parts by mass) manufactured by Rhein Chemie Rheinau, STABAXOL I (70 parts by mass) manufactured by Rhein Chemie Rheinau, and CARBODILITE LA-1 (20 parts by mass) manufactured by Nisshinbo Chemical Inc.] was added, and dry-blended to produce a raw material.

The produced raw material was put in a hopper of an extrusion molding machine, extruded from a T-die while being heated at 210° C., and brought into contact with a cast roll at 50° C. for 0.3 minute to form a pre-crystallized sheet having a thickness of 150 μm (pre-crystallization step). The measured degree of crystallinity of the pre-crystallized sheet was 6%.

Stretching of the obtained pre-crystallized sheet was started at a stretching rate of 10 m/min by roll-to-roll while being heated to 70° C., and the sheet was stretched up to 3.5-fold uniaxially in the MD direction (stretching step). The obtained film had a thickness of 49.2 μm.

Then, the uniaxially stretched film was brought into contact with a roll heated to 145° C. by roll-to-roll for 15 seconds, thereby being subjected to annealing treatment, and then quenched to produce a piezoelectric film (annealing treatment step).

Then, the piezoelectric film was further slit to have a width of 0.6 mm using a slit processing machine so that a slitting direction and the direction of stretching the piezoelectric film are substantially parallel to each other. As a result, a slit ribbon having a width of 0.6 mm and a thickness of 49.2 μm was obtained as a ribbon-shaped piezoelectric material. The obtained slit ribbon had a rectangular cross-sectional shape.

<Production of Yarn-Shaped Piezoelectric Material>

A polylactic acid (having a melting point of 170° C., a heat of fusion of 38 J/g, a molar ratio of L-lactic acid/D-lactic acid of 98.5/1.5 (the content of the L-lactic acid is 98.5 mol %), and a number-average molecular weight of 85,000) was prepared as a helical chiral polymer (A).

The polylactic acid was supplied to an extruder type melt spinning machine, and melt-kneaded. Melt spinning was performed at a spinning temperature of 225° C. from a spinneret, followed by cooling a line of yarn and applying an oil solution to the line. Subsequently, the line was subjected to hot stretching between heat rollers heated to 150° C. without temporarily winding up the line, and was wound up. As a result, a yarn-shaped piezoelectric material (multifilament) having a total fineness of 295 dtex (No. 20 count: major axis diameter of 2.7 μm) was obtained as a yarn-shaped piezoelectric material.

<Measurement of Physical Properties of Ribbon-Shaped Piezoelectric Material and Yarn-Shaped Piezoelectric Material>

The following measurement of the physical properties of the ribbon-shaped piezoelectric material and the yarn-shaped piezoelectric material obtained as described above was performed. The results are listed in Table 1.

<Orientation Degree F. of Polylactic Acid>

Using a wide-angle X-ray diffractometer (RINT 2550 manufactured by Rigaku Corporation, attachment device: rotational sample table, X-ray source: CuKα, output: 40 k, 370 mA, detector: scintillation counter), the sample (the ribbon-shaped piezoelectric material or the yarn-shaped piezoelectric material) was fixed on a holder, and the azimuth angle distribution intensity of a crystal plane peak [(110) plane/(200) plane] was measured.

In the obtained azimuth angle distribution curve (X-ray interferogram), the orientation degree F. (C-axis orientation degree) of the polylactic acid was calculated and evaluated from the following Formula on the basis of the degree of crystallinity and the half width of the peak (α).

$$\text{orientation degree (F.)} = (180° - \alpha)/180°$$

(α refers to the half width of the peak derived from orientation)

TABLE 1

| Kind of piezoelectric material | Material | Shape | Degree of crystallinity | Orientation degree F. |
|---|---|---|---|---|
| Ribbon-shaped piezoelectric material | Polylactic acid | Slit ribbon | 45% | 0.97 |
| Yarn-shaped piezoelectric material | Polylactic acid | Yarn (multifilament) | 56% | 0.81 |

Example 1

<Production of Piezoelectric Substrate>

A piezoelectric substrate having a configuration similar to the configuration of the piezoelectric substrate 10 illustrated in FIG. 1A and further including a copper foil ribbon as a first outer conductor (ground conductor) was produced by a method described below.

A tinsel wire U24-01-00 (wire outer diameter of 0.3 mm, length of 250 mm) manufactured by MEISEI INDUSTRY CO., LTD. was prepared as an inner conductor (signal line conductor). The tinsel wire used, in which a meta-aramid fiber (No. 40 count, two-ply) was used as a central wire and two rolled copper foils (0.3 mm in width×0.02 mm in thickness) was used, was helically wound and wrapped 22 times per 10 mm in a two-ply manner in a left-handed manner so that the central wire was not exposed. Crimp terminals were crimped and disposed as an electrical connection and a mechanical connection at both ends of the tinsel wire.

Then, the ribbon-shaped piezoelectric material (slit ribbon) having a width of 0.6 mm and a thickness of 49.2 μm, obtained as described above, was helically wound in a left-handed manner around the tinsel wire so that the ribbon-shaped piezoelectric material was directed at a direction at 45° (at a helix angle of 45°) with respect to the major axis direction of the tinsel wire, and without any gap so that the tinsel wire is prevented from being exposed and seen. The ribbon-shaped piezoelectric material was thus wrapped around the tinsel wire. "Left-handed" means that the ribbon-shaped piezoelectric material was wound in a left-handed manner from the front to back sides of the signal line conductor as viewed from one end (right end in the case of FIG. 1A) of the signal line conductor (tinsel wire) in an axial direction.

Then, in order to mechanically integrate the tinsel wire and the ribbon-shaped piezoelectric material with each other, ARON ALPHA (cyanoacrylate adhesive agent), manufactured by Toagosei Co., Ltd., as an adhesive agent was dropped to a portion around which the ribbon-shaped piezoelectric material had been wound, and the portion was impregnated with the ARON ALPHA to bond the tinsel wire and the ribbon-shaped piezoelectric material to each other.

Then, a copper foil ribbon with an adhesive agent, slit to have a width of 0.6 mm, was prepared. By a method similar to the method for the ribbon-shaped piezoelectric material, the copper foil ribbon was wound and wrapped around the ribbon-shaped piezoelectric material without any gap so that the ribbon-shaped piezoelectric material was not exposed.

The piezoelectric substrate of Example 1 was obtained as described above.

The tinsel wire corresponds to the inner conductor 12A in FIG. 1A. The ribbon-shaped piezoelectric material corresponds to the first piezoelectric material 14A in FIG. 1A. The adhesive agent, which is not illustrated in FIG. 1A, is arranged between the inner conductor 12A and the first piezoelectric material 14A. The ground conductor is not illustrated in FIG. 1A, either.

<Evaluation>

Figure 9:
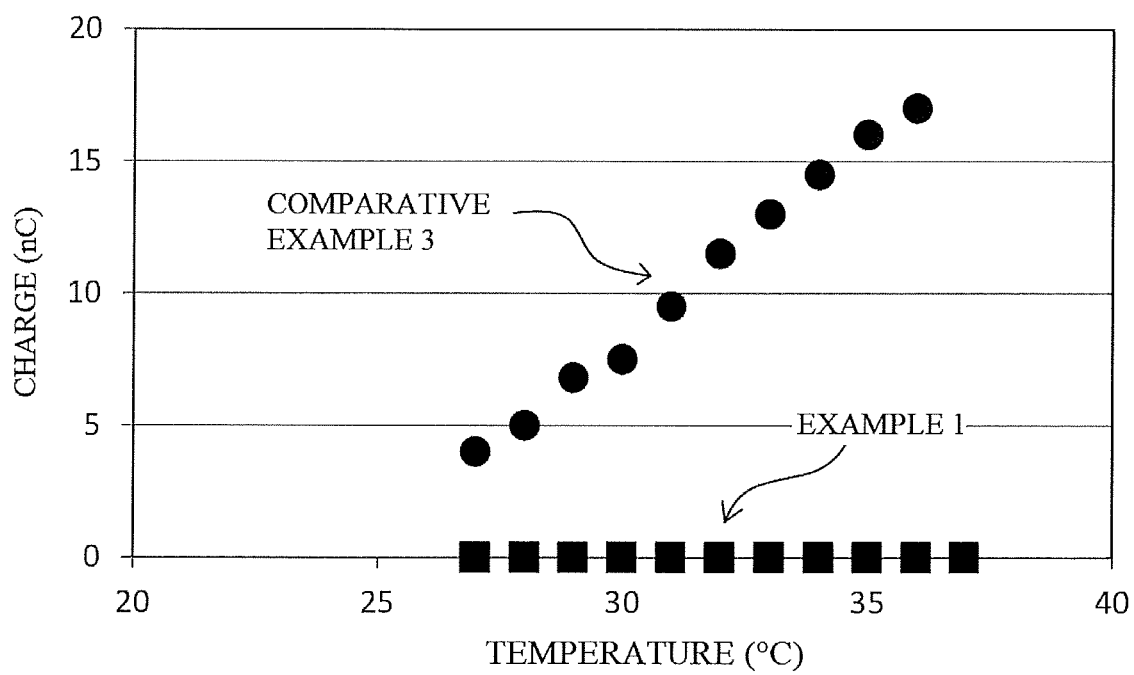
FIG. 9 is a graph illustrating each relationship between a temperature and the amount of generated charge in Example 1 and Comparative Example 3.

With the use of the obtained piezoelectric substrate of Example 1, the amount of charge generated in the case of applying a tensile force to the piezoelectric substrate (the amount of generated charge) was measured, and the amount of generated charge per unit tensile force was calculated from the amount of generated charge. The results are listed in Table 2. For Example 1, the amount of generated charge with a change in temperature was also evaluated. The results are illustrated in FIG. 9.

(Amount of Generated Charge Per Unit Tensile Force)

The piezoelectric substrate of Example 1 as a sample was chucked in a tensile testing machine (TENSILON RTG1250 manufactured by A&D Company, Limited) set to have a distance between chucks of 200 mm.

A stress in a triangular wave form was repeatedly, periodically applied to the sample at 0.2 Hz in a stress range of from 1.5 N to 4.5 N by the tensile testing machine, and the amount of charge generated on both sides of the sample in such a case was measured with an electrometer (617, manufactured by Keithley Instruments, Inc.).

The amount of generated charge per unit tensile force was calculated from the gradient of a correlation straight line in a scatter diagram in which the measured amount Q [C] of generated charge is indicated on the Y-axis, and the tensile force F [N] of the sample is indicated on the X-axis.

(Evaluation of Amount of Generated Charge in Change in Temperature)

The piezoelectric substrate of Example 1 as a sample was connected to an electrometer (617, manufactured by Keithley Instruments, Inc.), and set in an oven set at 40° C. in a state in which a thermocouple is brought into intimate contact with the sample. The amount of generated charge was evaluated.

FIG. 9 is a graph illustrating a relationship between a temperature and the amount of generated charge. As illustrated in FIG. 9, in the piezoelectric substrate of Example 1, a charge was found to be hardly changed in nC order in an increase in temperature from ordinary temperature to around 10° C. As a result, in the piezoelectric substrate of Example 1, a charge was confirmed to be hardly charged due to pyroelectricity.

(Evaluation of Resistance to Plastic Deformation)

In order to evaluate the resistance to plastic deformation of the piezoelectric substrate of Example 1, the piezoelectric substrate was wound two times around a circular column including bakelite having a diameter of 1 cm, the circular column was removed after the winding, and whether or not the circular shape was maintained was evaluated by visual observation.

A piezoelectric substrate, in which a change over time hardly occurred after the removal of the circular column, and the circular shape was maintained, was evaluated as B, while a piezoelectric substrate, in which spring back occurred due to a spring property, and the circular shape was not maintained, and which was restored to the former state thereof, was considered to have high resistance to plastic deformation and evaluated as A. The results are listed in Table 2.

Example 2

The same operation as the operation of Example 1 was carried out except that the direction of winding the ribbon-shaped piezoelectric material was a right-handed direction. The results are listed in Table 2.

Example 3

The same operation as the operation of Example 2 was carried out except that the adhesive agent with which the ribbon-shaped piezoelectric material and the tinsel wire were bonded to each other was not used. The results are listed in Table 2.

Example 4

The same operation as the operation of Example 1 was carried out except that a bundle of the three yarn-shaped piezoelectric materials produced as described above was used instead of the ribbon-shaped piezoelectric material. The results are listed in Table 2.

Figure 8:
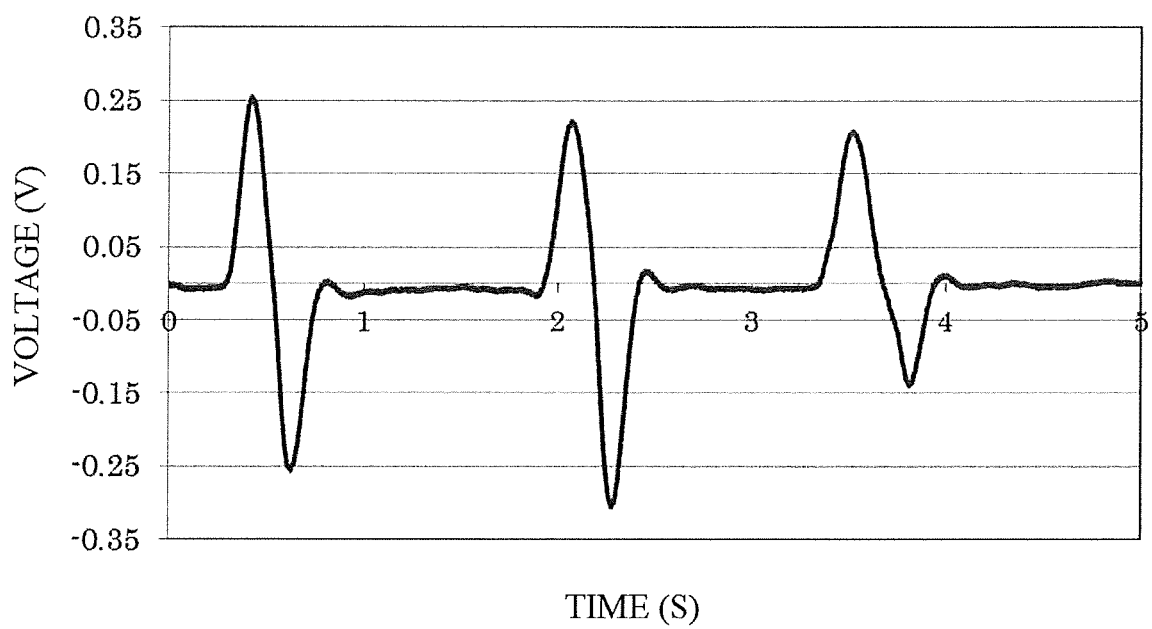
FIG. 8 is a graph illustrating a voltage waveform in the case of applying a tensile stress in Example 4.

For Example 4, a voltage waveform in the case of applying a tensile stress to the piezoelectric substrate was measured. The results are illustrated in FIG. 8.

Example 5

The same operation as the operation of Example 4 was carried out except that the direction of winding (the bundle) of the three yarn-shaped piezoelectric materials was a right-handed direction. The results are listed in Table 2.

Like Example 4, a voltage waveform in the case of applying a tensile stress to the piezoelectric substrate was also measured for Example 5.

—Measurement of Voltage Waveform—

For Examples 4 or 5, the voltage waveform in the case of applying the tensile stress to the piezoelectric substrate was measured.

FIG. 8 is a graph illustrating the voltage waveform in the case of applying the tensile stress to the piezoelectric substrate in Example 4.

As illustrated in FIG. 8, it was observed that the voltage waveform in Example 4 was a waveform in which a voltage formed a reverse phase due to the application of the tension and relaxation. As a result, the piezoelectric substrate in Example 4 was found to generate a voltage by a shear force (shear piezoelectricity).

It was observed that the polarity of the generated voltage in the voltage waveform in Example 5 was inverted with respect to that in the voltage waveform in Example 4 (not illustrated). This can be considered to be because the yarn-shaped piezoelectric materials in Example 4 and Example 5 were wound in the directions reverse to each other (in the left-handed manner in Example 4 and in the right-handed manner in Example 5).

Thus, since both the piezoelectric substrates in Examples 4 and 5 had piezoelectricity due to a shear force, the piezoelectric substrates were found to be applicable to sensor applications and actuator applications.

Example 6

The same operation as the operation of Example 4 was carried out except that a bundle of five yarn-shaped piezoelectric materials was used instead of the bundle of the three yarn-shaped piezoelectric materials. The results are listed in Table 2.

Example 7

The same operation as the operation of Example 6 was carried out except that the direction of winding (the bundle of) the five yarn-shaped piezoelectric materials was a right-handed direction. The results are listed in Table 2.

Example 8

<Production of Piezoelectric Substrate>

A piezoelectric substrate having a configuration similar to the configuration of the piezoelectric substrate 10C illustrated in FIG. 4 and further including a cellophane tape as an insulator and a copper foil ribbon as a ground conductor was produced by a method described below.

A tinsel wire U24-01-00 (wire outer diameter of 0.3 mm, length of 250 mm) manufactured by MEISEI INDUSTRY CO., LTD. was prepared as a signal line conductor.

Then, with the use of a yarn-shaped piezoelectric material similar to (the bundle of) the three yarn-shaped piezoelectric materials used in Example 5, the tinsel wire and the yarn-shaped piezoelectric material were rotated and twisted 400 times (at a winding number of 400) per meter about the same pivot so that the yarn-shaped piezoelectric material was wound in a right-handed manner. Thus, two-ply twist yarn was made.

"Right-handed" means that the yarn-shaped piezoelectric material was wound in a right-handed manner from the front side to back side of the pivot as viewed from one end (right end in the case of FIG. 4) of the pivot direction of the twisted yarn.

Then, a cellophane tape having a width of 0.5 mm and a thickness of 50 μm was helically wound and wrapped as an insulator without any gap around the twisted yarn.

Then, a copper foil ribbon similar to the copper foil ribbon used in Example 1 was used, wound, and wrapped without any gap around the cellophane tape by a method similar to the method of Example 1 so that the cellophane tape is not exposed.

The piezoelectric substrate of Example 8 was obtained as described above. Evaluation similar to the evaluation of Example 1 was carried out. The results are listed in Table 2.

The tinsel wire corresponds to the conductor 12B in FIG. 4. The yarn-shaped piezoelectric material corresponds to the first piezoelectric material 14C in FIG. 4. Neither the cellophane tape nor the ground conductor is illustrated in FIG. 4.

Example 9

The same operation as the operation of Example 8 was carried out except that a bundle of five yarn-shaped piezoelectric materials was used instead of the bundle of the three yarn-shaped piezoelectric materials, and a tinsel wire and the yarn-shaped piezoelectric materials were rotated and twisted 333 times per meter (at a winding number of 333) so that the yarn-shaped piezoelectric materials were wound in a left-handed manner. The results are listed in Table 2.

Example 10

The same operation as the operation of Example 9 was carried out except that a signal line conductor and the yarn-shaped piezoelectric materials were twisted so that the yarn-shaped piezoelectric materials were wound in a right-handed manner. The results are listed in Table 2.

Example 11

A piezoelectric substrate of which the configuration was similar to the configuration of the piezoelectric substrate 10D included in the force sensor 40 illustrated in FIG. 7 was produced by a method described below.

The same operation as the operation of Example 1 was carried out except that a ribbon-shaped piezoelectric material in which Al deposited films were formed on both sides of a principal plane of the ribbon-shaped piezoelectric material (hereinafter also referred to as "piezoelectric material with double-sided Al deposited films") was used instead of the ribbon-shaped piezoelectric material, and a tinsel wire U24-01-00 (wire outer diameter of 0.3 mm, length of 250 mm), manufactured by MEISEI INDUSTRY CO., LTD., as a ground conductor, was wound around the piezoelectric material with double-sided Al deposited films so that the piezoelectric material with double-sided Al deposited films was moderately exposed. The results are listed in Table 2.

For Example 11, a force sensor of which the configuration was similar to the configuration of the force sensor 40 illustrated in FIG. 7 was also produced as described below.

Then, a cylindrically-shaped rubber heat-shrinkable tube (hereinafter also simply referred to as "shrinkable tube") was arranged so as to cover the entire of the piezoelectric substrate described above, and both ends of the shrinkable tube were crimped in the crimp portions of a pair of crimp terminals. As a result, the force sensor was produced.

The force sensor corresponds to the force sensor 40 in FIG. 7. The piezoelectric substrate corresponds to the piezoelectric substrate 10D in FIG. 7. The tinsel wire included in the piezoelectric substrate corresponds to the inner conductor 12C in FIG. 7. The piezoelectric material with double-sided Al deposited films corresponds to the first piezoelectric material 14D in FIG. 7. The copper foil ribbon corresponds to the first outer conductor 42 in FIG. 7. The shrinkable tube corresponds to the second insulator 44 in FIG. 7. The crimp terminal corresponds to the crimp terminal 46 in FIG. 7, and the crimp portion corresponds to the crimp portion 46b in FIG. 7.

Example 14

The same operation as the operation of Example 1 was carried out except that a polyurethane-coated copper wire having a diameter of 0.5 mm was used as an inner conductor instead of the tinsel wire, the direction of winding a ribbon-shaped piezoelectric material was a left-handed direction, and any adhesive agent with which a tinsel wire and the ribbon-shaped piezoelectric material were bonded to each other was not used. The results are listed in Table 2.

Example 15

The same operation as the operation of Example 14 was carried out except that the direction of winding a ribbon-shaped piezoelectric material was a right-handed direction. The results are listed in Table 2.

Example 16

The same operation as the operation of Example 1 was carried out except that a polyurethane-coated copper wire having a diameter of 0.2 mm was used as an inner conductor instead of the tinsel wire, the direction of winding a ribbon-shaped piezoelectric material was a left-handed direction, and any adhesive agent with which a tinsel wire and the ribbon-shaped piezoelectric material were bonded to each other was not used. The results are listed in Table 2.

Example 17

The same operation as the operation of Example 16 was carried out except that the direction of winding a ribbon-shaped piezoelectric material was a right-handed direction. The results are listed in Table 2.

Example 18

Any adhesive agent for mechanically integrating a tinsel wire as an inner conductor and a ribbon-shaped piezoelectric material was not used, a rolled copper foil ribbon (without any adhesive agent) with a straight-angle cross section having a width of 0.3 mm and a thickness of 30 μm was prepared as an outer conductor, and the rolled copper foil ribbon was wound and wrapped in a right-handed manner without any gap around the helically wound ribbon-shaped piezoelectric material so that the ribbon-shaped piezoelectric material was not exposed. The same operation as the operation of Example 1 was carried out except such a manner. The results are listed in Table 2.

Example 19

The same operation as the operation of Example 18 was carried out except that the direction of winding a ribbon-shaped piezoelectric material was a right-handed direction. The results are listed in Table 2.

Comparative Example 1

The same operation as the operation of Example 4 was carried out except that (a bundled of) three yarn-shaped piezoelectric materials was arranged in parallel to a tinsel wire. The results are listed in Table 2.

Comparative Example 2

(A bundled of) three yarn-shaped piezoelectric materials was helically wound in a left-handed manner around a tinsel wire from one end of the tinsel wire to a position, one-half of the length thereof in an axial direction. Then, the yarn-shaped piezoelectric materials were helically wound in the right-handed direction of winding the yarn-shaped piezoelectric materials from the half position to the other end of the tinsel wire in the axial direction. The same operation as the operation of Example 4 was carried out except such a winding method. The results are listed in Table 2.

Comparative Example 3

The same operation as the operation of Example 1 was carried out except that a ribbon-shaped piezoelectric material having a width of 0.6 mm and a thickness of 50 µm and including polyvinylidene fluoride (PVDF manufactured by KUREHA CORPORATION, trademark: KF PIEZO film, piezoelectric constant $d_{31}$=21 pC/N, relative dielectric constant $\varepsilon_{33}/\varepsilon_0$=18) was used instead of the ribbon-shaped piezoelectric material including a polylactic acid. The results are listed in Table 2.

For Comparative Example 3, the amount of generated charge with a change in temperature was also evaluated by a method similar to the method of Example 1. The results are illustrated in FIG. 9.

FIG. 9 is a graph illustrating a relationship between a temperature and the amount of generated charge. In the piezoelectric substrate of Comparative Example 3, the amount of generated charge was found to greatly increase with increasing the temperature of an oven, as illustrated in FIG. 9. More specifically, a charge in an amount in nC order was confirmed to be generated in the piezoelectric substrate of Comparative Example 3. In other words, in the piezoelectric substrate of Comparative Example 3, a change in temperature to such a degree was found to preclude detection of a voltage signal to be evaluated under cover of a charge due to pyroelectricity in a case in which a weaker strain signal (voltage signal) in pC order was detected.

Comparative Example 4

The same operation as the operation of Comparative Example 3 was carried out except that the direction of winding a ribbon-shaped piezoelectric material was a right-handed direction. The results are listed in Table 2.

The details of the configurations and evaluation results of the piezoelectric substrates in Examples 1 to 11 and Comparative Examples 1 to 4 are summarized in Table 2.

TABLE 2

| Example No. | Signal line conductor Kind | Signal line conductor Bonding material | Piezoelectric material Material | Piezoelectric material Form | Piezoelectric material Winding direction | Piezoelectric material Orientation degree F. | Positional relationship between signal line conductor and piezoelectric material | Winding number [times/m] | Ground conductor | Applied force | Evaluation Amount of generated charge per unit tensile force [pC/N] | Evaluation Pyroelectricity | Evaluation Resistance to plastic deformation |
|---|---|---|---|---|---|---|---|---|---|---|---|---|---|
| Example 1 | Tinsel wire | Cyanoacrylate | Polylactic acid | Slit ribbon | Left | 0.97 | Coaxial winding | — | Copper foil with pressure sensitive adhesive | Tension | 820 | Absence | A |
| Example 2 | Tinsel wire | Cyanoacrylate | Polylactic acid | Slit ribbon | Right | 0.97 | Coaxial winding | — | Copper foil with pressure sensitive adhesive | Tension | −918 | Absence | A |
| Example 3 | Tinsel wire | None | Polylactic acid | Slit ribbon | Right | 0.97 | Coaxial winding | — | Copper foil with pressure sensitive adhesive | Tension | −155 | Absence | A |
| Example 4 | Tinsel wire | Cyanoacrylate | Polylactic acid | No. 20 yarn × 3 | Left | 0.81 | Coaxial winding | — | Copper foil with pressure sensitive adhesive | Tension | 285 | Absence | A |
| Example 5 | Tinsel wire | Cyanoacrylate | Polylactic acid | No. 20 yarn × 3 | Right | 0.81 | Coaxial winding | — | Copper foil with pressure sensitive adhesive | Tension | −191 | Absence | A |
| Example 6 | Tinsel wire | Cyanoacrylate | Polylactic acid | No. 20 yarn × 5 | Left | 0.81 | Coaxial winding | — | Copper foil with pressure sensitive adhesive | Tension | 122 | Absence | A |
| Example 7 | Tinsel wire | Cyanoacrylate | Polylactic acid | No. 20 yarn × 5 | Right | 0.81 | Coaxial winding | — | Copper foil with pressure sensitive adhesive | Tension | −125 | Absence | A |
| Example 8 | Tinsel wire | Cyanoacrylate | Polylactic acid | No. 20 yarn × 3 | Right | 0.81 | Twisting | 400 | Copper foil with pressure sensitive adhesive | Tension | −60.2 | Absence | A |
| Example 9 | Tinsel wire | Cyanoacrylate | Polylactic acid | No. 20 yarn × 5 | Left | 0.81 | Twisting | 333 | Copper foil with pressure sensitive adhesive | Tension | 130 | Absence | A |
| Example 10 | Tinsel wire | Cyanoacrylate | Polylactic acid | No. 20 yarn × 5 | Right | 0.81 | Twisting | 333 | Copper foil with pressure sensitive adhesive | Tension | −67.7 | Absence | A |
| Example 11 | Tinsel wire | Cyanoacrylate | Polylactic acid | Double-sided Al-deposited slit ribbon | Left | 0.81 | Coaxial winding | — | Wound tinsel wire | Tension | 533 | Absence | A |
| Example 14 | Copper wire φ 0.5 mm | None | Polylactic acid | Slit ribbon | Left | 0.97 | Coaxial winding | — | Copper foil | Tension | 59.09 | Absence | B |
| Example 15 | Copper wire φ 0.5 mm | None | Polylactic acid | Slit ribbon | Right | 0.97 | Coaxial winding | — | Copper foil | Tension | −21.6 | Absence | B |
| Example 16 | Copper wire φ 0.2 mm | None | Polylactic acid | Slit ribbon | Left | 0.97 | Coaxial winding | — | Copper foil | Tension | 45.8 | Absence | B |
| Example 17 | Copper wire φ 0.2 mm | None | Polylactic acid | Slit ribbon | Right | 0.97 | Coaxial winding | — | Copper foil | Tension | −45.4 | Absence | B |
| Example 18 | Tinsel wire | None | Polylactic acid | Slit ribbon | Left | 0.97 | Coaxial winding | — | Copper foil | Tension | 2886 | Absence | A |
| Example 19 | Tinsel wire | None | Polylactic acid | Slit ribbon | Right | 0.97 | Coaxial winding | — | Copper foil | Tension | −1762 | Absence | A |
| Comparative Example 1 | Tinsel wire | Cyanoacrylate | Polylactic acid | No. 20 yarn × 3 | None | 0.81 | Parallel | — | Copper foil with pressure sensitive adhesive | Tension | Not observed | Absence | A |
| Comparative Example 2 | Tinsel wire | Cyanoacrylate | Polylactic acid | No. 20 yarn × 3 | Both right and left | 0.81 | Coaxial winding | — | Copper foil with pressure sensitive adhesive | Tension | Not observed | Absence | A |

TABLE 2-continued

| Example No. | Signal line conductor | | Piezoelectric material | | | | Positional relationship between signal line conductor and piezoelectric material | Winding number [times/m] | Ground conductor | Evaluation | | | |
| --- | --- | --- | --- | --- | --- | --- | --- | --- | --- | --- | --- | --- | --- |
| | Kind | Bonding material | Material | Form | Winding direction | Orientation degree F. | | | | Applied force | Amount of generated charge per unit tensile force [pC/N] | Pyroelectricity | Resistance to plastic deformation |
| Comparative Example 3 | Tinsel wire | Cyanoacrylate | PVDF | Slit ribbon | Left | — | Coaxial winding | — | Copper foil with pressure sensitive adhesive | Tension | 1635 | Presence | A |
| Comparative Example 4 | Tinsel wire | Cyanoacrylate | PVDF | Slit ribbon | Right | — | Coaxial winding | — | Copper foil with pressure sensitive adhesive | Tension | −1839 | Presence | A |

As shown in Table 2, each of the piezoelectric substrates in Examples 1 to 11 was found to include the piezoelectric material (the ribbon-shaped piezoelectric material or the yarn-shaped piezoelectric material) helically wound in one direction around the signal line conductor, thereby exhibiting piezoelectricity by applying a tension. This can be considered to be because in each of the piezoelectric substrates in Examples 1 to 11, the direction of arranging the piezoelectric material wound around the signal line conductor (the lengthwise direction of the piezoelectric material) and the principal orientation direction of the helical chiral polymer (A) are substantially parallel to each other, and the application of the tension to the piezoelectric substrate caused polarization to effectively occur in the helical chiral polymer (A) included in the piezoelectric material.

The more amount (absolute value) of generated charge per unit tensile force was found to be obtained in Example 3 in which the signal line conductor and the piezoelectric material were bonded to each other with the adhesive agent than in Example 2 in which such an adhesive agent was not used.

The amount of generated charge per unit tensile force was not observed in the piezoelectric substrate in Comparative Example 1, including the yarn-shaped piezoelectric material arranged in parallel to the signal line conductor.

In each of Comparative Examples 3 and 4, including polyvinylidene fluoride (PVDF) as the piezoelectric material, the great value of the amount (absolute value) of generated charge per unit tensile force was measured; however, since PVDF has pyroelectricity, a piezoelectric output was found to become unstable due to an environmental variation.

More specifically, Example 1, including the polylactic acid (ribbon-shaped piezoelectric material) as the piezoelectric material, was found to result in almost no charge variance due to pyroelectricity and to be therefore superior in stability against a change in temperature to Comparative Example 3, including PVDF (ribbon-shaped piezoelectric material) as the piezoelectric material, in Example 1 and Comparative Example 3, including the piezoelectric material helically wound in one direction around the signal line conductor, as illustrated in FIG. 9.

Example 12

(Measurement of Respiration and Heart Rate)

In Example 12, the respiration and heart rate of a test subject were measured using the evaluation sample (piezoelectric substrate) in Example 1 as a biological information acquisition device. The details thereof will be described below.

A piezoelectric substrate having the same structure as the structure of the piezoelectric substrate described in Example 1 and having a length of 20 cm was produced. The piezoelectric substrate was sandwiched between two polyimide pressure sensitive adhesive tapes having a thickness of 50 µm, a width of 5 mm, and a length of 25 cm, and an outer conductor was coated with an insulator including a polyimide film. A nylon fabric tape having an adjustable length was bonded to the coated evaluation sample (sensor), and the resulting object was allowed to have a ring shape, to constrict the abdomen, and to adjust a tension applied to the sensor.

The evaluation sample (sensor) was placed on a chair, and the test subject (the target for measurement of the respiration and the heart rate) was then seated on the sensor.

In such a state, the electrodes of the inner and outer conductors of the sensor were connected electrically to a coaxial cable, a biological signal of the test subject was extracted through an extraction electrode, and the extracted biological signal was input into a personal computer (PC) through an operational amplifier and an AD conversion machine (NI USB-6210, manufactured by National Instruments Corporation).

The signal input into the PC (a change of a potential over time; the synthetic wave of a respiratory signal and a heart-rate signal) was subjected to fast Fourier transform, thereby removing a component at 1 Hz or more, subjected to inverse Fourier transformation, thereby removing a respiratory signal corresponding to respiration (FIG. 10) and a signal outside a range of from 5 Hz to 15 Hz, and subjected to inverse Fourier transformation, thereby being isolated into a heart-rate signal corresponding to a heart rate (FIG. 11). The heart-rate signal corresponding to a heart rate was further differentiated, thereby obtaining a speed pulse signal (FIG. 12).

Figure 10:
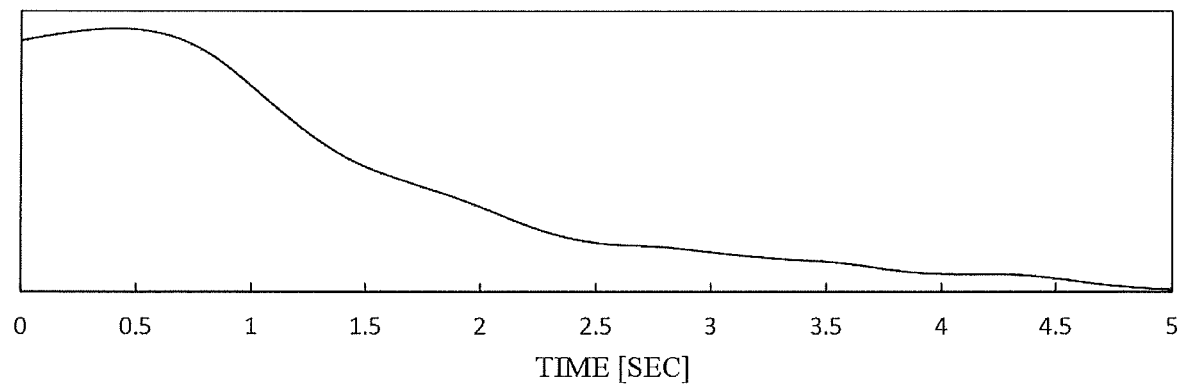
FIG. 10 is a graph illustrating a respiratory signal isolated from the synthetic wave of respiratory and heart-rate signals in Example 12.
Figure 11:
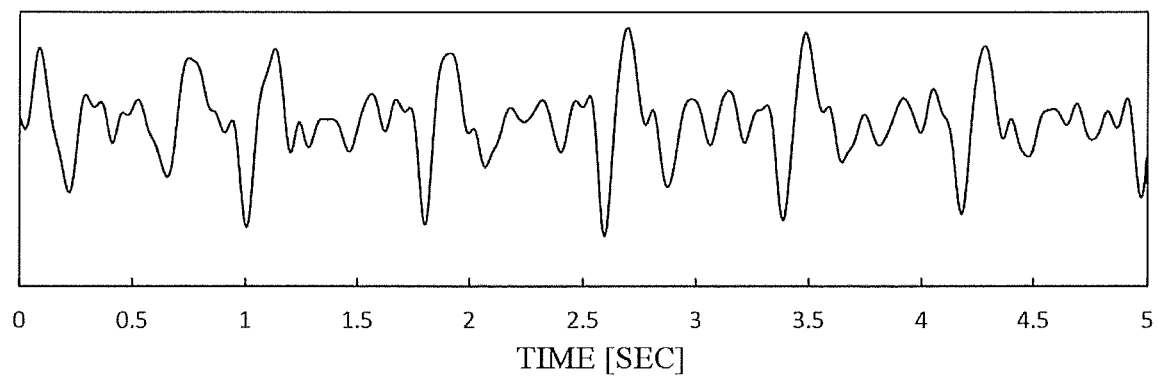
FIG. 11 is a graph illustrating a heart-rate signal isolated from the synthetic wave of respiratory and heart-rate signals in Example 12.
Figure 12:
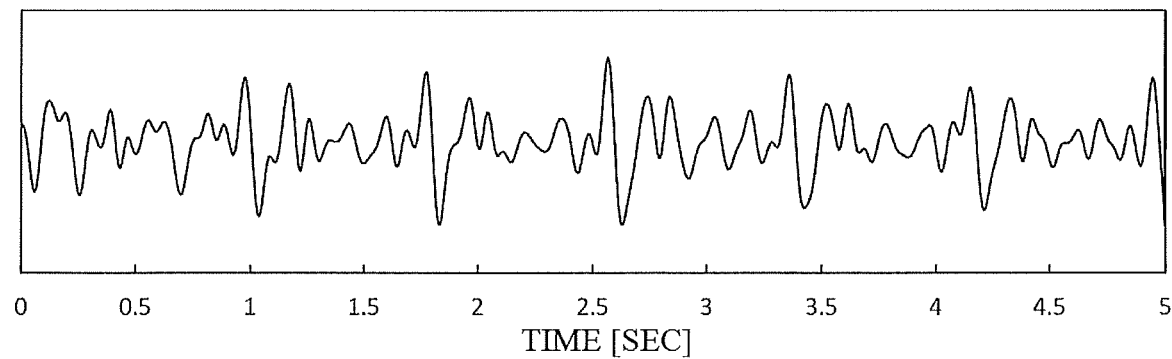
FIG. 12 is a graph illustrating a speed pulse wave signal generated from the heart-rate signal of FIG. 11 in Example 12.

In FIG. 10 to FIG. 12, time (second) is indicated on the abscissa axis, while a potential is indicated on the ordinate axis.

Example 13

Figure 13:
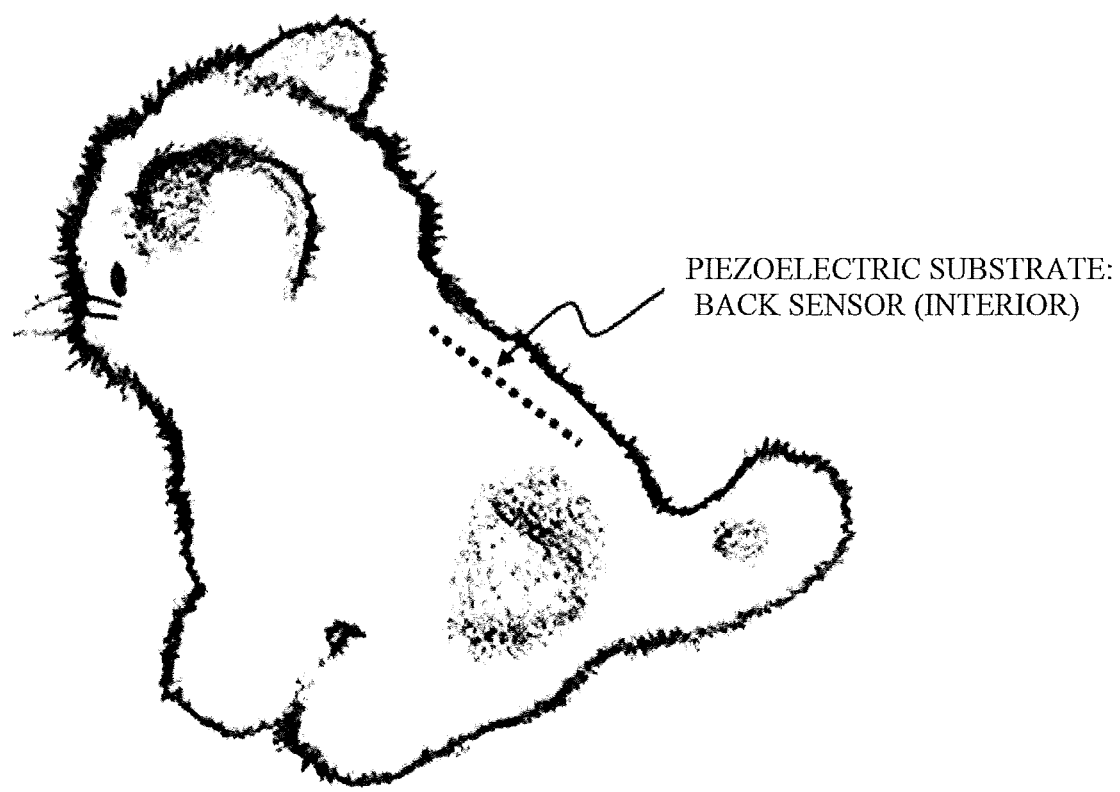
FIG. 13 is a view illustrating a stuffed toy cat equipped with a back sensor in Example 13.
Figure 14:
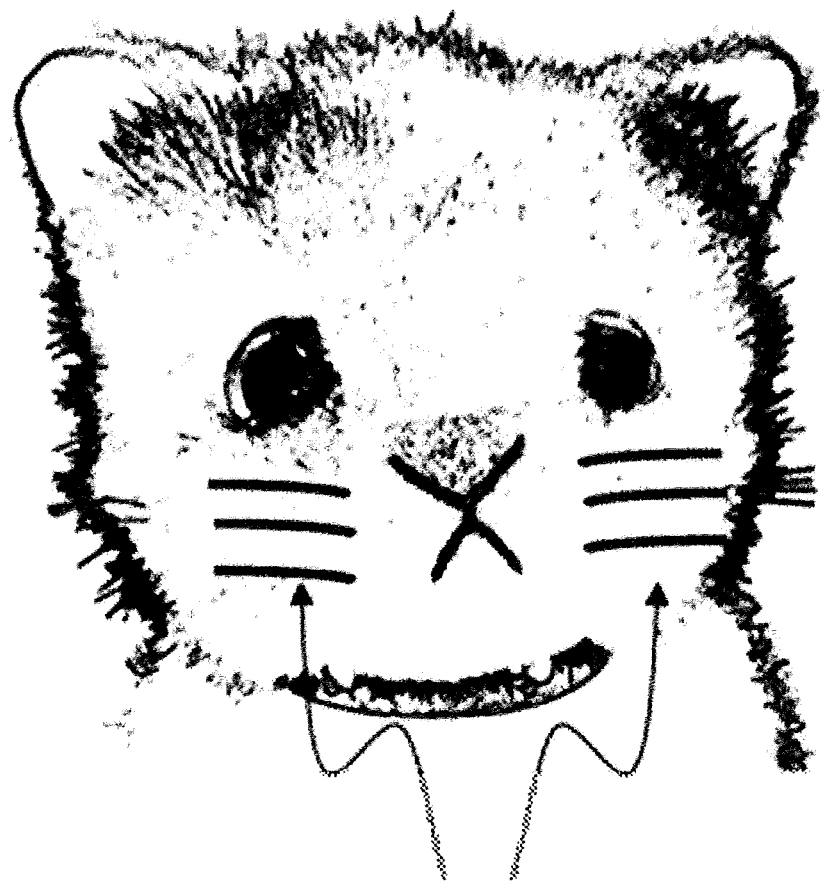
FIG. 14 is a view illustrating the stuffed toy cat equipped with a whisker sensor in Example 13.

Cotton was taken out of a stuffed toy cat. A piezoelectric substrate of 90 mm in length produced in a manner similar to the manner of Example 1 was fixed into the interior of the back of the stuffed toy cat with an adhesive agent (CEMEDINE SUPER X manufactured by CEMEDINE CO., LTD.), and allowed to be a back sensor (contact sensor). The inner and outer conductors of six piezoelectric substrates of 50 mm in length produced in a manner similar to the manner of Example 1 were collectively connected, and the three piezoelectric substrates were exposed from each of the right and left interiors of the buccal regions of the stuffed toy cat, and allowed to be whisker sensors (contact sensors). In each sensor, a lead wire for connection was attached to each of the inner and outer conductors. After the placement of the sensors, the cotton that had been taken out was repacked into the stuffed toy. The stuffed toy cat to which the back sensor was attached is illustrated in FIG. 13, while the stuffed toy cat to which the whisker sensors were attached was illustrated in FIG. 14.

Outputs from the lead wires attached to the back sensor and the whisker sensors were passed through a CR filter having a cut-off frequency of 50 Hz through a buffer amplifier, and the signals passed through the CR filter were input into a personal computer (PC) through an AD conversion machine (NI USB-6210, manufactured by National Instruments Corporation).

Figure 15:
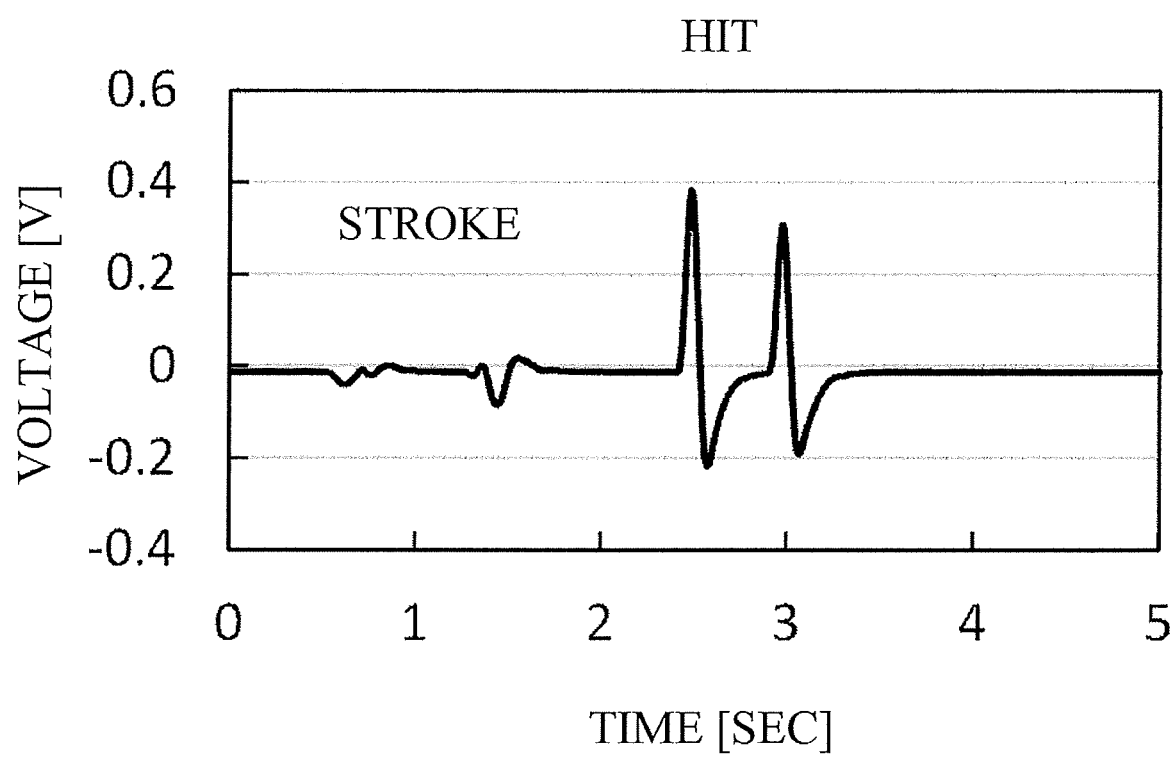
FIG. 15 is a graph illustrating voltage outputs in the cases of stroking and hitting the back of the stuffed toy cat equipped with the back sensor in Example 13.
Figure 16:
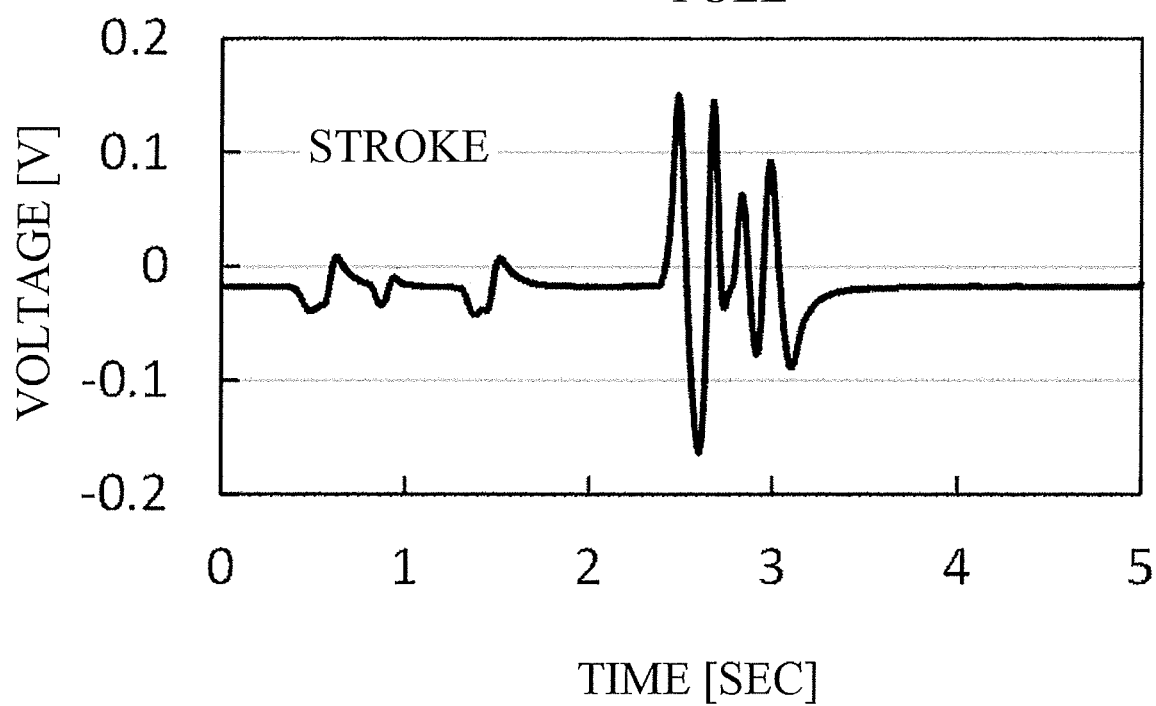
FIG. 16 is a graph illustrating voltage outputs in the cases of stroking and pulling the whiskers of the stuffed toy cat equipped with the whisker sensor in Example 13.

The signals input into the PC are illustrated in FIGS. 15 and 16. As illustrated in FIG. 15, the back sensor exhibits greatly varying voltage outputs in the case of stroking the back of the stuffed toy and in the case of hitting the back of the stuffed toy. Each action such as stroking or hitting can be determined by setting the threshold value of a voltage. As illustrated in FIG. 16, the whisker sensor exhibits greatly varying voltage outputs in the case of stroking the whiskers of the stuffed toy and in the case of pulling the whiskers of the stuffed toy. Each action such as stroking or hitting can be determined by setting the threshold value of a voltage.

Japanese Patent Application No. 2015-255062 filed on Dec. 25, 2015, Japanese Patent Application No. 2016-106171 filed on May 27, 2016, and Japanese Patent Application No. 2016-173004 filed on Sep. 5, 2016 are incorporated herein by reference in their entirety.

All the documents, patent applications, and technical standards described here are incorporated herein by reference to the same extent as the case in which each individual document, patent application, or technical standard is specifically and individually indicated to be incorporated by reference.

REFERENCE SIGNS LIST 10, 10A, 10B, 10C, 10D, 10E, 10F Piezoelectric substrate
12A, 12C Inner conductor
12B Conductor
13 Outer conductor
14A, 14C, 14D First piezoelectric material
14B Second piezoelectric material
16 Insulating yarn
20 Piezoelectric fabric
22 Ground conductor (example of second outer conductor)
24 Insulator film (example of third insulator)
26 Tinsel wire (example of inner conductor)
30 Piezoelectric device
40 Force sensor
42 Ground conductor (example of first outer conductor)
44 Shrinkable tube (example of second insulator)
46 Crimp terminal
50, 60, 70 Piezoelectric substrate with flat plate
51 Pressure sensitive adhesive tape
52 Flat plate
53 Copper foil
54 FPC
55 Signal processing circuit unit
56 Belt
57 Helmet
58 Chin strap
61 Adhesive agent

The invention claimed is:

1. A piezoelectric substrate, comprising:
an elongate conductor; and
an elongate first piezoelectric material helically wound in one direction around the conductor, wherein:
the first piezoelectric material comprises an optically active helical chiral polymer (A);
a lengthwise direction of the first piezoelectric material and a principal orientation direction of the helical chiral polymer (A) included in the first piezoelectric material are substantially parallel to each other; and
the first piezoelectric material has an orientation degree F. in a range of from 0.5 to less than 1.0, determined from X-ray diffraction measurement by the following Formula (a):

$$\text{orientation degree F.} = (180° - \alpha)/180° \qquad (a)$$

wherein, in Formula (a), $\alpha$ represents a half width of a peak derived from orientation, and
wherein
the first piezoelectric material has an elongate flat plate shape;
the first piezoelectric material has a thickness of from 0.001 mm to 0.2 mm;
the first piezoelectric material has a width of from 0.1 mm to 30 mm; and
a ratio of the width of the first piezoelectric material to the thickness of the first piezoelectric material is 2 or more.

2. The piezoelectric substrate according to claim 1, wherein:
the conductor is an inner conductor, and
the first piezoelectric material is helically wound in the one direction along an outer peripheral surface of the inner conductor.

3. The piezoelectric substrate according to claim 2, further comprising an elongate second piezoelectric material helically wound in a direction different from the one direction, wherein:
the second piezoelectric material comprises an optically active helical chiral polymer (A);
a lengthwise direction of the second piezoelectric material and a principal orientation direction of the helical chiral polymer (A) included in the second piezoelectric material are substantially parallel to each other;
an orientation degree F. of the second piezoelectric material, determined from X-ray diffraction measurement by Formula (a), is in a range of from 0.5 to less than 1.0; and
a chirality of the helical chiral polymer (A) included in the first piezoelectric material and a chirality of the helical chiral polymer (A) included in the second piezoelectric material differ from each other.

4. The piezoelectric substrate according to claim 2, further comprising a first insulator helically wound along an outer peripheral surface of the inner conductor, wherein the first insulator is arranged between the inner conductor and the first piezoelectric material.

5. The piezoelectric substrate according to claim 2, further comprising a first insulator wound along an outer peripheral surface of the inner conductor, wherein the first piezoelectric material and the first insulator alternately intersect each other to form a braided structure.

6. The piezoelectric substrate according to claim 2, wherein the first piezoelectric material is wound while maintaining an angle of from 15° to 75° with respect to an axial direction of the inner conductor.

7. The piezoelectric substrate according to claim 2, wherein:
the first piezoelectric material has a fiber-like configuration comprising one or more bundles, and
a major axis diameter of a cross section of the first piezoelectric material is from 0.0001 mm to 10 mm.

8. The piezoelectric substrate according to claim 1, wherein the conductor and the first piezoelectric material are twisted together.

9. The piezoelectric substrate according to claim 8, wherein
the first piezoelectric material has a fiber-like configuration comprising one or more bundles, and
a major axis diameter of a cross section of the first piezoelectric material is from 0.0001 mm to 2 mm.

10. The piezoelectric substrate according to claim 1, wherein the conductor is a tinsel wire.

11. The piezoelectric substrate according to claim 1, further comprising an adhesive layer between the conductor and the first piezoelectric material.

12. The piezoelectric substrate according to claim 1, wherein the helical chiral polymer (A) included in the first piezoelectric material is a polylactic acid polymer having a main chain comprising a repeating unit represented by the following Formula (1)

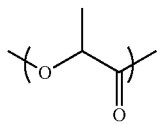
(1)

13. The piezoelectric substrate according to claim 1, further comprising a first outer conductor at an outer periphery.

14. The piezoelectric substrate according to claim 13, further comprising a second insulator at an outer periphery of the first outer conductor.

15. A piezoelectric textile, comprising a textile structure comprising warp and weft, wherein at least one of the warp or the weft comprises the piezoelectric substrate according to claim 1.

16. A piezoelectric textile, comprising a textile structure comprising warp and weft, wherein:
both the warp and the weft comprise the piezoelectric substrate according to claim 1,
a direction of winding of the first piezoelectric material included in the warp and a direction of winding of the first piezoelectric material included in the weft differ from each other, and
a chirality of the helical chiral polymer (A) included in the warp and a chirality of the helical chiral polymer (A) included in the weft are identical to each other.

17. A piezoelectric textile, comprising a textile structure comprising warp and weft, wherein
both the warp and the weft comprise the piezoelectric substrate according to claim 1,
a direction of winding of the first piezoelectric material included in the warp and a direction of winding of the first piezoelectric material included in the weft are identical to each other, and
a chirality of the helical chiral polymer (A) included in the warp and a chirality of the helical chiral polymer (A) included in the weft differ from each other.

18. A piezoelectric fabric, comprising a fabric structure comprising the piezoelectric substrate according to claim 1.

19. A piezoelectric device, comprising:
the piezoelectric textile according to claim 15; and
a second outer conductor arranged at a position opposed to a principal plane of the textile structure or the fabric structure.

20. The piezoelectric device according to claim 19, further comprising a third insulator between the second outer conductor and the textile structure or the fabric structure.

21. A force sensor, comprising the piezoelectric substrate according to claim 1.

22. An actuator, comprising the piezoelectric substrate according to claim 1.

23. A biological information acquisition device, comprising the piezoelectric substrate according to claim 1.

24. A piezoelectric device, comprising:
the piezoelectric fabric according to claim 18; and
a second outer conductor arranged at a position opposed to a principal plane of the textile structure or the fabric structure.

25. A biological information acquisition device, comprising the piezoelectric textile according to claim 15.

26. A biological information acquisition device, comprising the piezoelectric fabric according to claim 18.

27. A piezoelectric substrate, comprising:
an elongate conductor; and
an elongate first piezoelectric material helically wound in one direction around the conductor, wherein:
the first piezoelectric material comprises an optically active helical chiral polymer (A);
a lengthwise direction of the first piezoelectric material and a principal orientation direction of the helical chiral polymer (A) included in the first piezoelectric material are substantially parallel to each other; and
the first piezoelectric material has an orientation degree F. in a range of from 0.5 to less than 1.0, determined from X-ray diffraction measurement by the following Formula (a):

$$\text{orientation degree F.} = (180° - \alpha)/180° \qquad (a)$$

wherein, in Formula (a), α represents a half width of a peak derived from orientation;
wherein:
the conductor is an inner conductor;
the first piezoelectric material is helically wound in the one direction along an outer peripheral surface of the inner conductor; and
the piezoelectric substrate further comprises a first insulator helically wound along an outer peripheral surface of the inner conductor, wherein the first insulator is arranged at an opposite side from the inner conductor as viewed from the first piezoelectric material.

28. A piezoelectric substrate, comprising:
an elongate conductor; and
an elongate first piezoelectric material helically wound in one direction around the conductor, wherein:
the first piezoelectric material comprises an optically active helical chiral polymer (A);
a lengthwise direction of the first piezoelectric material and a principal orientation direction of the helical chiral polymer (A) included in the first piezoelectric material are substantially parallel to each other; and
the first piezoelectric material has an orientation degree F. in a range of from 0.5 to less than 1.0, determined from X-ray diffraction measurement by the following Formula (a):

$$\text{orientation degree F.} = (180° - \alpha)/180° \qquad (a)$$

wherein, in Formula (a), α represents a half width of a peak derived from orientation;
wherein:
the conductor is an inner conductor;
the first piezoelectric material is helically wound in the one direction along an outer peripheral surface of the inner conductor; and
the piezoelectric substrate further comprises an elongate second piezoelectric material wound in a direction different from the one direction, wherein:
the second piezoelectric material comprises an optically active helical chiral polymer (A);
a lengthwise direction of the second piezoelectric material and a principal orientation direction of the helical chiral polymer (A) included in the second piezoelectric material are substantially parallel to each other;
an orientation degree F. of the second piezoelectric material, determined from X-ray diffraction measurement by Formula (a), is in a range of from 0.5 to less than 1.0;
the first piezoelectric material and the second piezoelectric material alternately intersect each other to form a braided structure; and a chirality of the helical chiral polymer (A) included in the first piezoelectric material and a chirality of the helical chiral polymer (A) included in the second piezoelectric material differ from each other.

29. A piezoelectric substrate, comprising:

an elongate conductor; and an elongate first piezoelectric material helically wound in one direction around the conductor, wherein:

the first piezoelectric material comprises an optically active helical chiral polymer (A);

a lengthwise direction of the first piezoelectric material and a principal orientation direction of the helical chiral polymer (A) included in the first piezoelectric material are substantially parallel to each other; and the first piezoelectric material has an orientation degree F. in a range of from 0.5 to less than 1.0, determined from X-ray diffraction measurement by the following Formula (a):

$$\text{orientation degree F.} = (180° - \alpha)/180° \tag{a}$$

wherein, in Formula (a), $\alpha$ represents a half width of a peak derived from orientation, and wherein the first piezoelectric material comprises from 0.01 parts by mass to 10 parts by mass of a stabilizer (B) which has one or more kinds of functional group selected from the group consisting of a carbodiimide group, an epoxy group, and an isocyanate group, and has a weight average molecular weight of from 200 to 60,000 with respect to 100 parts by mass of the helical chiral polymer (A).

30. The piezoelectric substrate according to claim 29, further comprising a functional layer arranged on at least one principal plane of the first piezoelectric material.

31. The piezoelectric substrate according to claim 30, wherein the functional layer comprises at least one of an easily adhesive layer, a hard coat layer, an antistatic layer, an antiblock layer, a protective layer, or an electrode layer.

32. The piezoelectric substrate according to claim 30, wherein the functional layer comprises an electrode layer.

33. The piezoelectric substrate according to claim 32, wherein at least one of the surface layers of a layered body comprising the first piezoelectric material and the functional layer is the electrode layer.

* * * * *